(12) United States Patent
Taki

(10) Patent No.: US 6,509,761 B2
(45) Date of Patent: Jan. 21, 2003

(54) LOGICAL CIRCUIT

(75) Inventor: Kazuo Taki, Kobe (JP)

(73) Assignee: A-I-L Corporation, Tokyo (JP)

( * ) Notice: Subject to any disclaimer, the term of this patent is extended or adjusted under 35 U.S.C. 154(b) by 0 days.

(21) Appl. No.: 09/991,153

(22) Filed: Nov. 13, 2001

(65) Prior Publication Data

US 2002/0101262 A1 Aug. 1, 2002

(30) Foreign Application Priority Data

Jan. 31, 2001 (JP) ........................................ 2001-022764

(51) Int. Cl.⁷ ........................ H03K 19/20; H03K 19/094
(52) U.S. Cl. ........................................ 326/112; 326/83
(58) Field of Search ..................... 326/83, 87, 104–108, 326/112, 113, 119, 121, 122

(56) References Cited

U.S. PATENT DOCUMENTS

| | | | | |
|---|---|---|---|---|
| 5,523,707 A | * | 6/1996 | Levy et al. .................... | 326/52 |
| 5,777,491 A | * | 7/1998 | Hwang et al. ............... | 326/113 |
| 6,043,674 A | * | 3/2000 | Sobelman .................... | 326/17 |
| 6,066,965 A | * | 5/2000 | Blomgren et al. ........... | 326/112 |
| 6,392,467 B1 | * | 5/2002 | Oowaki et al. .............. | 326/113 |

FOREIGN PATENT DOCUMENTS

JP       56061829 A  *  5/1981  ......... H03K/19/094

OTHER PUBLICATIONS

Chu et al.; "A Comparison of CMOS Circuit Techniques: Differential Cascode Voltage Switch Logic Versus Conventional Logic"; *IEEE Journal of Solid–State Circuits;* vol. SC–22, No. 4; pp. 528–532; Aug. 1987.

* cited by examiner

*Primary Examiner*—Michael Tokar
*Assistant Examiner*—James H. Cho
(74) *Attorney, Agent, or Firm*—Ladas & Parry

(57) ABSTRACT

Very high speed operation and reduction of power consumption are realized simultaneously in a two-wire type logical circuit having a halt value and an effective value as signal values. Signal rise transition delay time and signal fall transition delay time are purposely designed asymmetrically and an effective value propagation delay is shortened, thereby accelerating an operating speed of the logical circuit. By eliminating a clock signal from a DOMINO circuit, power consumption is reduced. An architecture for concealing a halt value propagation delay is employed.

15 Claims, 37 Drawing Sheets

| TYPE OF SIGNAL VALUE | | CONCRETE SIGNAL VALUE |
|---|---|---|
| HALT VALUE | | {L,L} |
| EFFECTIVE VALUE | LOGIC 0 | {H,L} |
| | LOGIC 1 | {L,H} |

| TYPE OF SIGNAL VALUE | | CONCRETE SIGNAL VALUE |
|---|---|---|
| HALT VALUE | | {H,H} |
| EFFECTIVE VALUE | LOGIC 0 | {L,H} |
| | LOGIC 1 | {H,L} |

| TYPE OF SIGNAL VALUE | | CONCRETE SIGNAL VALUE |
|---|---|---|
| HALT VALUE | | {L,L} |
| EFFECTIVE VALUE | LOGIC 0 | {H,L} |
| | LOGIC 1 | {L,H} |

| TYPE OF SIGNAL VALUE | | CONCRETE SIGNAL VALUE |
|---|---|---|
| HALT VALUE | | {H,H} |
| EFFECTIVE VALUE | LOGIC 0 | {L,H} |
| | LOGIC 1 | {H,L} |

SIGNAL VALUES OF SIGNAL LINE PAIR {F,FB}

BASIC LOGICAL GATE

OPERATION OF ASD-CMOS

ALL INPUTS HAVING EFFECTIVE VALUES
(FIRST CASE)

OPERATION OF ASD-CMOS

ALL INPUTS HAVING EFFECTIVE VALUES
(SECOND CASE)

OPERATION OF ASDDL (OPERATING AS DYNAMIC CIRCUIT)

OUTPUT HALT VALUES AND EFFECTIVE
VALUES ARE MIXED IN INPUTS

OPERATION OF ASDDL (OPERATING AS DYNAMIC CIRCUIT)

ALL INPUTS HAVING EFFECTIVE VALUES
(FIRST CASE)

OPERATION OF ASDDL (OPERATING AS DYNAMIC CIRCUIT)

ALL INPUTS HAVING EFFECTIVE VALUES (SECOND CASE)

| INPUT | OUTPUT | PMOS NETWORK | | NMOS NETWORK |
|---|---|---|---|---|
| | | ASD-CMOS | ASDDL | |
| ALL INPUTS HAVING HALT VALUES | HALT VALUE | ON | ON | OFF |
| OUTPUT HALT VALUES AND EFFECTIVE VALUES ARE MIXED | HALT VALUE | ON | OFF DEPENDING OF INPUT PATTERN | OFF |
| ALL INPUTS HAVING EFFECTIVE VALUES | EFFECTIVE VALUE | ONE-SIDE PATH IS ON AND OPPOSITE-SIDE PATH IS OFF | OFF | ONE-SIDE PATH IS ON AND OPPOSITE-SIDE PATH IS OFF |

FIG. 21

RESET BASIC LOGICAL GATE

RESET BASIC LOGICAL GATE

COMMON RESET SIGNAL

COMMON RESET SIGNAL

RESET BASIC LOGICAL GATE
WITH HOLDING FEATURE

RESET BASIC LOGICAL GATE
WITH HOLDING FEATURE

Full Adder

COMPLEX LOGICAL GATE

LOGICAL CIRCUIT

BACKGROUND OF THE INVENTION

1. Field of the Invention

The present invention relates to a logical circuit used for constituting an LSI, and particularly belongs to a circuit design technique for improving the operating speed of the logical circuit and for reducing power consumption, so as to accelerate a two-wire logical circuit using two signal lines to express a logical value.

2. Description of the Related Art

A logical gate is used as a constituent element for a digital LSI manufactured by CMOS process. As shown in FIG. 1, a standard CMOS logical gate is constituted such that a PMOS network 97 consisting of PMOS transistors are arranged between a VDD power source line 27 and an output 96 and that an NMOS network 98 comprising NMOS transistors 98 are arranged between a GND power source line 28 and the output 96. Either the PMOS network 97 or the NMOS network 98 becomes conductive in accordance with the value of an input 95 and outputs either a VDD potential or a GND potential to the output 96. As the concrete circuit configuration of the CMOS logical gate stated above, a NOT gate (inverter) is shown in FIG. 2 and a NAND gate is shown in FIG. 3. A conventional standard CMOS logical gate has been designed so that delay time generated since the level of the signal value of an output 96 rises from an L (low)-level, i.e., the GND potential to an H (high)-level, i.e., the VDD potential becomes equal to delay time generated when the level of the signal value of the output 96 falls from the H-level to the L-level as much as possible in delay time generated since the input 95 changes until the output 96 changes. Here, the delay time normally indicates time required since the voltage of the input signal changes to exceed a certain threshold value until the voltage of the output signal changes to exceed the same threshold value. In many cases, the threshold voltage of the input of the NOT gate is used as this threshold value.

The delay time generated from the change of the input to the change of the output is specified as the sum of an internal delay and a load delay. In case of the logical gate referred to as inverted logic, as is represented by the NOT gate and the NAND gate, in which the signal polarity of the input is inverted from that of the output, the load delay to be described later almost determines the delay time of the logical gate. The load delay is determined by the current driving capabilities of the PMOS network 97 and the NMOS network 98 and the magnitude of a capacitance acting as a load. As the current driving capabilities are higher, the delay time of the logical gate becomes shorter. The delay time generated when the output signal rises is almost inversely proportional to the current driving capability of the PMOS network 97. In the NOT gate shown in FIG. 2, the delay time thereof is determined by the current driving capability of the NMOS transistor which is only one transistor included in the NMOS network 98. The current driving capability of each of PMOS and NMOS transistors is proportional to the gate width w of the transistor. However, it is known that the driving capability of the PMOS transistor is about half the driving capability of the NMOS transistor which has the same gate width w because of the difference in carrier mobility. Accordingly, to make the delay time generated when the output signal rises equal to that generated when the output signal falls, it is necessary to set the gate width w of the PMOS transistor to be twice as large as the gate width w of the NMOS transistor in the NOT gate. If such a gate width ratio is set, however, the area of the logical gate becomes too large when the layout thereof is designed. Practically, therefore, the gate width w of the PMOS transistor is set to be about 1.5 times as large as the gate width w of the NMOS transistor in the NOT gate. FIG. 2 shows that the PMOS has a width of 2.1 micrometers and the NMOS has a width of 1.4 micrometers. As stated above, the gate width ratio of the PMOS to the NMOS is "1.5". In this case, the current driving capability of the PMOS transistor is, quite naturally, only 0.75 times as high as the current driving capability of the NMOS transistor. As a result, the delay time generated when the output signal rises is longer than the delay time generated when the output signal falls. On the other hand, the input threshold voltage of the NOT gate is decreased and the substantial increase of delay time is rather small, so that the above-stated ratio is practically used.

In the NAND gate shown in FIG. 3, unlike the NOT gate, the PMOS transistor and the NMOS transistor have an equal gate width w of 2.1 micrometers. In the case of the NAND gate shown therein, since two NMOS transistors are connected in series, the current driving capability of the NMOS network 98 is lower than that of a network including one transistor. The gate width w of the NMOS transistor is, therefore, set large so as to compensate for the decreased current driving capability. The current driving capability of a network becomes lower as the number of transistors connected in series increases. This requires the gate width w of the transistor to be set large. However, if two transistors are connected in series, the current driving capability of the network does not become half due to the non-linearity of operation characteristics. It is. estimated herein that the current driving capability of the network having two serially connected transistors becomes ⅔ as high as that of the network including one transistor, and the gate width w of each transistor of the former network is set ⅔ times as large as that of the transistor of the latter network. By doing so, the ratio of the current driving capability of the PMOS network 97 to that of the NMOS network 98 of FIG. 3 becomes equal to the ratio in the NOT gate shown in FIG. 2. As can be seen, in the CMOS logical gate according to the conventional technique, the current driving capability of the PMOS network 97 and that of the NMOS network 98 are adjusted to have setting values, respectively, by adjusting the gate width w of a transistor. Here, if it is assumed that the CMOS logical gate is designed so that the current driving capability of the PMOS network 97 is considerably asymmetric with that of the NMOS network 98, delay time generated when the output rises and delay time generated when the output falls becomes considerably asymmetric with each other, as well. If so, the longer delay time generally determines the upper limit of the operating speed of the circuit. Due to this, the CMOS process has been conventionally designed so that output rise delay time and output fall delay time are balanced as much as possible.

Another conventional technique will be described. Among logical circuits used as the constituent elements of a digital LSI manufactured by the CMOS process, there is a DCVS-DOMINO circuit which has one of the circuit constitutions enabling the highest operating speed. Publication "Kan M. Chu, et. al., A Comparison of CMOS circuit Techniques: Differential Cascade Voltage Switch Logic Versus Conventional Logic. IEEE Journal of Solid-State Critics, Vol. SC-22, No. 4, Aug. 1987 pp. 528–532" shows the comparison result of the performance of the DCVS-DOMINO circuit configuration with that of the other circuit configuration and highlights that the DCVS-DOMINO circuit ensures high speed. FIG. 4 shows the circuit configuration of the DCVS-DOMINO. The DCVS-DOMINO circuit is classified as a circuit having a configuration referred to as two-wire dynamic logic. The DCVS-DOMINO circuit operates while the operation state thereof is switched between two types of states referred to as a precharge state and an evaluate state. If a precharge input 92 shown in FIG. 4 is at an L-level, the DCVS-DOMINO circuit is in a precharge state. In this state, two PMOS transistors 87 become conductive, an NMOS transistor 88 is cut off, the inputs 85 and 86 of output inverters 83 and 84 are at an H-level, respectively, and the outputs 81 and 82 of the output inverters 83 and 84 are at an L-level, respectively. It suffices to assume that the input signal of the DCVS-DOMINO circuit is generated by a DCVS-DOMINO circuit in the front stage thereof. The operation modes of all DCVS-DOMINO circuits are switched between the precharge mode and the evaluate mode simultaneously. Accordingly, if the circuit shown in FIG. 4 is in the precharge state, the circuit in the front stage thereof is in the precharge state, as well, and the outputs of all the DCVS-DOMINO circuits are at the L-level. Due to this, a plurality of pairs of inputs 80 shown in FIG. 4 are applied with signal values L, respectively. It is noted that if there are three pairs of inputs, three DCVS-DOMINO circuits are provided in the front stage.

Next, consideration will be given to a case where the level of the precharge input 92 in FIG. 4 changes to an H-level. This corresponds to the evaluate state. The two PMOS transistors 87 are cut off and the NMOS transistor 91 becomes conductive. Here, while the plurality of pairs of inputs 80 of the DCVS-DOMINO circuit receive no inputs, both of two signal paths 93 and 94 in the NMOS network 90 are in a cutoff state. In this state, the two PMOS transistors 87 and the two signal paths 93 and 94 are cut off, which state is referred to as "dynamic operation". Voltages at points S and SB are maintained at the H-level by the charge stored in the parasitic capacitor components. At this time, to prevent the potentials of the points S and SB from being decreased by the leak current of the transistors, two PMOS transistors 89 each having a very low current driving capability are provided to assist in charge holding. The PMOS transistors 89 are conductive only while L-levels are outputted to the outputs 81 and 82 of the transistor 89. When all pairs of inputs 80 receive inputs next, the state of one of the signal paths 93 and 94 changes to a conductive state and the level of a signal value at one of the points S and SB changes from the H-level to the L-level, accordingly. The level of the corresponding side of the output 81 or 82, therefore, changes from the L-level to the H-level. At this moment, output operation of the circuit shown in FIG. 4 is completed. Namely, in the DCVS-DOMINO circuit, the precharge state indicates that both of the two outputs 81 and 82 are at the L-level and the output of the circuit is not defined yet. The evaluate state following the precharge state indicates that while a part of the pairs of inputs 80 do not receive signal values, the output of the circuit is not defined and, then, when all pairs of inputs 80 receive signal values, the level of one of the two outputs 81 and 82 change to the H-level to thereby define the output of the circuit. In other words, it is assumed that if the values of the two outputs 81 and 82 are exclusive values ({H, L} or {L, H}), the output of the circuit is defined.

The name of DOMINO in DCVS-DOMINO derives from an operating state in which if the output of a front stage is defined, the output of a rear stage is triggered to be defined and this state is propagated to the following stages like a domino.

The concrete example of the NMOS network 90 in the DCVS-DOMINO circuit is shown in FIG. 5. The circuit shown in FIG. 5 realizes majority logic. If more than one of three pairs of inputs AI and AIB, BI and BIB, and CI and CIB do not receive effective inputs, i.e., the input values of the circuit are {L, L}, then a signal path from signal lines 85 to 91 and a signal path from signal lines 86 to 91 shown in FIG. 5 are cut off condition. If all the three pairs of inputs receive effective inputs ({H, L} or {L, H}), either the signal path from the signal lines 85 to 91 or the signal path from the signal lines 86 to 91 becomes conductive and the level of the corresponding one of the two outputs 81 and 82 shown in FIG. 4 changes from L to H. While a DCVS-DOMINO circuit is one of the highest-speed logical circuits which can be manufactured by the ordinary CMOS process, the DCVS-DOMINO circuit is not free from disadvantages or the need of improvements. The significant disadvantage of the DCVS-DOMINO is that all logical gates constituted out of the DCVS-DOMINO circuits require precharge signals. A precharge signal is a kind of a clock signal which always changes its value in each operating cycle and the capacitance of the long wiring part of the precharge signal is constantly charged and discharged. Due to this, the precharge signal consumes much power. Also, the current driving capability of the NMOS network is one of the factors determining the operating speed of the DCVS-DOMINO circuit. The NMOS network 90 never fails to include two NMOS transistors 88 connected in series to receive precharge signals. Due to this, the number of NMOS transistors connected in series increases, thereby disadvantageously lowering the current driving capability of the NMOS network 90 and decelerating the operating speed thereof.

SUMMARY OF THE INVENTION

There are two objects that the present invention is to attain. If a logical circuit is designed according to the conventional CMOS technique, it is intended to make signal rise transition time equal to signal fall transition time as much as possible otherwise a high-speed circuit cannot be obtained. It is the first object of the present invention to realize a logical circuit capable of purposely setting the speed of one of signal rise transition and that of signal fall transition higher than that of the other to allow the high speed operation of the circuit. It is the second object of the present invention to realize a logical circuit capable of solving the high power consumption problem with the DCVS-DOMINO which is one of the highest-speed logical circuits among the conventional logical circuit and, at the same time, ensuring the further accelerated operation. The present invention is to realize a logical circuit capable of attaining the above-stated two objects simultaneously.

Next, means for attaining the objects will be described. The means corresponding to claims 1 to 7 relates to the circuit configuration of a logical gate to make delay time generated when the output signal of the logical gate rises asymmetric with delay time generated when the output signal thereof falls, to thereby effectively shorten the delay time generated since an input to applied to a circuit block in which a plurality of logical gates are connected in multiple stages until an output is obtained. At the same time, the means is intended to realize a logical gate higher in speed and lower in power consumption than the DCVS-DOMINO circuit having a high operating speed.

The means corresponding to claims 1 to 4 provides the basic configuration of the above-stated logical gate, the means corresponding to claim 5 provides the first more detailed configuration of the logical gate, and the means corresponding to claims 6 and 7 provides the second more detailed configuration of the logical gate.

The means corresponding to "claim 1" is intended for a two-wire logical circuit using a pair of signal lines comprising two signal lines for propagating a logical value. Also, the signal line pair expresses two types of signal values, i.e., a halt value and an effective value. If the signal line pair has the halt value, the two signal lines are assumed to have an equal signal value, i.e., {L, L} or {H, H}. If the signal line pair has the effective value, the two signal lines are assumed to have mutually exclusive signal values, i.e., {H, L} or {L, H}. Depending on the two types of effective values, logic "0" and logic "1" are expressed. Further, to propagate one logical value, the value expressed by the signal line pair which is originally the halt value, changes to the effective value expressing either the logic "0" or logic "1" and then returns again to the halt value. A basic logical gate, which is the logical circuit using the signal lines as stated above and which realizes the feature of a logical function, has not less than one pair of signal lines 20 as inputs and one pair of signal lines 21 and 22 as an output. Further, the basic logical gate outputs the halt value if the halt value is included in the inputs and outputs the effective value according to the feature of the logical function if all the inputs of the basic logical gate have the effective values. In addition, delay time generated until the signal value of the output changes according to changes of the signal values of the inputs in the logical gate is designed asymmetrically so that the delay time generated when the output of the basic logical gate changes from the halt value to the effective value is short and the delay time generated when the output of the basic logical gate changes from the effective value to the halt value is long.

The means corresponding to "claim 2" provides one concrete circuit configuration of the means corresponding to claim 1. The means corresponding to claim 2 comprises two output inverters 23 and 24 having, as respective outputs, the one pair of signal lines 21 and 22 as the output a PMOS network 29 connected to the not less than one pair of signal lines 20 as the inputs, to input lines 25 and 26 of the two output inverters 23 and 24, respectively, and to a VDD power source line 27 and an NMOS network 30 connected to the not less than one pair of signal lines 20 as the inputs and to a GND power source line 28. Here, the PMOS network 29 is constituted by mutually connecting a plurality of PMOS transistors. The NMOS network 30 is constituted by mutually connecting a plurality of NMOS transistors.

The means corresponding to "claim 3" specifies how to apply one concrete signal level and associated circuit characteristics for the means corresponding to claim 2. It is assumed that if both of the two signal lines included in a pair of signal lines 21 and 22 have a voltage level L, i.e., a GND potential, the signal line pair has the halt value, and that otherwise, i.e., if one of the two signal lines has a voltage level H(VDD potential) and the other signal line has a voltage level L, the signal line pair has the effective value. A current driving capability of the NMOS network 30 for driving the input lines 25 and 26 of the respective output inverters is set to be higher than a current driving capability of the PMOS network 29 for driving the input lines 25 and 26 of the respective output inverters, and a current driving capability of a PMOS transistor included in the output inverters 23 and 24 is set to be higher than a current driving capability of an NMOS transistor included in the output inverters 23 and 24, thereby allowing the delay time generated until the signal value of the output changes according to the changes of the signal values of the inputs to be designed asymmetrically so that the delay time generated when the output of the basic logical gate changes from the halt value to the effective value is short and the delay time generated when the output of the basic logical gate changes from the effective value to the halt value is long.

The means corresponding to "claim 4" concretely specifies a method for realizing the circuit characteristic for the means corresponding to claim 3. Namely, a difference in a magnitude of the current driving capability is realized by changing a gate width w of each of the PMOS transistors and the NMOS transistors.

Next, description will be given to how to obtain the above-stated objects using the above-stated means. Consider a case where a plurality of basic logical gates are employed, the output of one basic logical gate is connected to the input of the other basic logic gate and the multistage connection of basic logical gates is thereby established. It is noted, however, that ring connection for returning the output of a basic logical gate to the input of the same logical gate through the other basic logical gate is not permitted. It is assumed that in an initial state, an input applied to the multistage connection of the basic logical gates is a halt value and the outputs of all the basic logical gates are halt values. Next, if an effective value is applied, as an input, to the multistage connection of the basic logical gates, then the basic logical gate in the first stage outputs, the effective value, the outputted effective value is applied, as an input, to the basic logical gate in the next stage, the basic logical gate in the next stage outputs the effective value accordingly, the effective value is sequentially propagated to the basic logical gates in the following gates and the effective value finally appears on the output of the multistage connection of the basic logical gates. Thereafter, if the input of the multistage connection of the basic logical gates is changed to the halt value, the halt value is sequentially propagated to the following stages as in the case of the effective value and the halt value finally appears on the output of the multistage connection of the basic logical gates.

At this moment, according to the present invention, delay time generated since the effective value arrives at the input of the basic logical gate until the effective value is outputted is shorter than delay time generated since the halt value arrives at the input until the halt value is outputted. Due to this, time required for propagating the effective value from the input of the multistage connection of the basic logical gates toward the output thereof is shorter than time required for propagating the halt value. It is the feature of the two-wire logical circuit stated above that allows accelerating only the propagation of the effective value and shortening time required since an effective input is applied to the logical circuit until an effective output is obtained. That is, in the two-wire logical circuit, the propagation of the logic "0" and that of the logic "1" equally mean the propagation of the effective value. If the delay time of the output of the effective value in the basic logical gate is shortened, it is possible to accelerate both the propagation of the logic "0" and that of the logic "1". On the other hand, according to the conventional CMOS logical gate, the delay time of the propagation of the logic "1" and that of the propagation of the logic "0" correspond to the delay time generated when an output signal rises and the delay time generated when the output signal falls, respectively. Due to this, it is impossible to set one delay time short and the other delay time long. According to the conventional CMOS logical gate, it is required to shorten both the output rise delay time and the output fall delay time so as to realize the high-speed operation of the circuit. To realize this, the gate width w of each of the PMOS transistors and the NMOS transistors is set large to thereby increase a current driving capability and to shorten a delay. According to this method, however, the gate width w of a logical gate in the next stage connected, as a load, to the output of a logical gate in the first stage is increased, with the result that load capacitance increases and sufficient acceleration effect cannot be obtained. Besides, the problems of an increase in power consumption and an increase in the area of an LSI chip follow. For these reasons, the conventional method has been executed only if necessary while recognizing the risk of these disadvantages.

Meanwhile, the prior art DCVS-DOMINO circuit is classified as a circuit having a circuit configuration referred to as two-wire dynamic logic. The circuit configuration is similar to that of the basic logical gate according to the present invention. The greatest difference between them is that the DCVS-DOMINO circuit has a clock input referred to as a precharge input. The main factor for increasing the power consumption of the DCVS-DOMINO is the clock input. The basic logical gate according to the present invention does not require a clock input to thereby make power consumption lower than that of the DCVS-DOMINO circuit by as much as the power consumed for the clock input. If the DCVS-DOMINO circuit is in a precharge state, the values of both of two output lines become L. This precharge state might correspond to the halt state of the present invention. Nevertheless, since all the DSVS-DOMINO logical gates constituting the logical circuit are controlled to turn into the precharge state simultaneously, there does not exist the concept of propagating a halt value. That is to say, according to the DCVS-DOMINO, all the DCVS-DOMINO logical gates are simultaneously turned into the precharge state and then turned into the evaluate state, followed by the propagation of an effective value from the input. There does not exist the concept of asymmetrically designing the effective value propagation delay time and the halt value propagation delay time.

According to the present invention, the circuit operation is accelerated by using means for making the effective value propagation delay time and the halt value propagation delay time asymmetric with each other. The constitution of this means is specified by claim 3 while assuming that both the two lines included in one pair of signal lines 21 and 22 have a voltage level L, i.e., a GND potential, the signal value of the logical circuit is the halt value. That is, the current driving capability of the NMOS network 30 for driving the input lines 25 and 26 of the respective output inverters is set to be higher than that of the PMOS network 29 for driving the input lines 25 and 26 of the respective output inverters. By so setting, the transition time of the voltages appearing on the input lines 25 and 26 of the respective output inverters during which the voltage level changes from the H-level to the L-level by the function of the NMOS network becomes short and the transition time during which the voltage level changes from the L-level to the H-level by the function of the PMOS network becomes long. Further, the current driving capability of the PMOS transistor included in the output inverters 23 and 24 is set to be higher than that of the NMOS transistor included in the output inverters 23 and 24. By so setting, the rise transition time of signal levels appearing on the output signal lines 21 and 22 from the L-level to the H-level becomes short and the fall transition time from the H-level to the L-level becomes long. Furthermore, since the transition time of the signals on the input lines 25 and 26 of the respective output inverters from the H-level to the L-level is short, the opposite signal transition time, i.e., from the L-level to the H-level on the output signal lines 21 and 22 is further shortened. As a result, the present invention realizes the asymmetry of the delay time generated until the output signal value changes according to the changes of the input signal value so that the delay time generated when the output changes from the halt value to the effective value is short and shortens the effective value propagation delay to thereby realize a high-speed circuit.

According to the means corresponding to claim 4, the asymmetry of the delay time is realized by reducing the gate width w of each PMOS transistor included in the PMOS network 29 and increasing the gate width w of each NMOS transistor included in the NMOS network 30. Due to this, the load capacitance of the PMOS side decreases and that of the NMOS side increases and load capacitance seen from the input side of the logical circuit, therefore, hardly changes as a whole. In other words, there are no increase in power consumption and no increase in delay following the increase of the load capacitance. By using the asymmetry of the delay time, the effective value propagation delay time is made shorter than intermediate delay time and the halt value propagation delay time is made longer than the intermediate delay time. The shortening of the effective value propagation delay particularly contributes to the acceleration of the circuit operation.

Furthermore, the logical circuit according to the present invention does not require a precharge input 92 provided in the DCVS-DOMINO circuit. Accordingly, there is no wasteful power consumption caused by the circuit operation for distributing a precharge clock signal and the charge and discharge of wiring capacitance. It is obvious, therefore, that the power consumption of the logical circuit according to the present invention is lower than that of the DCVS-DOMINO. In addition, the NMOS transistor 88 exists between the NMOS network 90 and the GND power source line 28 in the DCVS-DOMINO circuit so as to weaken the current driving capability of the NMOS network 90. In the logical circuit according to the present invention, by contrast, the NMOS network 30 is directly connected to the GND power source line. Due to this, there is no factor for weakening the current driving capability of the NMOS network 30 and the logical circuit according to the present invention operates at higher speed than the DCVS-DOMINO circuit.

Next, the means corresponding to "claim 5" will be described. This means provides the first more detailed constitution of the means corresponding to claims 3 to 4 and specifies the relationship between the input signals and the operation of the PMOS network 29 and that between the input signals and the-operation of the NMOS network 30. The basic logical gate corresponding to claim 5 operates as follows. The PMOS network 29 operates to make both a signal path 31 between the VDD power source line 27 and the input line 25 of one of the output inverters and a signal path 32 between the VDD power source line 27 and the input line 26 of the other output inverter conductive if at least not less than one of the inputs has the halt value, and operates to make one of the two signal paths 31 and 32 conductive and to cut off the other one of the signal paths 31 and 32 in accordance with the realized logical feature if all of the inputs have the effective values. Also, the NMOS network 30 operates to cut off both a signal path 33 between the GND power source line 28 and the input line 25 of one of the output inverters and a signal path 34 between the GND power source line 28 and the input line 26 of the other output inverter if at least not less than one of the inputs has the halt value, and operates to make one of the signal paths 33 and 34 conductive and to cut off the other one of the signal paths 33 and 34 in accordance with the realized logical feature if all of the inputs have the effective values. At this moment, if observing the circuit from the input lines 25 and 26 of the respective output inverters, the basic logical gate operates to cut off the signal path of-the NMOS network on the side on which the signal path of the PMOS network is conductive and to make the signal path of the NMOS network conductive on the side on which the signal path of the PMOS network is cut off. As can be seen, if the halt value is included in the inputs, the VDD potential appears on the input lines 25 and 26 of the respective output inverters and the basic logical gate stated above, therefore, outputs the halt value. If all the inputs have the effective values, one of the input lines 25 and 26 of the respective output inverters is changed to have the GND potential in accordance with the feature of the logical function and the basic logical gate, therefore, outputs the effective value. In the above-stated operations, the input lines 25 and 26 of the respective output inverters are always conductive to either the VDD power source line 27 or the GND,power source line 28. It can be said that such a basic logical gate performs a static operation.

Next, the means corresponding to "claims 6 and 7 will be described. This means provides the second more detailed constitution of the means corresponding to claims 3 and 4 and specifies the relationship between the input signals and the operation of the PMOS network 29 and that between the input signals and the NMOS network 30. The basic logical gate corresponding to claims 6 and 7 operates as follows. The PMOS network 29 operates to make both a signal path 31 between the VDD power source line 27 and the input line 25 of one of the output inverters and a signal path 32 between the VDD power source line 27 and the input line 26 of the other output inverter conductive if all of the inputs have the halt values, and operates to cut off both of the two signal paths 31 and 32 if specific inputs out of the inputs have the effective values and the remaining inputs have the halt values or if all of the inputs have the effective values. Also, the NMOS network 30 operates to cut off both a signal path 33 between the GND power source line 28 and the input line 25 of one of the output inverters and a signal path 34 between the GND power source line 28 and the input line 26 of the other output inverter if not less one of the inputs has the halt value, and operates to make one of the signal paths 33 and 34 conductive and to cut off the other one of the signal paths 33 and 34 in accordance with the realized logical feature or if all of the input have the effective values. In the above-stated operations, there exists a period in which the input lines 25 and 26 of the respective output inverters are not conductive to the VDD power source line 27 nor the GND power source line 28. In this period, the potentials of the input lines 25 and 26 of the respective output inverters are maintained by the charge stored in the parasitic capacitance. It is said that such a basic logical gate performs a dynamic operation. Further, the basic logical gate performing the dynamic operation may be constituted so that charge holding PMOS transistors 35 and 36 are added to the input lines 25 and 26 of the output inverters, respectively. As can be seen from the above, if all the inputs have the halt values, a VDD potential appears on the input lines 25 and 26 of the respective output inverters and the basic logical gate stated above, therefore, outputs the halt value. Accordingly, even if a part of the inputs are changed to have the effective values, the basic logical circuit continues to output the halt value. On the other hand, if all the inputs have the effective values, one of the input lines 25 and 26 of the respective output inverters are changed to have the GND potential in accordance with the feature of the logical function and the basic logical gate, therefore, outputs the effective value.

Next, means corresponding to "claims 8 to 15" will be described. The means corresponding to claims 1 to 7 is intended to accelerate the propagation of the effective value by asymmetrically designing the signal rise transition time and the signal fall transition time and to thereby realize the high-speed operation of the circuit. However, claims 1 to 7 do not specially mention that the propagation of the halt value is decelerated. Here, consider a case of repeatedly operating the logical circuit constituted by multistage-connecting the basic logical gates. If the effective value propagation is accelerated, time required until the output of the logical circuit is obtained is shortened but, on the other hand, the propagation of the halt value is decelerated. Due to this, a repetition cycle for repeatedly operating the logical circuit cannot be shortened. The means corresponding to claims 8 to 11 provides a constitution for accelerating the propagation of the halt value in the logical circuit constituted by the multistage-connection of the basic logical circuits and shortens the repetition cycle for repeatedly operating the logical circuit. The means corresponding to claims 12 to 15 provides a constitution for allowing the repetition operation cycle of the circuit to be substantially shortened to be close to effective value propagation time by concealing the halt value propagation time behind the effective value propagation time if the logical gate is repeatedly operated.

Next, the means corresponding to "claim 8" will be described. The means corresponding to claim 8 expands the basic logical gate corresponding to claims 1 to 7 and provides the constitution of a reset basic logical gate for starting the propagation of the halt value. The means corresponding to claim 8 provides the basic logical gate corresponding to claim 1 to 7 with the reset input 41 or 42 and capabilities the value of the pair of signal lines 21 and 22 as the output to become the halt value irrespectively of the values of the not less than one pair of signal lines 20 as the inputs if the reset input receives an effective input.

The means corresponding to "claim 9" provides the first more detailed constitution of the means corresponding to claim 8 stated above.

The means corresponding to "claim 9" capabilities the value of the one pair of signal lines 21 and 22 as the output to become the halt value by providing a PMOS transistor 37 for making the input lines 25 and 26 of the respective output inverters and the VDD power source line 27 conductive, an NMOS transistor 38 for cutting off the signal paths between the input lines 25 and 26 of the respective output inverters and the GND power source line 28, respectively, and by connecting the reset input 42 to gate inputs of the PMOS transistor 37 and the NMOS transistor 38, respectively.

The means corresponding to "claim 10" provides the second more detailed constitution of the means corresponding to claim 8.

The means corresponding to "claim 10" capabilities the value of the one pair of signal lines 21 and 22 as the output to become the halt value by replacing the two output inverters 23 and 24 by two 2-input NOR gates 43 and 44, respectively, by setting a current driving. capability of a PMOS transistor included in each of the 2-input NOR gates 23 and 24 to be higher than a current driving capability of an NMOS transistor included in each of the 2-input NOR gates 23 and 24, by connecting a first input of the 2-input NOR gate 43 replacing the one output inverter 23 to the input line 25 of the one output inverter before being replaced and a second input of the 2-input NOR gate 43 to the reset input 41, and by connecting a first input of the other 2-input NOR gate 44 to the input line 26 of the other output inverter before being replaced and a second input of the other 2-input NOR gate 44 to the reset input 41 for the basic logical gate corresponding to claims 3 to 7.

The means corresponding to "claim 11" shortens halt value propagation time by combining two types of blocks, i.e., a basic logical gate circuit block consisting of the basic logical gates corresponding to claims 1 to 7 and a reset basic logical gate circuit block consisting of the reset basic logical gates corresponding to claims 8 to 10.

The means corresponding to "claim 11" has a basic logical gate circuit block 61, as a constituent element, constituted by a plurality of basic logical gates 1 according to claims 1 to 7 so as to realize a specific logical feature. Further, the means corresponding to claim 11 has a reset basic logical gate circuit block 62, as a constituent element, constituted by a plurality of reset basic logical gates 3 each having the reset input RB(42) or a plurality of the reset basic logical gates 2 each having the reset input R(41) according to claims 8 to 10 so as to realize a specific logical feature. This reset basic logical gate block 62 has a common reset input mutually connecting the reset inputs RB(42) or R41 of all of the plurality of reset basic logical gates. Further, the means corresponding to claim 11 is constituted so that the reset basic logical gate circuit block 62 is arranged in a portion applied with an external input, and the basic logical gate circuit block 61 using an output of the reset basic logical gate circuit block 62 as an input is arranged in a rear stage of the reset basic logical gate circuit block 62. Also, not less than one pair of a reset logical gate circuit block 62 and a basic logical gate circuit block 61 using an output of the reset logical gate circuit block 62 as an input, which are connected to each other, are arranged in rear of the basic logical gate circuit block 61, and an output of the basic logical gate circuit block 61 in a final stage is set as an external output. Further, the common reset inputs of all of the reset basic logical gate circuit blocks 62 are mutually connected to supply a common reset signal GR.

Description will be given to how to shorten the halt value propagation time by the above-stated means. According to the means corresponding to claim 11, the reset basic logical gate circuit block 62 is arranged in a portion to which an external input is applied, the basic logical gate circuit block 61 is arranged in the rear stage thereof, a plurality of pairs, each consisting of the reset basic logical gate block 62 and the basic logical gate circuit block 61 arranged in the rear stage of the block 62 and connected to the block 62, are connected in the rear stages. The output of the basic logical gate circuit block 51 in the final stage is an external output. It is assumed that the outputs of all the circuits have the halt values as an initial state. If an effective value is applied from the external input, the effective value arrives at the external output in a short period of time by the function of the basic logical gates according to the present invention and a result is obtained. Then, if a halt value is applied from the external input, the halt value arrives at the external output to take a long period of time and halt value propagation time cannot be, therefore, shortened. In place of this method, an effective signal is applied to the common reset signal GR, whereby the outputs of the plural reset basic logical gate circuit blocks 62 are forced to have the halt values and the propagation of the halt value starting at the plural reset basic logical gate circuit block 62 occurs. Since a plurality of reset basic logical gate circuit blocks 62 are arranged, the distance by which the halt value is propagated is shortened and time required to entirely propagate the halt value to the circuits is, therefore, shortened. In other words, the means corresponding to claim 11 shortens the halt value propagation distance and thereby shortens the halt value propagation time by providing halt value propagation start points in a plurality of portions in the middle of the target circuit instead of sequentially propagating the halt value from the end of the target circuit.

Next, means corresponding to "claims 12 to 15" will be described. The means corresponding to claims 12 to 15 shortens time required to propagate the halt value as much as possible and minimizes a repetition operation cycle if the logical circuit is repeatedly operated. To be specific, the logical circuit is divided into the first half section (close to the input) and the second half section (close to the output) and circuit blocks comprising holding feature-added reset basic logical gates each having a feature of holding a value are provided in the input section and the intermediate section. While the effective value is propagated to the first half section of the circuit, the halt value is propagated to the second half section of the circuit. While the halt value is propagated to the first half section of the circuit, the effective value is propagated to the second half section of the circuit. Namely, the halt value propagation time is concealed behind the effective value propagation time, thereby substantially shortening the circuit repetition operation cycle to be close to the effective value propagation time. Here, the reset basic logical gates having a holding feature arranged in the input section and the intermediate section of the logical circuit function in the same manner as pipeline registers in a circuit having pipeline configuration, to hold the effective value and to prevent the propagation of the halt value.

The means corresponding to claim 12 provides basic constituent requirements in relation to the reset basic logical gates 4 and 5 each having a holding feature. In addition, the means corresponding to claim 13 provides one more detailed constitution of the basic logical gates 4 and 5 each having a holding feature.

The means corresponding to "claim 12" does not greatly differs in the following respects from that for the reset basic logical gates described in claims 8 to 10. Namely, the means forces the value of the one pair of signal lines 21 and 22 as the output to become the halt value irrespectively of the values of the not less than one pair of signal lines 20 as the inputs if the reset input 41 or the reset input 42 has an effective input, allows the one pair of signal lines 21 and 22 as the output to have the halt value if the reset input 41 or the reset input 42 has no effective input and, first, the not less than one pair of signal lines 20 as the inputs include the halt values, and then allows the effective value to be outputted to the one pair of signal lines 21 and 22 as the output if all of the not less than one pair of signal lines 20 as the inputs have the effective values. However, the means corresponding to claim 12 differs in the following respects so as to hold the effective value and to prevent the propagation of the halt value. The means allows the same effective value to be held as before without outputting the halt value to the one pair of signal lines 21 and 22 as the output even after the values of not less than one pair of the signal lines 20 of the not less than one pair as the inputs changes to the halt value if the reset input 41 or 42 has no effective input, all of the not less than one pair of signal lines 20 as the inputs have the effective values and the effective value is outputted to the one pair of signal lines 21 and 22 as the output.

Next, the means corresponding to "claim 13" will be described. The means corresponding to claim 13 provides one more detailed constitution of the means corresponding to claim 12. The means corresponding to claim 13 expands the means corresponding to claims 9 and 10. A PMOS transistor 51 for cutting off the one signal path 31 of the PMOS network 29, a PMOS transistor 52 for cutting off the other signal path 32 of the PMOS network 29, an NMOS transistor 53 for short-circuiting the one signal path 33 of the NMOS network 30 and an NMOS transistor 54 for short-circuiting the other signal path 34 of the NMOS network 30 are provided, connection for feeding back a signal from one input 21 to gate inputs of the PMOS transistor 51 and the NMOS transistor 53, respectively, is established, and connection for feeding back a signal from the other output 22 to gate inputs of the PMOS transistor 52 and the NMOS transistor 54, respectively, is established. By doing so, the means for allowing the same effective values to be held as before without outputting the halt value to the one pair of signal lines 21 and 22 as the output even after the value of not less than one pair of the not less than one pair of the signal lines 20 as the inputs changes to the halt value if the effective value is outputted to the one pair of signal lines 21 and 22 as the output, is constituted.

Next, the means corresponding to "claim 14" will be described. The means corresponding to claim 14 provides the input section of the logical circuit with a register feature by arranging the circuit block having the reset basic logical gates each having a holding feature according to claim 12 or 13 as constituent elements in the input section. The means corresponding to claim 14 provides elements for constituting the means corresponding to claim 15.

The means corresponding to "claim 14" replaces the reset basic logical gate block 62 connected to the external input in the logical circuit according to claim 11 by the reset basic logical gate circuit block 63 having a holding feature. Here, the reset basic logical gate circuit block 63 having the holding feature is constituted out of a plurality of the reset basic logical gates each having the holding feature according to claim 12 or 13 and each having the reset input R(51) or reset input RB(42) so as to realize a specific logical feature, and also includes a common reset-input mutually connecting the reset inputs R(41) or RB(42) of all the plural reset basic logical gates each having the holding feature.

Next, the means corresponding to "claim 15" will be described. The means corresponding to claim 15 has first logical circuit block (64) according to claim 14 and the second logical circuit block (64) according to claim 14, and is constituted to set an output of the first logical circuit block as an input of the second logical circuit, to apply an external input to the first logical circuit block, and to set an output of the second logical circuit block as an external output. Here, clock signals opposite in phase are applied to a common reset signal GR to the first logical circuit block and to a common reset signal GRB to the second logical circuit block, respectively.

Description will be given to how to conceal the halt value propagation time behind the effective value propagation time and to shorten the circuit repetition operation cycle.

First, consider a case where the common reset signal GR in the first logical circuit block is at the H-level and the common reset signal CRB in the second logical block is at the L-level. Here, it is assumed that if the common reset signals GR and GRB are at the H-level, the outputs of the reset basic logical gate circuit block 63 having the holding feature and the reset basic logical gate circuit block 62 are forced to become the halt values. If so, the reset signal GR is at the H-level in the first logical circuit block, i.e., the first half section of the target logical circuit. Therefore, the halt values appear on the respective outputs of the reset basic logical gate circuit block 63 having the holding feature and the reset basic logical circuit block 62 and the halt value is propagated into the first logical circuit block, i.e., the first half section of the target logical circuit with those halt values set as starting points.

It is assumed that after the halt value has been entirely propagated into the first logical circuit block, the level of the common reset signal GR in the first logical circuit block changes to the L-level and the level of the common reset signal GRB in the second logical circuit block changes to the H-level. It is also assumed that this change occurs because clock signals opposite in phase are applied to the GR and GRB, respectively. From this change on, since the reset signal, GRB in the second logical circuit block, i.e., the second half of the target logical circuit is at the H-level, the halt value appears on the respective outputs of the reset basic logical gate circuit block 63 having the holding feature and the reset basic logical gate circuit block 62 applied with the reset signal and the halt value is propagated into the second logical circuit block, i.e., the second half of the target circuit with those halt values as starting points. Simultaneously with the propagation, the. effective value applied from the external input is propagated into the reset basic logical gate circuit block 63 having the holding feature closest to the, external input, the basic logical gate circuit block 61, the reset basic logical gate circuit block 62 and then the basic logical gate circuit block 61 in this order in the first logical circuit block, i.e., the first half section of the target logical circuit. Finally, it is assumed that after the effective value arrives at the entry of the second logical circuit block and the halt value has been entirely propagated into the second logical circuit block, clocks change again.

In this case, the effective value is propagated into the second logical circuit block and the effective value finally arrives at the external output while the halt value is propagated into the first logical circuit block. Since the propagation of the halt value is accelerated by the means corresponding to claim 11, the halt value can early arrive at the entry of the second logic circuit block. However, the function of the reset logical circuit block 63 having the holding feature prevents the propagation of the halt value and holds the effective value. As can be seen, the means according to claim 15 can almost conceal the halt value propagation time behind the effective value propagation time and shorten a cycle for repeatedly operating the target logical circuit to be as close as the effective value propagation time.

BRIEF DESCRIPTION OF THE DRAWINGS

In the accompanying drawings:

FIG. 21 is a signal value table of a basic logical gate showing a mode for carrying out the invention;

DESCRIPTION OF THE PREFERRED EMBODIMENTS

Modes for carrying out the present invention will be described hereinafter in detail with reference to the drawings.

Claims 1 to 7 relate to the circuit configuration of a logical gate to make delay time generated when the output signal of the logical gate rises asymmetric with delay time generated when the output signal thereof falls, to thereby effectively shorten the delay time generated since an input to applied to a circuit block in which a plurality of logical gates are connected in multiple stages until an output is obtained. At the same time, claims 1 to 7 are intended to realize a logical gate higher in speed and lower in power consumption than the DCVS-DOMINO circuit having a high operating speed.

Figures 6, 7, 8:
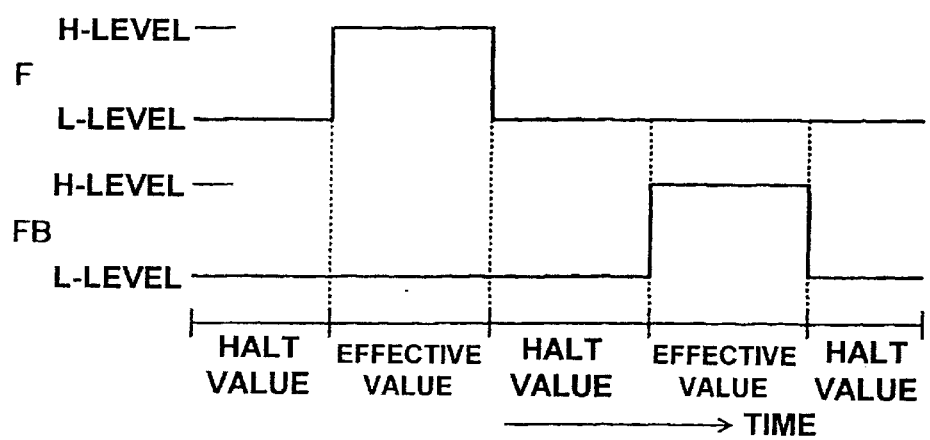
FIG. 6 is a signal value table of a basic logical gate showing a mode for carrying out the invention.
FIG. 7 is a signal value table of a basic logical gate showing a mode for carrying out the invention.
FIG. 8 is a waveform chart of a signal showing a mode for carrying out the invention.

Claim 1 provides the basic configuration of the above-stated logical gate. A mode for carrying out the invention corresponding to claim 1 will be described hereinafter. Claim 1 is intended for a two-wire logical circuit using a pair of signal lines comprising two signal lines for propagating a logical value. Also, the signal line pair expresses two types of signal values, i.e., a halt value and an effective value. If the signal line pair has the halt value, the two signal lines are assumed to have an equal signal value, i.e., {L, L} or {H, H}. If the signal line pair has the effective value, the two signal lines are assumed to have mutually exclusive signal values, i.e., {H, L} or {L, H}. Depending on the two types of effective values, logic 0 and logic 1 are expressed. FIGS. 6 and 7 exemplify how to determine the effective value and the halt value. It is noted that "L" normally denotes that the potential of a signal line is a GND potential and that "H" denotes that the potential of a signal line is a VDD potential. Next, to propagate one logical value, the value expressed by the signal line pair which is originally the halt value, changes to the effective value expressing either the logic "0" or logic "1" and then returns again to the halt value. The manner of the propagation will be described with reference to FIG. 8. In the example of FIG. 8, if a pair of signal lines F and FB have, {L, L}, the signal pair has a halt value. FIG. 8 exemplifies a case where the signal value changes to the halt value of {L, L}, the effective value of {H, L}, the halt value of {L, L}, the effective value of {L, H} and the halt value of {L, L}. What is important here is that the signal value does not change from one effective value of {H, L} to the other effective value of {L, L} but always changes from one effective value to the other effective value through the halt value of {L, L}.

Figure 9:
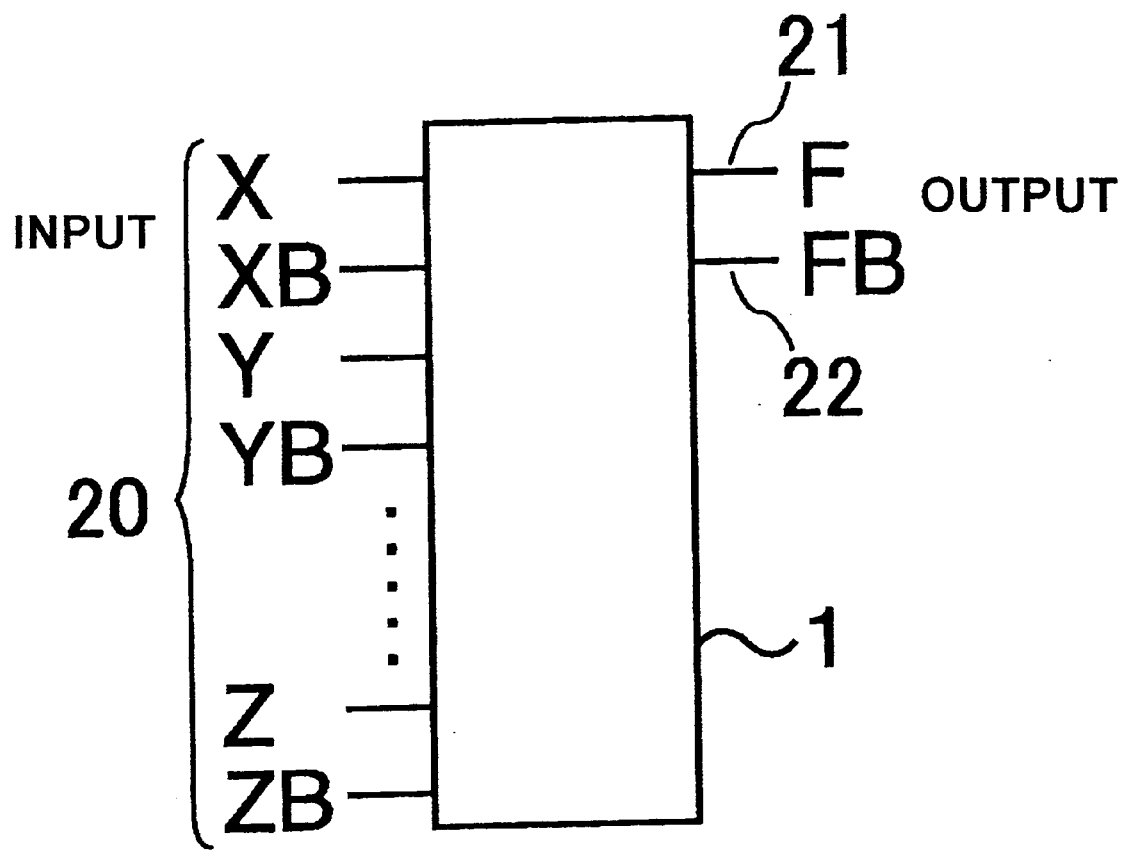
FIG. 9 is a constructional diagram of a basic logical gate showing a mode for carrying out the invention.
Figure 10:
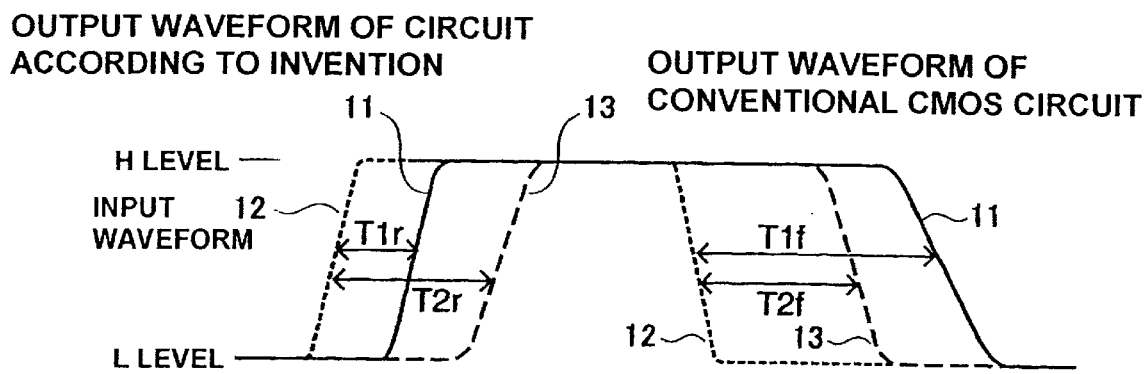
FIG. 10 is a waveform chart of a basic logical gate showing a mode for carrying out the invention.
Figure 11:
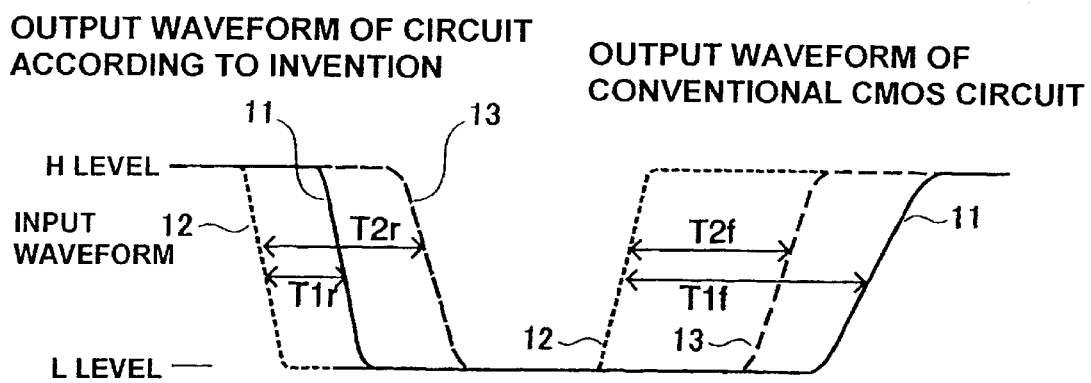
FIG. 11 is a waveform chart of a basic logical gate showing a mode for carrying out the invention.

A basic logical gate 1, which is the logical circuit using the signal lines as stated above and which realizes the feature of a logical function, has not less than one pair of signal lines 20 as inputs and one pair of signal lines 21 and 22 as an output. FIG. 9 exemplifies the inputs and output of the basic logical gate 1. In FIG. 9, it is shown that not less than one pair of signal lines 20 as the inputs include signal line pairs X and XB, Y and YB and Z and ZB. Further, this basic logical gate. outputs the halt value if not less than one input has the halt value and outputs the effective value according to the feature of a logical function if all the inputs have the effective values. This operation is further fractionized according to the detailed configuration of the basic logical gate as will be described later in detail. In addition, this basic logical gate is constituted so that delay time generated since the input changes until the output changes is asymmetric so that the delay time generated when signal value changes from the halt value to the effective value is short and the delay time generated when the signal value changes from the effective value to the halt value is long. FIGS. 10 and 11 show this asymmetry. FIG. 10 exemplifies the input waveform and the output waveform of the basic logical gate according to the present invention if it is assumed that {L, L} correspond to the halt value. In this case, waveform rise from "L" to "H" represents the transition of the signal value from the halt value to the effective value and waveform fall from "H" to "L" represents the transition of the signal value from the effective value to the halt value. Delay time T1r generated since an input waveform 12 rises until the output waveform 11 of the basic logical gate according to the present invention falls is short, while delay time T1f since the input waveform 12 falls until the output waveform 11 of the basic logical gate according to the present invention falls is long. By contrast, in case of the output waveform 13 of the conventional CMOS circuit, rise delay time T2r and fall delay time T2f are almost equal to each other. In the basic logical gate according to the present invention, rise delay time (of the transition of the signal value to the effective value) is shorter than that of the conventional CMOS circuit and fall delay time (of the transition of the signal value to the halt value) is longer than that of the conventional CMOS circuit. FIG. 11 exemplifies signal waves while assuming that {L, L} corresponds to the halt value. In case of FIG. 11, the output waveform 11 of the basic logical gate according to the present invention falls fast and rises slowly.

Next, a mode for carrying out the invention corresponding to claim 2 will be described with reference to FIG. 12. Claim 1 provides one concrete circuit configuration for claim. The basic logical gate corresponding to claim 2 consists of two output inverters 23 and 24 having, as respective outputs, the one pair of signal lines 21 and 22 as the output. Also, the basic logical gate has a PMOS network 29 connected to the not less than one pair of signal lines 20 as the inputs, to input lines 25 and 26 of the two output inverters 23 and 24, respectively, and to a VDD power source line 27. Further, the basic logical gate has an NMOS network 30 connected to the not less than one pair of signal lines 20 as the inputs and to a GND power source line 28. Here, the PMOS network 29 is constituted by mutually connecting a plurality of PMOS transistors. The NMOS network 30 is constituted by mutually connecting a plurality of NMOS transistors.

Next, a mode for carrying out the invention corresponding to claim 3 will be described. Claim 3 specifies how to apply one concrete signal level and associated circuit characteristics for claim 2. It is assumed that if both of the two signal lines included in a pair of signal lines 21 and 22 have a voltage level L, i.e., a GND potential, the signal line pair has the halt value, and that otherwise, i.e., if one of the two signal lines has a voltage level H(VDD potential) and the other signal line has a voltage level L, the signal line pair has the effective value. This assumption is the same as that shown in FIG. 6. If so assumed, a constitution for obtaining circuit characteristics such that delay time generated when the output of the basic logical gate changes from the halt value to the effective value is short and delay time generated when the output thereof changes oppositely is long is as shown in FIG. 12. Namely, a current driving capability of the NMOS network 30 for decreasing the potential the input lines 25 and 26 of the respective output inverters to the GND potential is set to be higher than a current driving capability of the PMOS network 29 for increasing the potential of the input lines 25 and 26 of the respective output inverters to the VDD potential. In addition, a current driving capability of a PMOS transistor included in the output inverters 23 and 24 is set to be higher than a current driving capability of an NMOS transistor included in the output inverters 23 and 24. By doing so, the signal value change on the input lines 25 and 26 of the respective output inverters 23 and 24 is such that fall transition time from the VDD potential to the GND potential is short and rise transition time thereof is long, which is the first circuit characteristic. Also, the signal value change on the one pair of signal lines 21 and 22 as the output, i.e., the output lines 21 and 22 of the respective output inverters 23 and 24 is such that rise transition time from the GND potential to the VDD potential is short and fall transition time from the VDD potential to the GND potential is long, which is the second circuit characteristic. Since the signal value changes at the inputs and outputs of the output inverters are opposite in direction, the first and second characteristics enhance each other. In other words, delay time generated until the signal value of the output changes according to the changes of the signal values of the inputs is designed asymmetrically so that the delay time generated when the output changes from the halt value to the effective value is short and the delay time generated when the output changes from the effective value to the halt value is long. It is noted that if the assumption of FIG. 7 in which the signal value has the halt value if the values of the signal lines are {H, H}, it is necessary that the output waveform of the basic logical gate according to the present invention has that as shown in FIG. 11. If so, desired circuit characteristic can be obtained by inverting the magnitudes of the current driving capabilities of the PMOS and NMOS networks shown in FIG. 12.

Claim 4 concretely specifies a method for realizing the circuit characteristic for claim 3. Namely, a difference in the magnitude of the current driving capability is realized by changing a gate width w of each of the PMOS transistors and the NMOS transistors. A mode for carrying out the invention corresponding to claim 4 will be described with reference to FIG. 13. The gate width w of each PMOS transistor included in the PMOS network 29 is set at 0.7 micrometers, the gate width w of each NMOS-transistor included in the NMOS network 30 is set at 1.4 micrometers and the current driving capability of the NMOS transistor is set higher than that of the PMOS transistor. In addition, the gate width w of a PMOS transistor included in each of the output inverters 23 and 24 is set at 0.7 micrometers, the gate width of an NMOS transistor included in each of the output inverters 23 and 24 is set at 0.7 micrometers and the current driving capability of the PMOS transistor is set higher than tat of the NMOS transistor. These dimensions are set on the assumption of 0.18 micrometer process.

Consider a case where a plurality of basic logical gates are employed, the output of one basic logical gate is connected to the input of the other basic logic gate and the multistage connection of basic logical gates is thereby established. It is noted, however, that ring connection for returning the output of a basic logical gate to the input of the same logical gate through the other basic logical gate is not permitted. It is assumed that in an initial state, an input applied to the multistage connection of the basic logical gates is a halt value and the outputs of all the basic logical gates are halt values. Next, if an effective value is applied, as an input, to the multistage connection of the basic logical gates, then the basic logical gate in the first stage outputs the effective value, the outputted effective value is applied, as an input, to the basic logical gate in the next stage, the basic logical gate in the next stage outputs the effective value accordingly, the effective value is sequentially propagated to the basic logical gates in the following gates and the effective value finally appears on the output of the multistage connection of the basic logical gates. Thereafter, if the input of the multistage connection of the basic logical gates is changed to the halt value, the halt value is sequentially propagated to the following stages as in the case of the effective value and the halt value finally appears on the output of the multistage connection of the basic logical gates.

At this moment, according to the present invention, delay time generated since the effective value arrives at the input of the basic logic gate until the effective value is outputted, i.e., delay time generated when the output changes from the halt value to the effective value is shorter than the delay time generated since the halt value arrives at the input until the halt value is outputted, delay time generated when the output changes from the effective value to the halt value. Due to this, time required for propagating the effective value from the input of the multistage connection of the basic logical gates toward the output thereof is shortened, and time required for propagating the halt value is lengthened. The shortened effective value propagation delay is utilized to accelerate the circuit operation.

Next, a mode for carrying out the invention corresponding to claim 5 will be described. Claim 5 provides the first more detailed constitution for claims 3 to 4 and specifies the relationship between the input signals and the operation of the PMOS network 29 and that between the input signals and the operation of the NMOS network 30.

Figure 14:
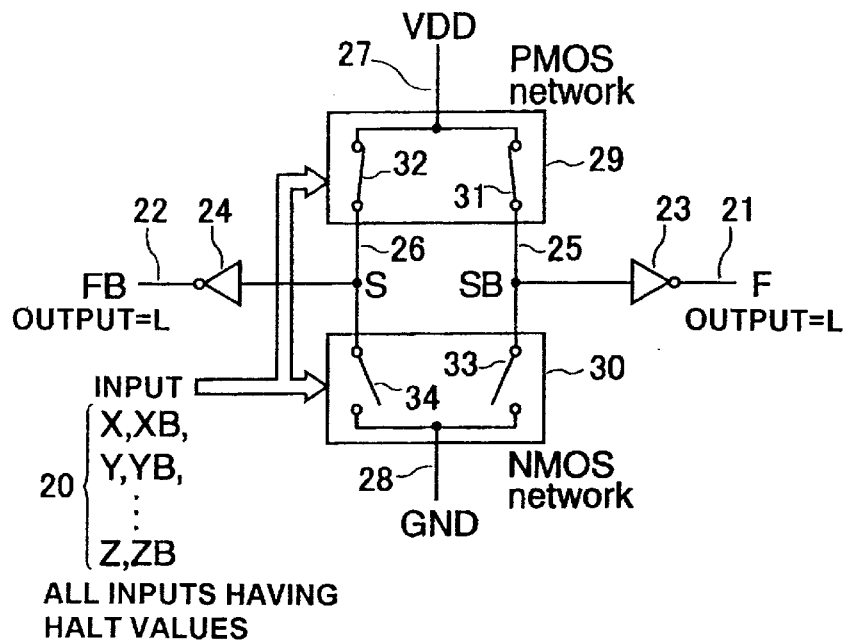
FIG. 14 is a circuit diagram of a basic logical gate showing a mode for carrying out the invention;.
Figure 15:
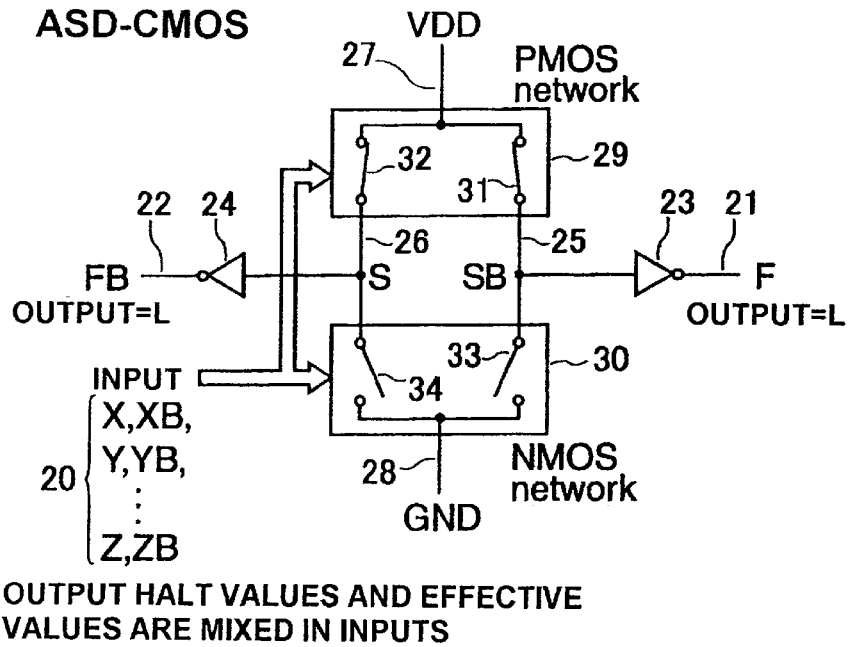
FIG. 15 is a circuit diagram of a basic logical gate showing a mode for carrying out the invention.
Figure 16:
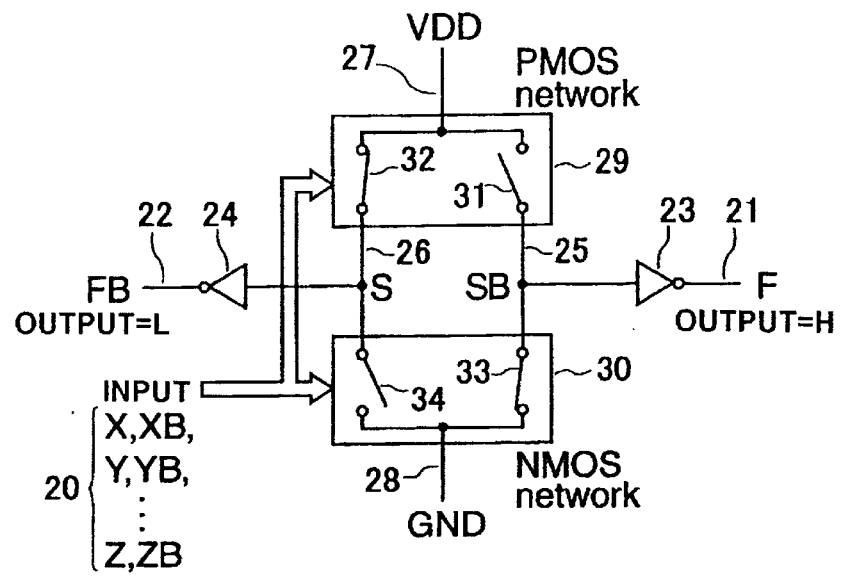
FIG. 16 is a circuit diagram of a basic logical gate showing a mode for carrying out the invention.
Figure 17:
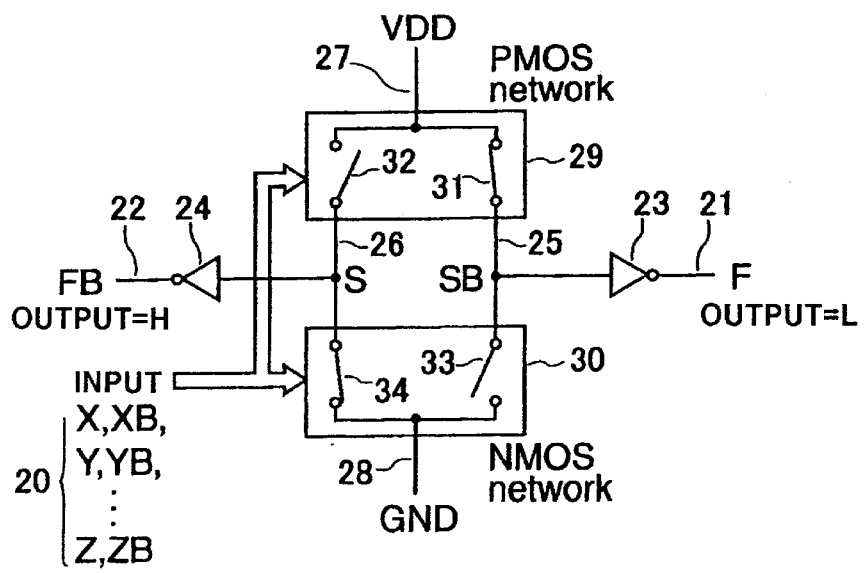
FIG. 17 is a circuit diagram of a basic logical gate showing a mode for carrying out the invention.

The operation of the basic logical gate corresponding to claim 5 will be described with reference to FIGS. 14 to 17. The PMOS network 29 operates to make a signal path 31 between the VDD power source line 27 and the input line 25 of one of the output inverters and a signal path 32 between the VDD power source line 27 and the input line 26 of the other output inverter conductive if at least not less than one of the inputs has the halt value. The PMOS network 29 shown in FIGS. 14 and 15 shows this state. FIG. 14 shows a case where all the inputs have the halt values and FIG. 15 shows a case where the halt values and the effective values are mixed in the inputs. In addition, the PMOS network 29 operates to make one of the two signal paths 31 and 32 conductive and to cut off the other one of the signal paths 31 and 32 in accordance with the realized logical feature if all of the inputs have the effective values. The PMOS network 29 shown in FIGS. 16 and 17 shows this state. FIGS. 16 and 17 differ in the logical value outputted as the effective value. In FIG. 16, the logic "1" is outputted. In FIG. 17, the logic "0" is outputted. On the other hand, the NMOS network 30 operates to cut off both a signal path 33 between the GND power source line 28 and the input line 25 of one of the output inverters and a signal path 34 between the GND power source line 28 and the input line 26 of the other output inverter if at least not less than one of the inputs has the halt value. The NMOS network shown in FIGS. 14 and 15 shows this state. FIG. 14 shows a case where all the inputs have the halt values and FIG. 15 shows a case where the halt values and the effective values are mixed in the inputs as already stated above. In addition, the NMOS network 30 operates to make one of the signal paths 33 and 34 conductive and to cut off the other one of the signal paths 33 and 34 in accordance with the realized logical feature if all of the inputs have the effective values. At this moment, if observing the circuit from the input lines 25 and 26 of the respective output inverters, the basic logical gate operates to cut off the signal path of the NMOS network on the side on which the signal path of the PMOS network is conductive and to make the signal path of the NMOS network conductive on the side on which the signal path of the PMOS network is cut off. The NMOS network 30 shown in FIGS. 16 and 17 shows this state. As can be seen, if the halt value is included in the inputs, the VDD potential appears on the input lines 25 and 26 of the respective output inverters and the basic logical gate stated above, therefore, outputs the halt value. If all the inputs have the effective values, one of the input lines 25 and 26 of the respective output inverters is changed to have the GND potential in accordance with the feature of the logical function and the basic logical gate, therefore, outputs the effective value. In the above-stated operations, the input lines 25 and 26 of the respective output inverters are always conductive to either the VDD power source line 27 or the GND power source line 28. It can be said that such a basic logical gate performs a static operation. The basic logical gate operating as stated above will be referred to as "ASD-CMOS" hereinafter.

Next, a mode for carrying out the invention corresponding to claims 6 and 7 will be described. Claims 6 and 7 provide the second more detailed constitution for claims 3 and 4 and specifies the relationship between the input signals and the operation of the PMOS network 29 and that between the input signals and the NMOS network 30.

Figure 18:
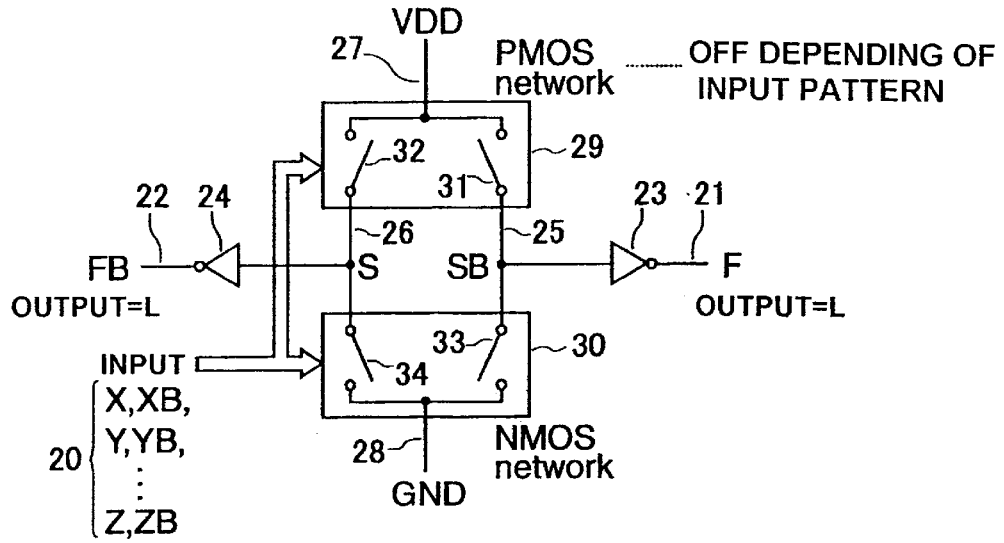
FIG. 18 is a circuit diagram of a basic logical gate showing a mode for carrying out the invention.
Figure 19:
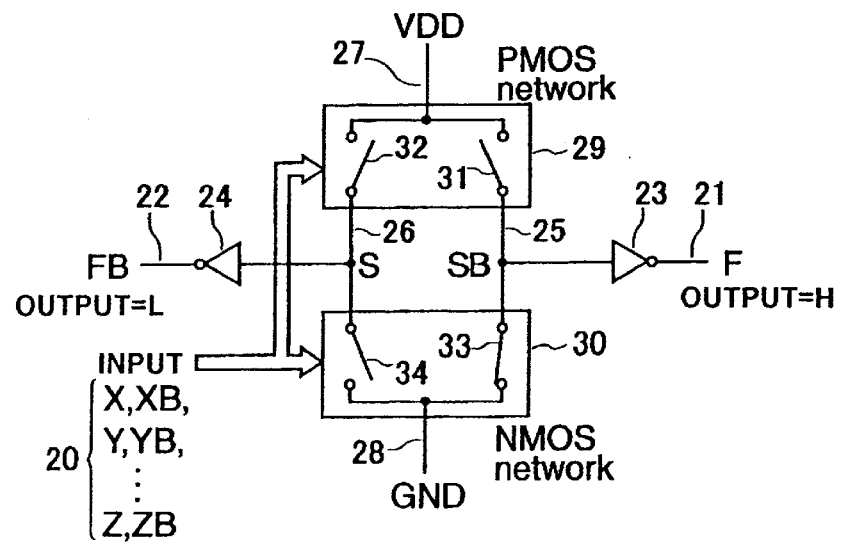
FIG. 19 is a circuit diagram of a basic logical gate showing a mode for carrying out the invention.
Figure 20:
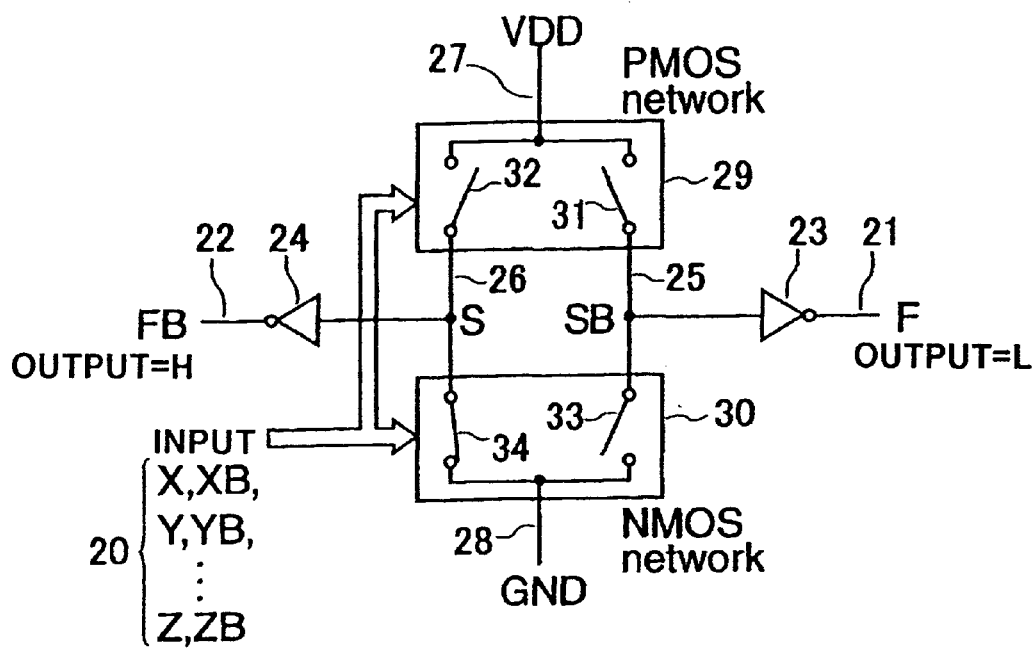
FIG. 20 is a circuit diagram of a basic logical gate. showing a mode for carrying out the invention.

The operation of the basic logical gate corresponding to claims 6 and 7 will be described with reference to FIGS. 14 and 18 to 20. The PMOS network 29 operates to make both a signal path 31 between the VDD power source line 27 and the input line 25 of one of the output inverters and a signal path 32 between the VDD power source line 27 and the input line 26 of the other output inverter conductive if all of the inputs have the halt values. The PMOS network shown in FIG. 14 shows this state. In addition, the PMOS network 29 operates to cut off both of the two signal paths 31 and 32 if specific inputs out of the inputs have the effective values and the remaining inputs have the halt values or if all of the inputs have the effective values. The PMOS network 29 shown in FIGS. 18 to 20 shows this state. Here, FIG. 18 shows a case where the effective values and the halt values are mixed in the inputs and FIGS. 19 and 20 show a case where all the inputs have the effective values. It is noted, however, that FIG. 19 shows a case where the logic "1" is outputted as the effective value and FIG. 20 shows a case where the logic "0" is outputted as the effective value. On the other hand, the NMOS network 30 operates to cut off both a signal path 33 between the GND power source line 28 and the input line 25 of one of the output inverters and a signal path 34 between the GND power source line 28 and the input line 26 of the other output inverter if not less one of the inputs has the halt value. FIGS. 14 and 18 show this state. Here, as stated above, FIG. 14 shows a case where all the inputs have the halt values and FIG. 18 shows a case where the effective values and the halt values are mixed in the inputs. In addition, the NMOS network 30 operates to make one of the signal paths 33 and 34 conductive and to cut off the other one of the signal paths 33 and 34 in accordance with the realized logical feature. or if all of the input have the effective values. FIGS. 19 and 20 show this state. In the above-stated operations, in the case shown in FIG. 18, the input lines 25 and 26 of the respective output inverters are not conductive to the VDD power source line 27 nor the GND power source line 28. During this, the potentials of the input lines 25 and 26 of the respective output inverters are maintained by the charge stored in the parasitic capacitance. It is said that such a basic logical gate performs a dynamic operation. Further, the basic logical gate performing the dynamic operation may be constituted so that charge holding PMOS transistors 35 and 36 are added to the input lines 25 and 26 of the output inverters, respectively. As can be seen from the above, if all the inputs have the halt values, a VDD potential appears on the input lines 25 and 26 of the respective output inverters and the basic logical gate stated above, therefore, outputs the halt value. Even if a part of the inputs are changed to have the effective values, the basic logical circuit continues to output the halt value. On the other hand, if all the inputs have the effective values, one of the input lines 25 and 26 of the respective output inverters are changed to have the GND potential in accordance with the feature of the logical function and the basic logical gate, therefore, outputs the effective value. The basic logical gate performing such a dynamic operation will be referred to as "ASDDL" hereinafter.

ASD-CMOS corresponding to claim 5 and ASDDL corresponding to claims 6 and 7 perform similar operations except for the operation of the PMOS network 29. The operation of the NMOS network 30 is common to ASD-CMOS and ASDDL. FIG. 21 shows the operations of ASD-CMOS and ASDDL. While there are many similar respects between ASD-CMOS and ASDDL, they have individual, different advantages. These advantages will be described in detail in "EMBODIMENTS OF THE INVENTION" part. Further, ASD-CMOS and ASDDL are lower in power consumption and higher in speed than the DVS-DOMINO circuit classified as the highest-speed logical circuits among the conventional logical circuits manufactured by the CMOS process as will be described in "EMBODIMENTS OF THE INVENTIONS" part while referring to the detailed circuit structure.

Next, modes for carrying out the invention corresponding to claims 8 to 15 will be described. Claims 1 to 7 accelerate the propagation of the effective value by asymmetrically designing the signal rise transition time and the signal fall transition time and thereby realize the high-speed operation of the circuit. However, claims 1 to 7 do not specially mention that the propagation of the halt value is decelerated. Here, consider a case of repeatedly operating the logical circuit constituted by multistage-connecting the basic logical gates. If the effective value propagation is accelerated, time required until the output of the logical circuit is obtained is shortened but, on the other hand, the propagation of the halt value is decelerated. Due to this, a repetition cycle for repeatedly operating the logical circuit cannot be shortened. Claims 8 to 11 provide a constitution for accelerating the propagation of the halt value in the logical circuit constituted by the multistage-connection of the basic logical circuits and shortens the repetition cycle for repeatedly operating the logical circuit. Claims 12 to 15 provide a constitution for allowing the repetition operation cycle of the circuit to be substantially shortened to be close to effective value propagation time by concealing the halt value propagation time behind the effective value propagation time if the logical gate is repeatedly operated.

Figure 22:
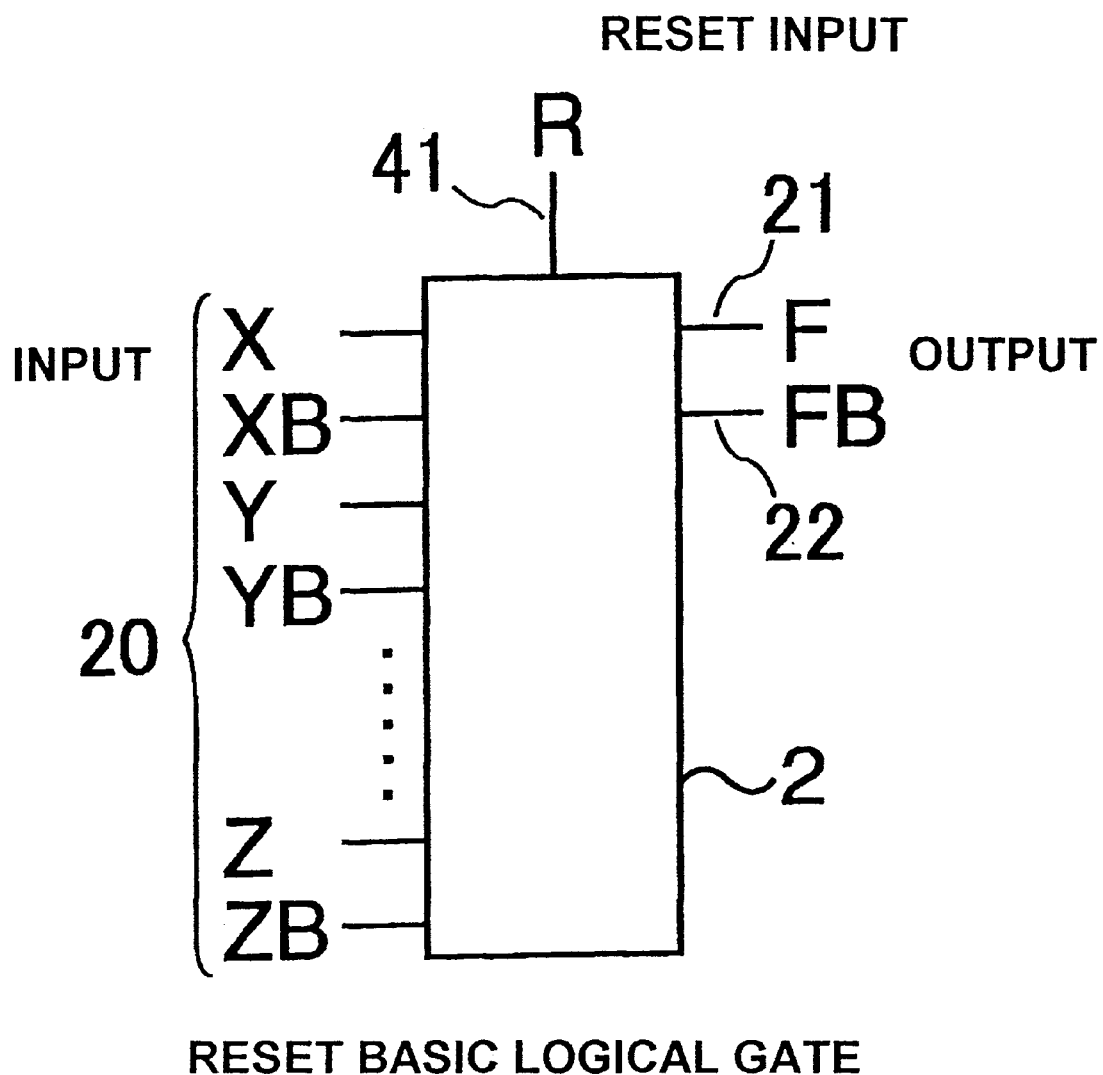
FIG. 22 is a constructional diagram of a basic logical gate showing a mode for carrying out the invention.
Figure 23:
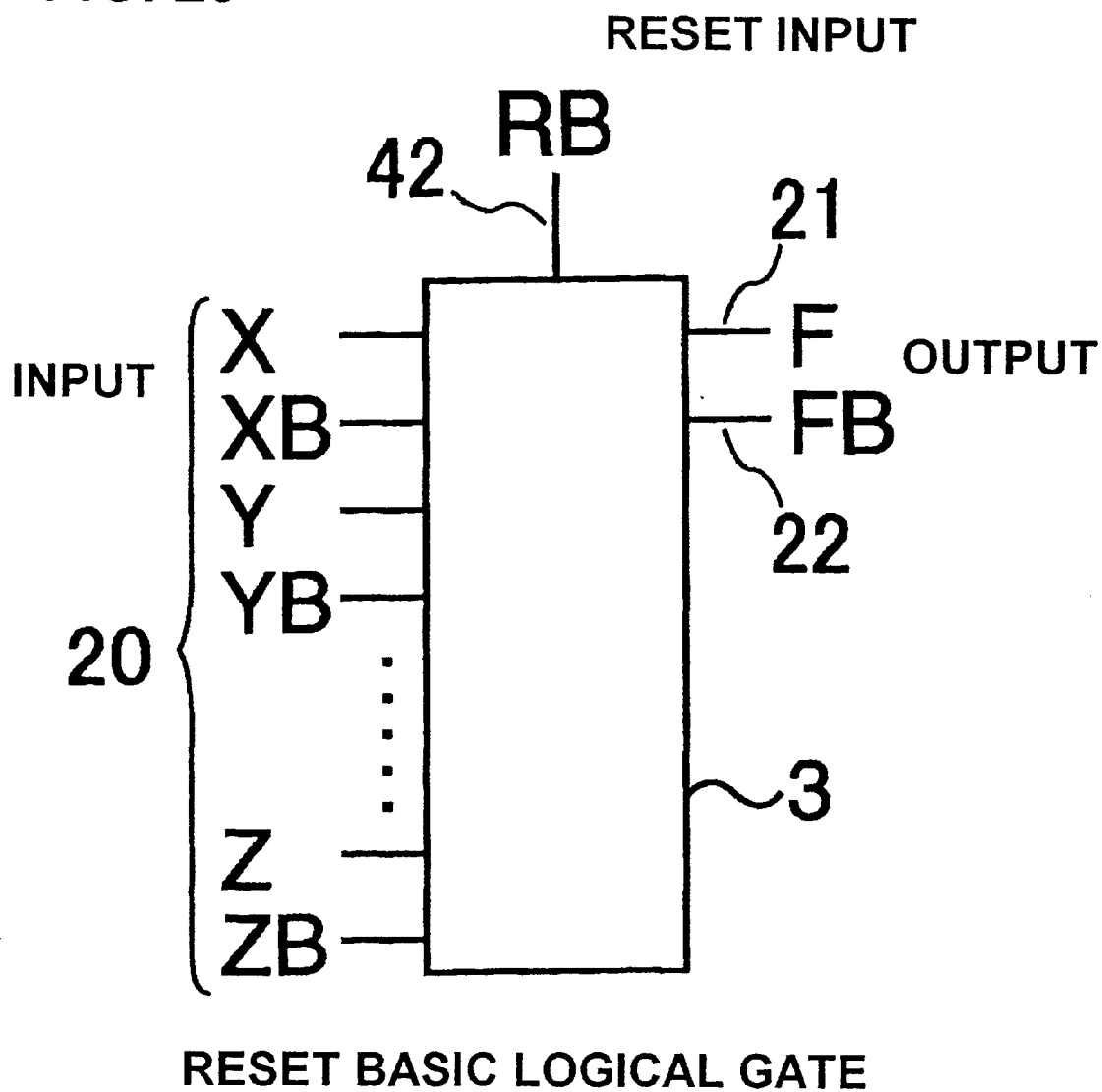
FIG. 23 is a constructional diagram of a basic logical gate showing a mode for carrying out the invention.

Next, a mode for carrying out the invention corresponding to claim 8 will be described. Claim 8 expands the basic logical gate corresponding to claims 1 to 7 and provides the constitution of a reset basic logical gate for starting the propagation of the halt value. The mode for carrying out the invention corresponding to claim 8 provides the basic logical gate corresponding to claim 1 to 7 with the reset input 41 or 42 as shown in FIGS. 22 and 23. If the reset input receives an effective input, the value of the pair of signal lines 21 and 22 as the output is forced to become the halt value irrespectively of the values of the not less than one pair of signal lines 20 as the inputs.

Claim 9 provides the first more detailed constitution of the means corresponding to claim 8 stated above.

Figure 24:
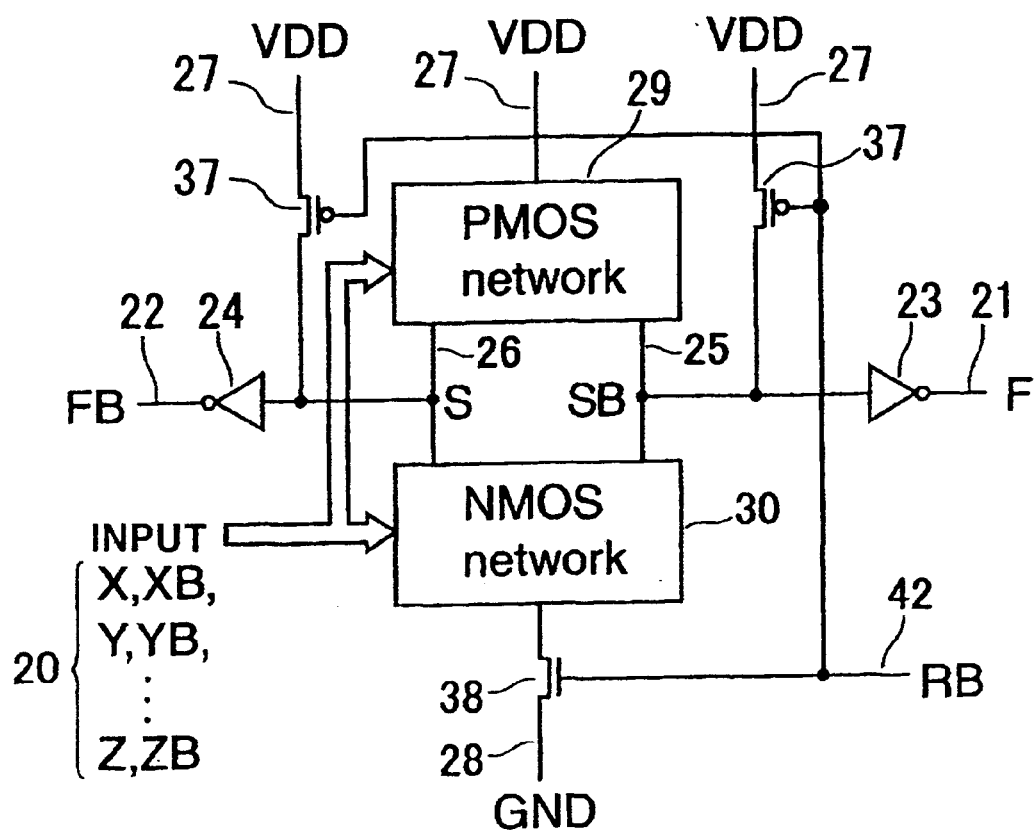
FIG. 24 is a circuit diagram of a basic logical gate showing a mode for carrying out the invention.

The mode for carrying out the invention corresponding to claim 9 will be described with reference to FIG. 24. A PMOS transistor 37 for making the input lines 25 and 26 of the respective output inverters and the VDD power source line 27 conductive, and an NMOS transistor 38 for cutting off the signal paths between the input lines 25 and 26 of the respective output inverters and the GND power source line 28 are provided for the basic logical gate corresponding to claims 3 to 7, that is, the basic logical gate shown in FIG. 12 or 25. Then, the reset input 42 is connected to gate inputs of the PMOS transistor 37 and the NMOS transistor 38, respectively, thereby constituting means for forcing the value of the one pair of signal lines 21 and 22 as the output to become the halt value. If an effective signal value, i.e. the GND potential is applied to the reset input 42, then the PMOS transistor 37 is turned on, the NMOS transistor 38 is turned off, the potentials of the input lines 25 and 26 of the respective output inverters 12 and 13 are forced to be raised to the VDD potential and the halt value, therefore, appears on the pair of signal lines 21 and 22 as the output. If a reset operation is not required, the reset input 42 should have the VDD potential. FIG. 26 shows another mode for carrying out the invention corresponding to claim 9. FIG. 26 differs from FIG. 24 only in places where the NMOS transistors 38 are inserted. The function of the mode shown in FIG. 26 is exactly the same as that of the mode shown in FIG. 24.

Claim 10 provides the second more detailed constitution of the mode corresponding to claim 8.

Figure 27:
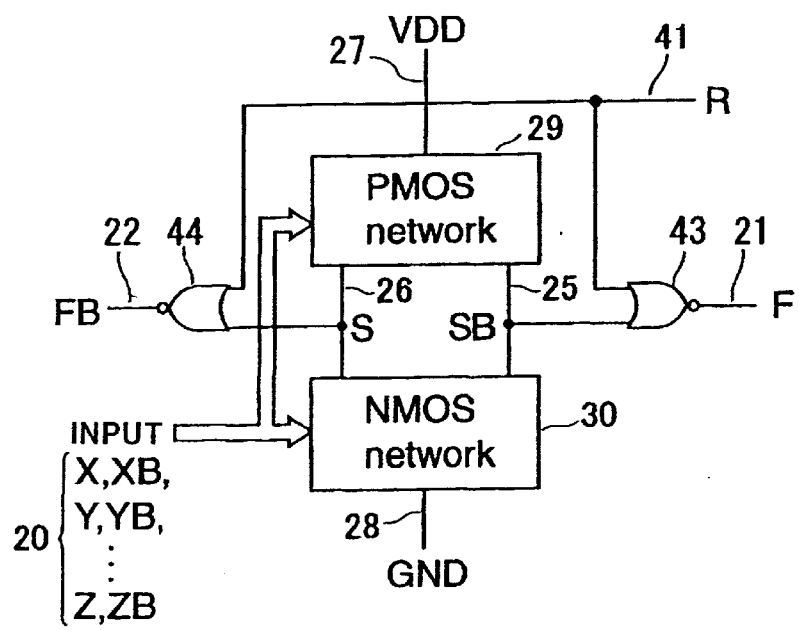
FIG. 27 is a circuit diagram of a basic logical gate showing a mode for carrying out the invention.

The mode for carrying out the invention corresponding to claim 10 will be described with reference to FIG. 27.

Figure 12:
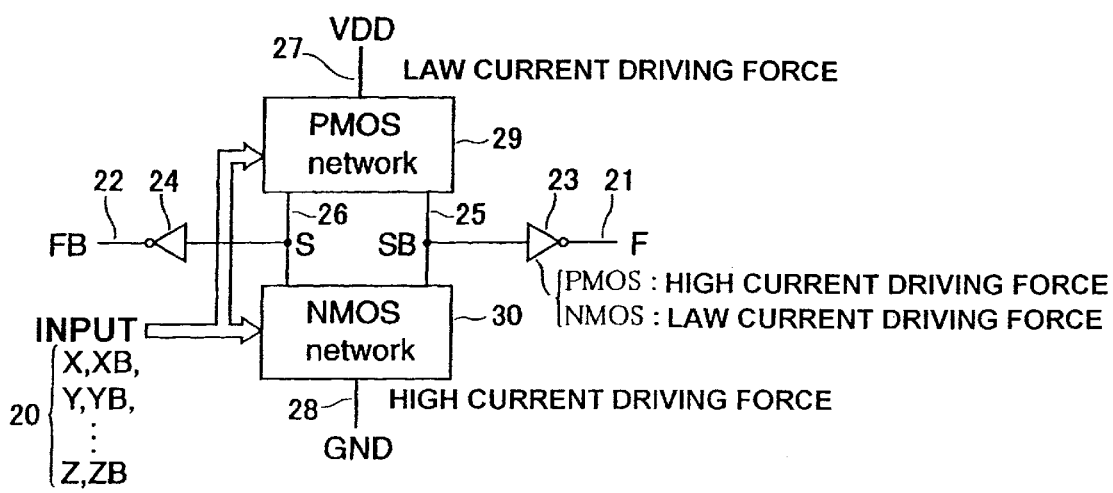
FIG. 12 is a circuit diagram of a basic logical gate showing a mode for carrying out the invention.
Figure 25:
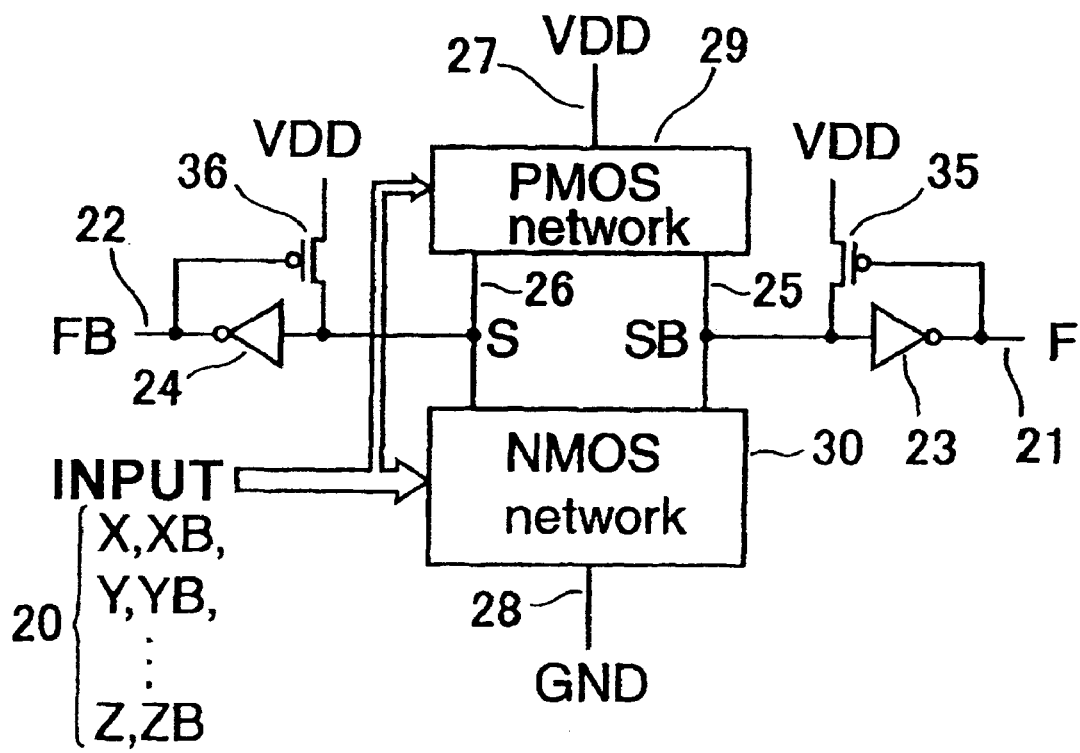
FIG. 25 is a circuit diagram of a basic logical gate showing a mode for carrying out the invention.
Figure 26:
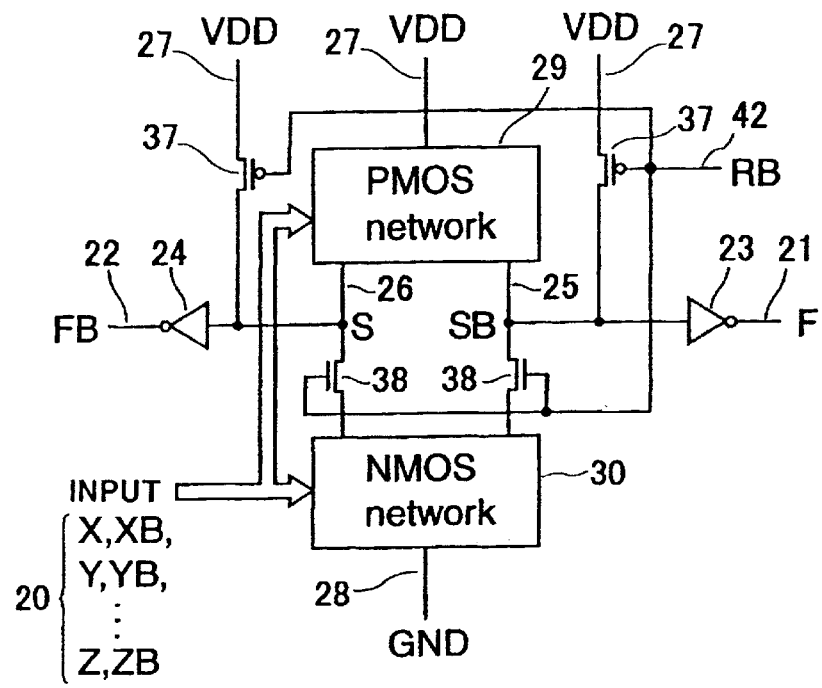
FIG. 26 is a circuit diagram of a basic logical gate showing a mode for carrying out the invention.

For the basic logical gate corresponding to claims 3 to 7, i.e., FIG. 12 or 25, the two output inverters 23 and 24 are replaced by two 2-input NOR gates 43 and 44, respectively, a current driving capability of a PMOS transistor included in each of the 2-input NOR gates 23 and 24 is set to be higher than a current driving capability of an NMOS transistor included in each of the 2-input NOR gates 23 and 24, a first input of the 2-input NOR gate 43 replacing the one output inverter 23 is connected to the input line 25 of the one output inverter before being replaced and a second input of the 2-input NOR gate 43 is connected to the reset input 41, and a first input of the other 2-input NOR gate 44 is connected to the input line 26 of the other output inverter before being replaced and a second input of the other 2-input NOR gate 44 is connected to the reset input 41. By doing so, means for forcing the value of the one pair of signal lines 21 and 22 as the output to become the halt value is constituted. If an effective signal value, i.e., the VDD potential is applied to the reset input 41, the outputs of the NOR gates 43 and 44 are forced to have the L-level, that is, the GND potential. In other words, the halt value appears on the pair of signal lines 21 and 22 as the output. If a reset operation is not required, the reset input 41 should have the GND potential. The reason for setting the current driving capability of the PMOS transistor included in the NOR gates 43 and 44 to be higher than that of the NMOS transistor is to shorten delay time generated when the signal value is changed from the halt value to the effective value.

Claim 11 shortens halt value propagation time by combining two types of blocks, i.e., a basic logical gate circuit block 61 comprising the basic logical gates corresponding to claims 1 to 7 and a reset basic logical gate circuit block 62 consisting of the reset basic logical gates 2 or 3 corresponding to claims 8 to 10.

Figure 28:
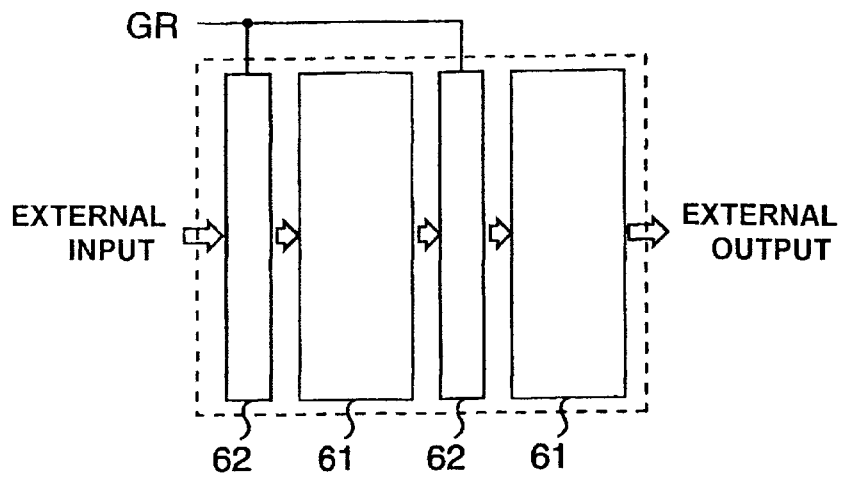
FIG. 28 is a constructional diagram of a logical circuit showing a mode for carrying out the invention.
Figure 29:
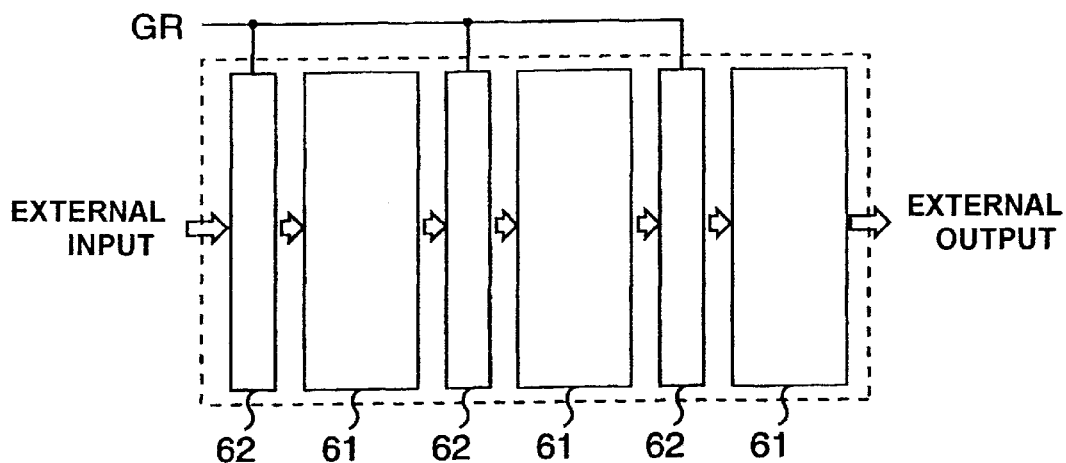
FIG. 29 is a constructional diagram of a logical circuit showing a mode for carrying out the invention.

The mode for carrying out the invention corresponding to claim 11 is shown in FIG. 28. FIG. 28 shows that a basic logical gate circuit block 61, as a constituent element, constituted by a plurality of basic logical gates 1 according to claims 1 to 7 so as to realize a specific logical feature is provided. FIG. 28 also shows that a reset basic logical gate circuit block 62, as a constituent element, constituted by a plurality of reset basic logical gates 3 each having the reset input RB(42) or a plurality of the reset basic logical gates 2 each having the reset input R(41) according to claims 8 to 10 so as to realize a specific logical feature is provided. This reset basic logical gate block 62 has a common reset input mutually connecting the reset inputs RB(42) or R(41) of all of the plurality of reset basic logical gates. Further, FIG. 28 shows that the reset basic logical gate circuit block 62 is arranged in a portion applied with an external input, and the basic logical gate circuit block 61 using an output of the reset basic logical gate circuit block 62 as an input is arranged in a rear stage of the reset basic logical gate circuit block 62. Also, not less than one pair of a reset logical gate circuit block 62 and a basic logical gate circuit block 61 using an output of the reset logical gate circuit block 62 as an input, which are connected to each other, are arranged in rear of the basic logical gate circuit block 61, and an output of the basic logical gate circuit block 61 in a final stage is set as an external output. Furthermore, the common reset inputs of all of the reset basic logical gate circuit blocks 62 are mutually connected to supply a common reset signal GR. FIG. 29 exemplifies a constitution in which more pairs of the reset basic logical gate circuit block 62 and the basic logical gate circuit block 61 are connected than those shown in FIG. 28.

Description will be given to how to shorten the halt value propagation time by the above-stated mode for carrying out the invention. In the mode shown in FIGS. 28 and 29, the reset basic logical gate circuit block 62 is arranged in a portion to which an external input is applied, the basic logical gate circuit block 61 is arranged in the rear stage thereof, a plurality of pairs, each comprising the reset basic logical gate block 62 and the basic logical gate circuit block 61 arranged in the rear stage of the block 62 and connected to the block 62, are connected in the rear stages. The output of the basic logical gate circuit block 51 in the final stage is set as an external output. It is assumed here that the outputs of all the circuits have the halt values as an initial state. If an effective value is applied from the external input, the reset basic logical gate 2 or 3 included in the reset basic logical gate circuit block 62, which is not applied with the reset signal, operates simply as the basic logical gate and the effective value is promptly propagated to the rear stage. Likewise, the effective value arrives at the external output in a short period of time by the function of the basic logical gates according to the present invention and a result is obtained. Then, if a halt value is applied from the external input, the halt value arrives at the external output to take a long period of time and halt value propagation time cannot be, therefore, shortened. In place of this method, an effective signal is applied to the common reset signal GR, whereby the outputs of the plural reset basic logical gate circuit blocks 62 are forced to have the halt values. The propagation of the halt value starting at the plural reset basic logical gate circuit block 62 occurs. Since a plurality of reset basic logical gate circuit blocks 62 are arranged, the distance by which the halt value is propagated is shortened and time required to entirely propagate the halt value to the circuits is, therefore, shortened. In other words, in the mode shown in FIGS. 28 and 29, the halt value propagation distance is shortened and the halt value propagation time is thereby shortened by providing halt value propagation start points in a plurality of portions in the middle of the target circuit instead of sequentially propagating the halt value from the end. of the circuit.

Next, modes for carrying out the invention corresponding to claims 12 to 15 will be described. Claims 12 to 15 provide a logical circuit capable of shortening time required to propagate the halt value as much as possible and minimizing a repetition operation cycle if the logical circuit is repeatedly operated. To be specific, the logical circuit is divided into the first half section (close to the input) and the second half section (close to the output) and circuit blocks comprising holding feature-added reset basic logical gates each having a feature of holding a value are provided in the input section and the intermediate section. While the effective value is propagated to the first half section of the circuit, the halt value is propagated to the second half section of the circuit. While the halt value is propagated to the first half section of the circuit, the effective value is propagated to the second half section of the circuit. Namely, the halt value propagation time is concealed behind the effective value propagation time, thereby substantially shortening the circuit repetition operation cycle to be close to the effective value propagation time. Here, the reset basic logical gates each having a holding feature arranged in the input section and the intermediate section of the logical circuit function in the same manner as pipeline registers in a circuit having pipeline configuration, to hold the effective value and to prevent the propagation of the halt value.

Claim 12 provides basic constituent requirements in relation to the reset basic logical gates 4 and 5 each having a holding feature. In addition, claim 13 provides one more detailed constitution of the basic logical gates 4 and 5 each having the holding feature.

Figure 30:
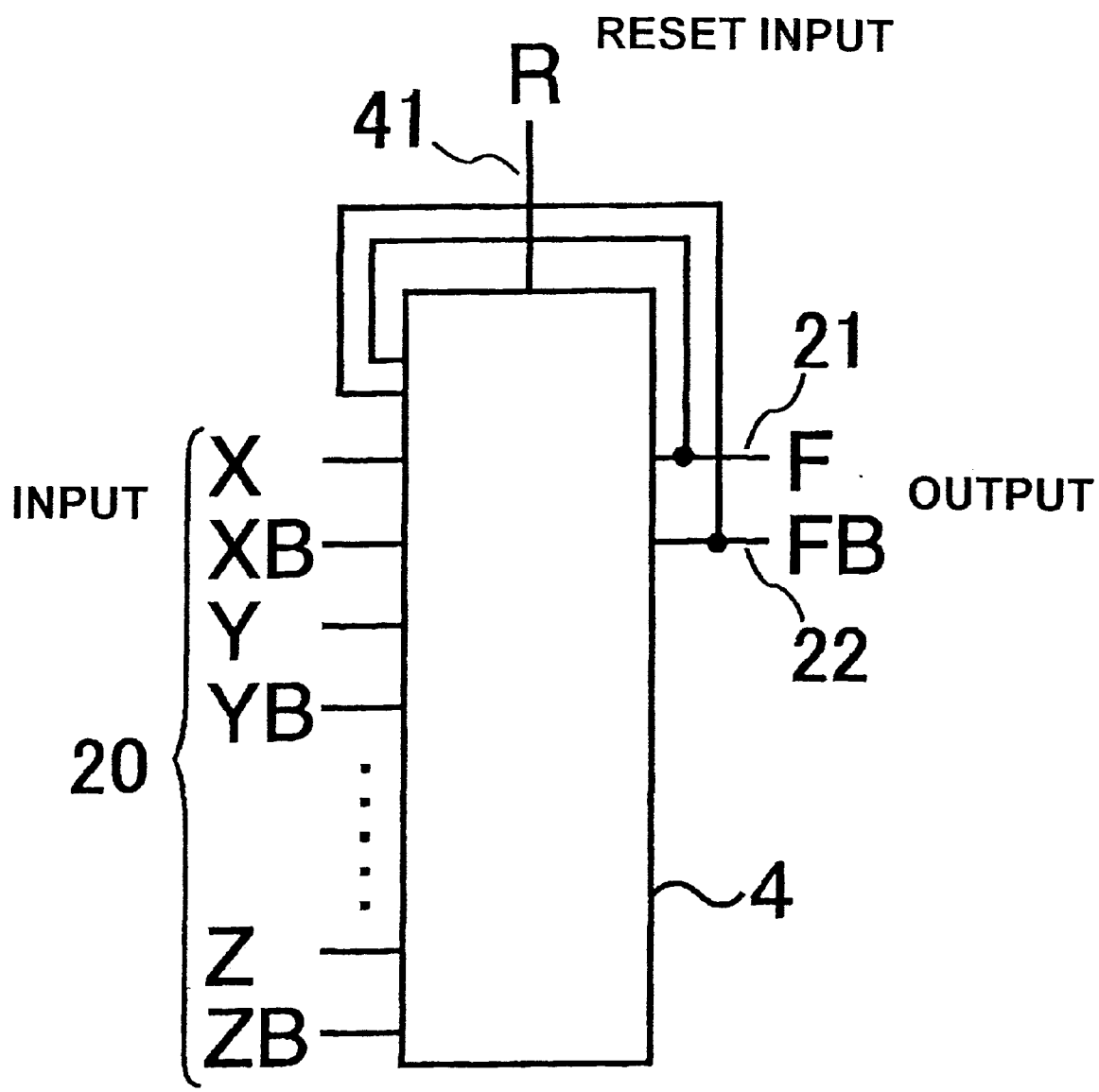
FIG. 30 is a constructional diagram of a basic logical gate showing a mode for carrying out the invention.
Figure 31:
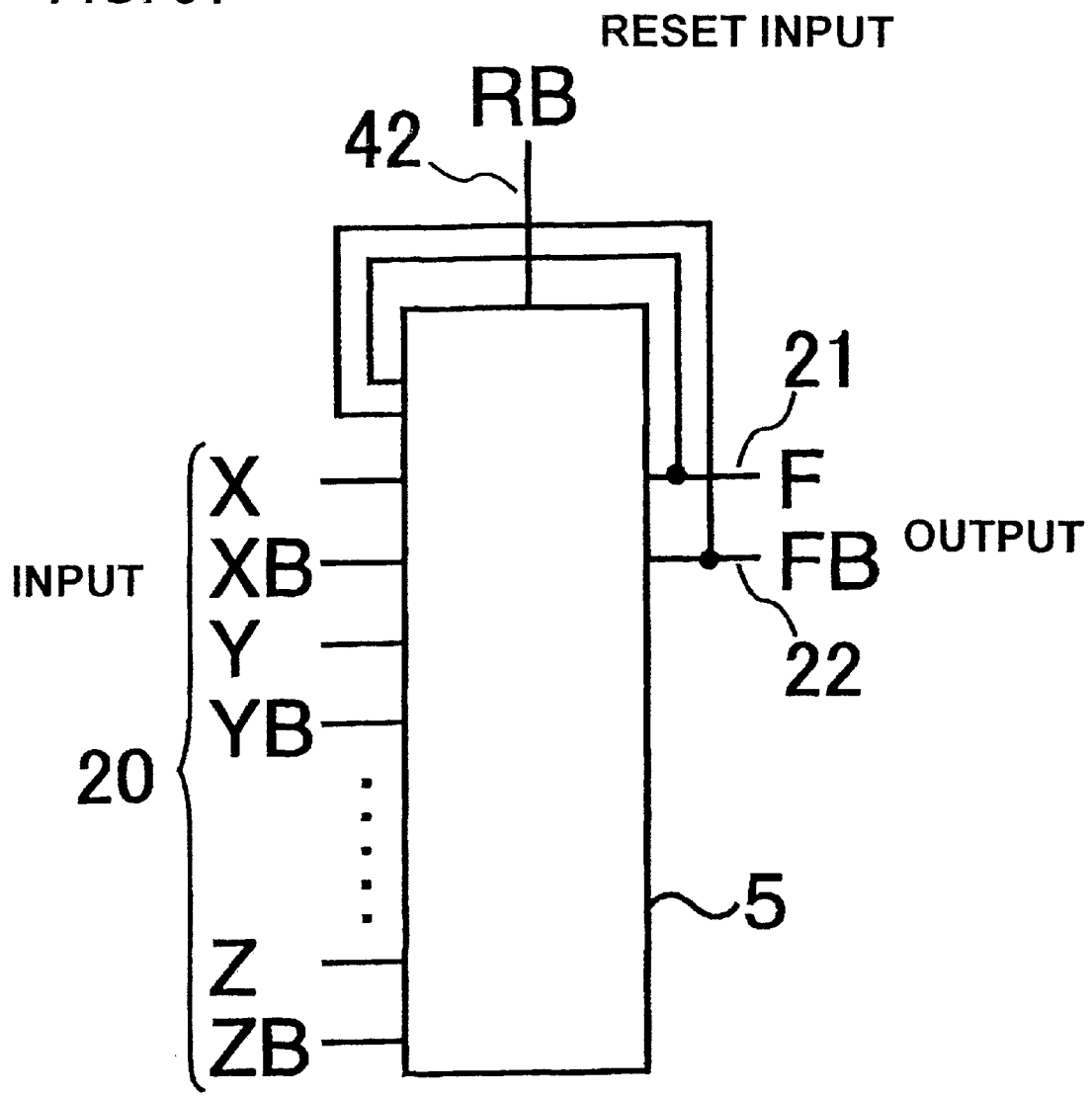
FIG. 31 is a constructional diagram of a basic logical gate showing a mode for carrying out the invention.

The mode for carrying out the invention corresponding to claim 12 will be described. FIGS. 30 and 31 respectively show the reset basic logical gates 4 and 5 each having the holding feature. The reset basic logical gates 4 and 5 each having the holding feature do not greatly differ in the following respects from the reset basic logical gates described in claims 8 to 10. Namely, the value of the one pair of signal lines 21 and 22 as the output is forced to become the halt value irrespectively of the values of the not less than one pair of signal lines 20 as the inputs if the reset input 41 or the reset input 42 has an effective input. The one pair of signal lines 21 and 22 as the output is allowed to have the halt value if the reset input 41 or the reset input 42 has no effective input and, first, the not less than one pair of signal lines 20 as the inputs include the halt values, and then the effective value is allowed to be outputted to the one pair of signal lines 21 and 22 as the output if all of the not less than one pair of signal lines 20 as the inputs have the effective values. However, the reset basic logical gates 4 and 5 each having the holding feature differ in the following respects so as to hold the effective value and to prevent the propagation of the halt value. Namely, the same effective value is held as before without outputting the halt value to the one pair of signal lines 21 and 22 as the output even after the values of not less than one pair of the signal lines 20 of the not less than one pair as the inputs changes to the halt value if the reset input 41 or 42 has no effective input, all of the not less than one pair of signal lines 20 as the inputs have the effective values and the effective value is outputted to the one pair of signal lines 21 and 22 as the output.

Figure 32:
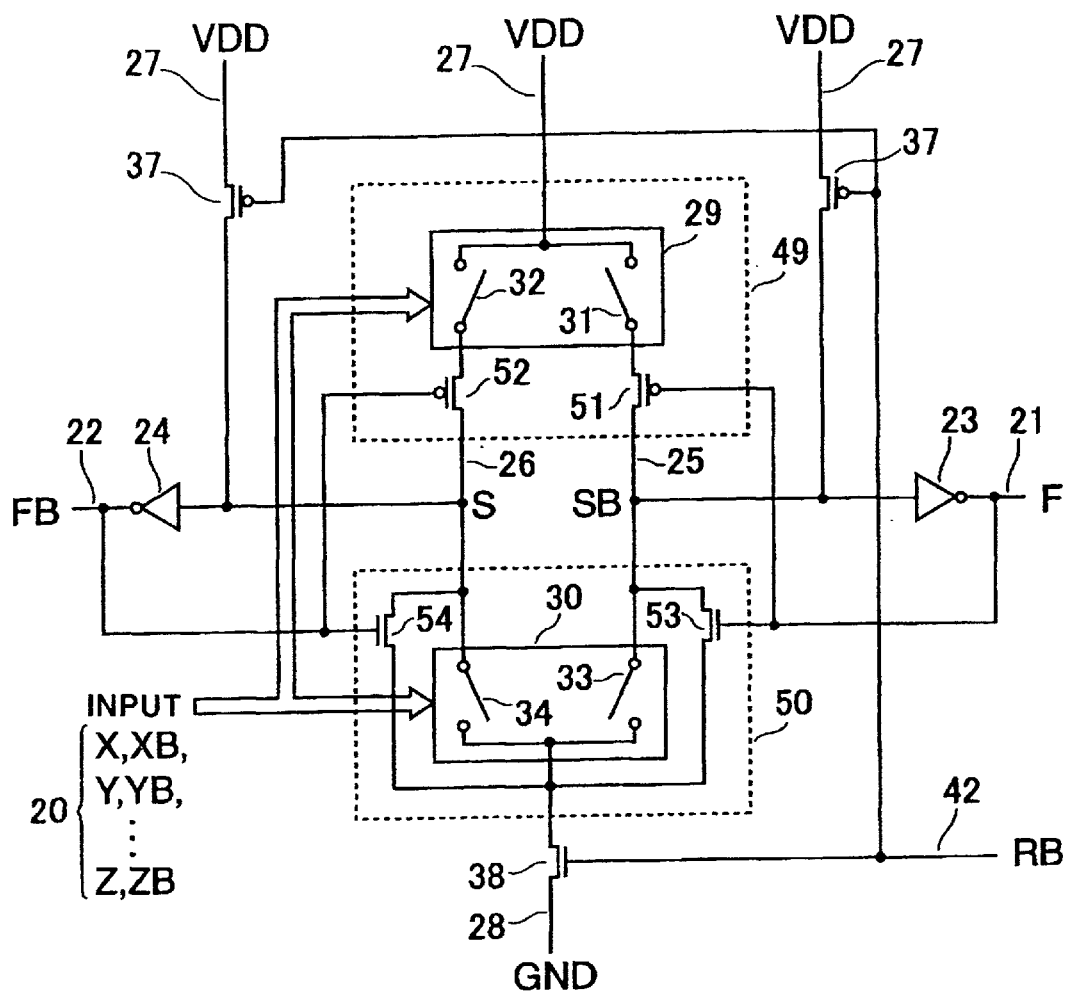
FIG. 32 is a circuit diagram of a basic logical gate showing a mode for carrying out the invention.
Figure 33:
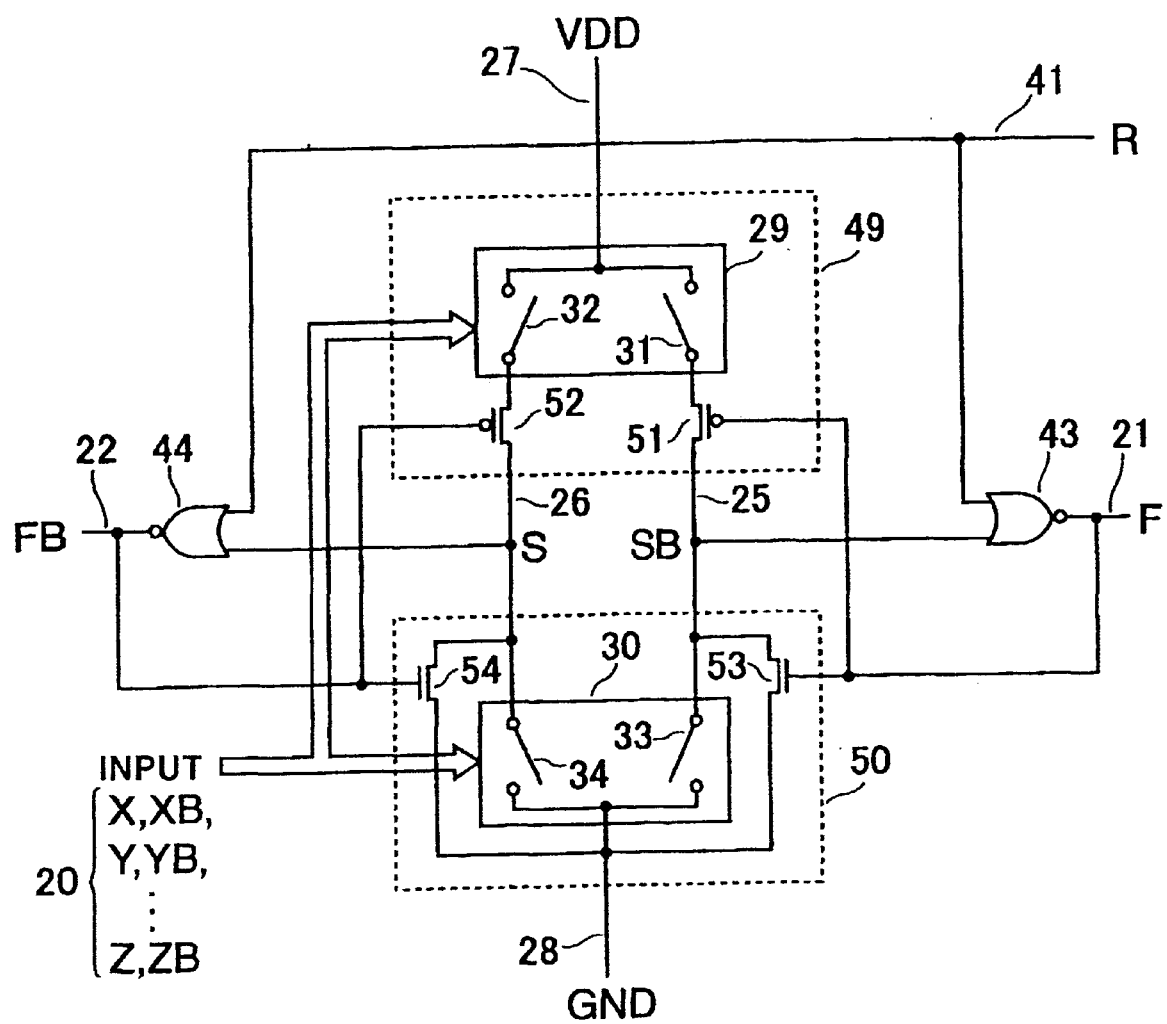
FIG. 33 is a circuit diagram of a basic logical gate showing a mode for carrying out the invention.

Next, the mode for carrying out the invention corresponding to claim 13 will be described with reference to FIGS. 32 and 33. The mode shown in FIGS. 32 and 33 provide one more detailed constitution of the mode for carrying out the invention corresponding to claim 12. FIG. 32 expands FIG. 24 showing the mode for carrying out the invention corresponding to claim 9. FIG. 33 expands FIG. 27 showing the mode for carrying out the invention corresponding to claim 10. Namely, a PMOS transistor 51 for cutting off the one signal path 31 of the PMOS network 29, a PMOS transistor 52 for cutting off the other signal path 32 of the PMOS network 29, an NMOS transistor 53 for short-circuiting the one signal path 33 of the NMOS network 30 and an NMOS transistor 54 for short-circuiting the other signal path 34 of the NMOS network 30 are provided. Further, connection for feeding back a signal from one input 21 to gate inputs of the PMOS transistor 51 and the NMOS transistor 53, respectively, is established, and connection for feeding back a signal from the other output 22 to gate inputs of the PMOS transistor 52 and the NMOS transistor 54, respectively, is established. By doing so, the means for allowing the same effective values to be held as before without outputting the halt value to the one pair of signal lines 21 and 22 as the output even after the value of not less than one pair of the not less than one pair of the signal lines 20 as the inputs changes to the halt value if the effective value is outputted to the one pair of signal lines 21 and 22 as the output, is constituted.

Next, the mode for carrying out the invention corresponding to claim 14 will be described. Claim 14 provides the input section of the logical circuit with a register feature by arranging the circuit block having the reset basic logical gates each having the holding feature according to claim 12 or 13 as constituent elements in the input section. The mode for carrying out the invention corresponding to claim 14 provides elements for constituting the means corresponding to claim 15.

Figure 34:
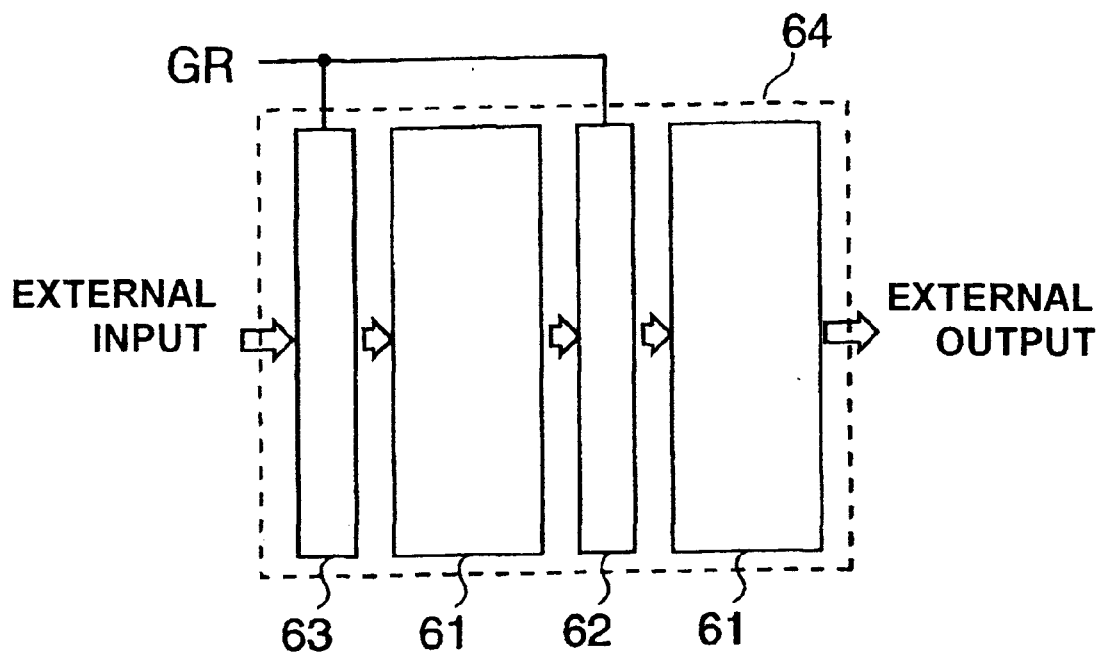
FIG. 34 is a constructional diagram of a logical circuit showing a mode for carrying out the invention.

The mode for carrying out the invention corresponding to claim 14 is shown in FIG. 34. Namely, the reset basic logical gate block 62 connected to the external input in the logical circuit according to claim 11 shown in FIG. 28 is replaced by the reset basic logical gate circuit block 63 having a holding feature. Here, the reset basic logical gate circuit block 63 having the holding feature is constituted out of a plurality of the reset basic logical gates each having the holding feature according to claim 12 or 13 and each having the reset input R(51) or reset input RB(42) so as to realize a specific logical feature, and also includes a common reset input mutually connecting the reset inputs R(41) or RB(42) of all the plural reset basic logical gates each having the holding feature.

Figure 35:
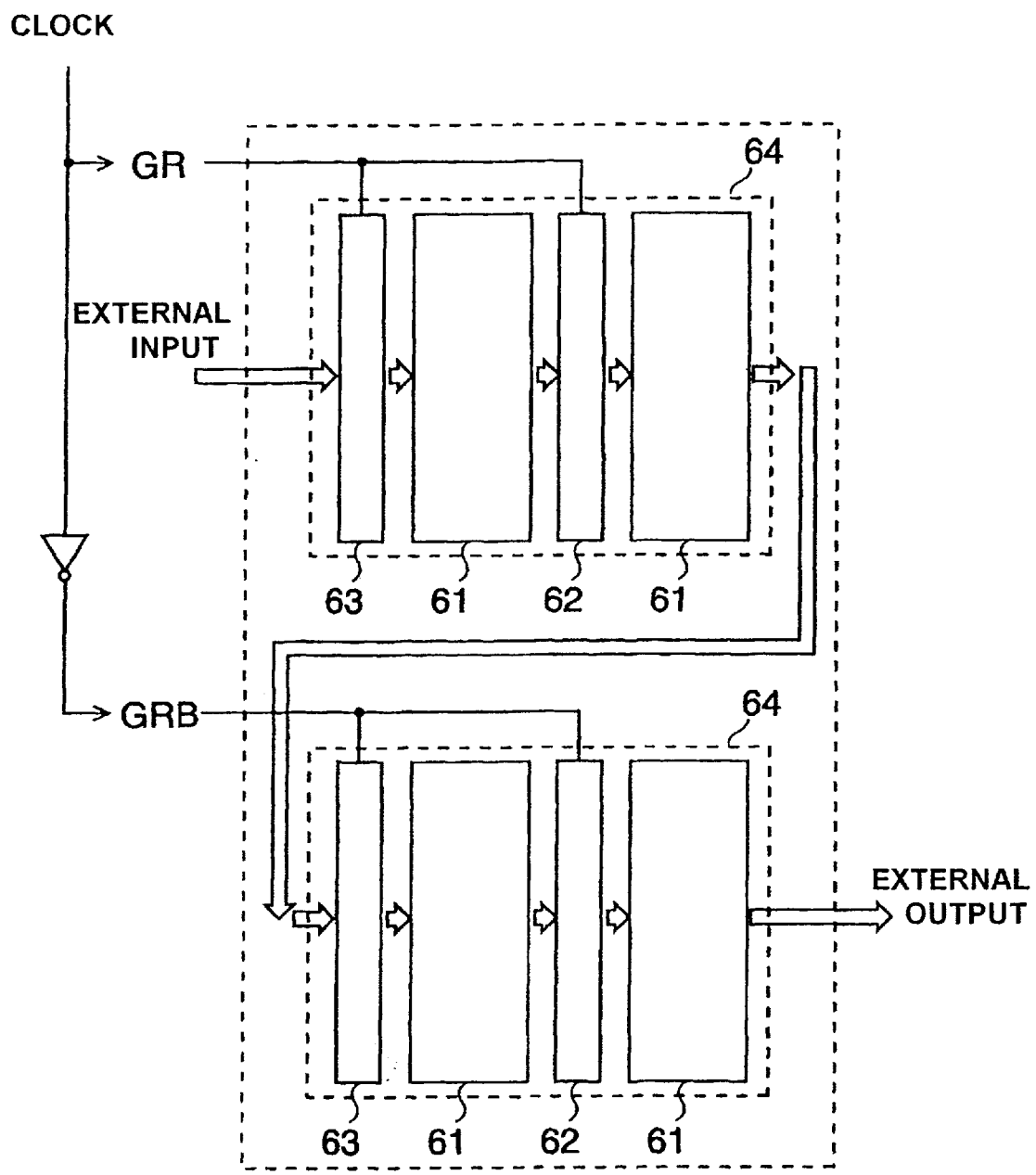
FIG. 35 is a constructional diagram of a logical circuit showing a mode for carrying out the invention.

Next, the mode for carrying out the invention corresponding to claim 15 will be described with reference to FIG. 35. In this mode for carrying out the invention, the first logical circuit block 64 according to claim 14 shown in FIG. 34 and the second logical circuit block 64 according to claim 14 are provided. An output of the first logical circuit block is set as an input of the second logical circuit, an external input is applied to the first logical circuit block, and an output of the second logical circuit block is set as an external output. Here, clock signals opposite in phase are applied to a common reset signal GR to the first logical circuit block and to a common reset signal GRB to the second logical circuit block, respectively.

Description will be given to how to conceal the halt value propagation time behind the effective value propagation time and to shorten the circuit repetition operation cycle.

First, consider a case where the common reset signal GR in the first logical circuit block, i.e., the first half section (connected to the external input) of the logical circuit is at the H-level and the common reset signal CRB in the second logical block, i.e., the second half section (connected to the external output) of the logical circuit is at the L-level. Here, it is assumed that if the common reset signals GR and GRB are at the H-level, the outputs of the reset basic logical gate circuit block 63 having the holding feature and the reset basic logical gate circuit block 62, into which blocks the common reset signals GR is inputted, respectively, are forced to become the halt values. If so, the reset signal GR is at the H-level in the first logical circuit block, i.e., the first half section of the logical circuit. Therefore, the halt values appear on the respective outputs of the reset basic logical gate circuit block 63 having the holding feature and the reset basic logical circuit block 62, into which blocks the common reset signal GR is inputted, respectively, and the halt value is propagated into the first logical circuit block, i.e., the first half section of the target logical circuit with those halt values set as starting points.

It is assumed that after the halt value has been entirely propagated into the first logical circuit block 64, the level of the common reset signal GR in the first logical circuit block changes to the L-level and the level of the common reset signal GRB in the second logical circuit block 64 changes to the H-level. It is also assumed that this change occurs because clock signals opposite in phase are applied to the GR and GRB, respectively. From this change on, since the reset signal GRB in the second logical circuit block, i.e., the second half of the target logical circuit is at the H-level, the halt value appears on the respective outputs of the reset basic logical gate circuit block 63 having the holding feature and the reset basic logical gate circuit block 62, into which the common reset signal GR is inputted, respectively, and the halt value is propagated into the second logical circuit block, i.e., the second half of the target circuit with those halt values as starting points. Simultaneously with the propagation, the effective value applied from the external input is propagated into the reset basic logical gate circuit block 63 having the holding feature closest to the external input, the basic logical gate circuit block 61, the reset basic logical gate circuit block 62 and then the basic logical gate circuit block 61 in this order in the first logical circuit block, i.e., the first half section of the target logical circuit. Finally, it is assumed that after the effective value arrives at the entry of the second logical circuit block and the halt value has been entirely propagated into the second logical circuit block, clocks change again.

In this case, the effective value is propagated into the second logical circuit block and the effective value finally arrives at the external output while the halt value is propagated into the first logical circuit block. Since the propagation of the halt value is accelerated by the constitution shown in FIGS. 28 and 29 and corresponding to claim 11, the halt value can early arrive at the entry of the second logical circuit block. However, the function of the reset logical circuit block 63 having the holding feature prevents the propagation of the halt value and holds the effective value. As can be seen, in the mode for carrying out the invention corresponding to claim 15, it is almost possible to conceal the halt value propagation time behind the effective value propagation time and to shorten a cycle for repeatedly operating the target logical circuit to be as close as the effective value propagation time.

EMBODIMENTS OF THE INVENTION

Figure 13:
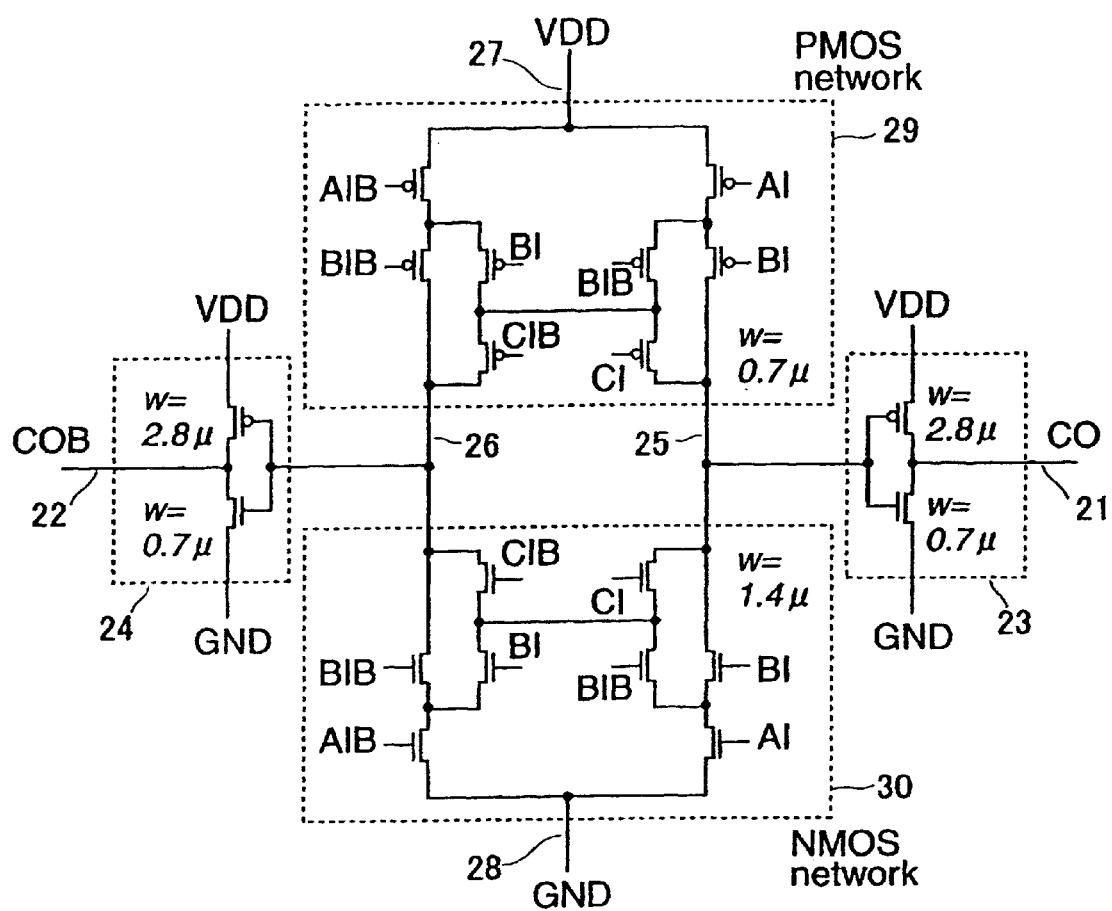
FIG. 13 is a circuit diagram of a basic logical gate showing a mode for carrying out the invention.
Figure 36:
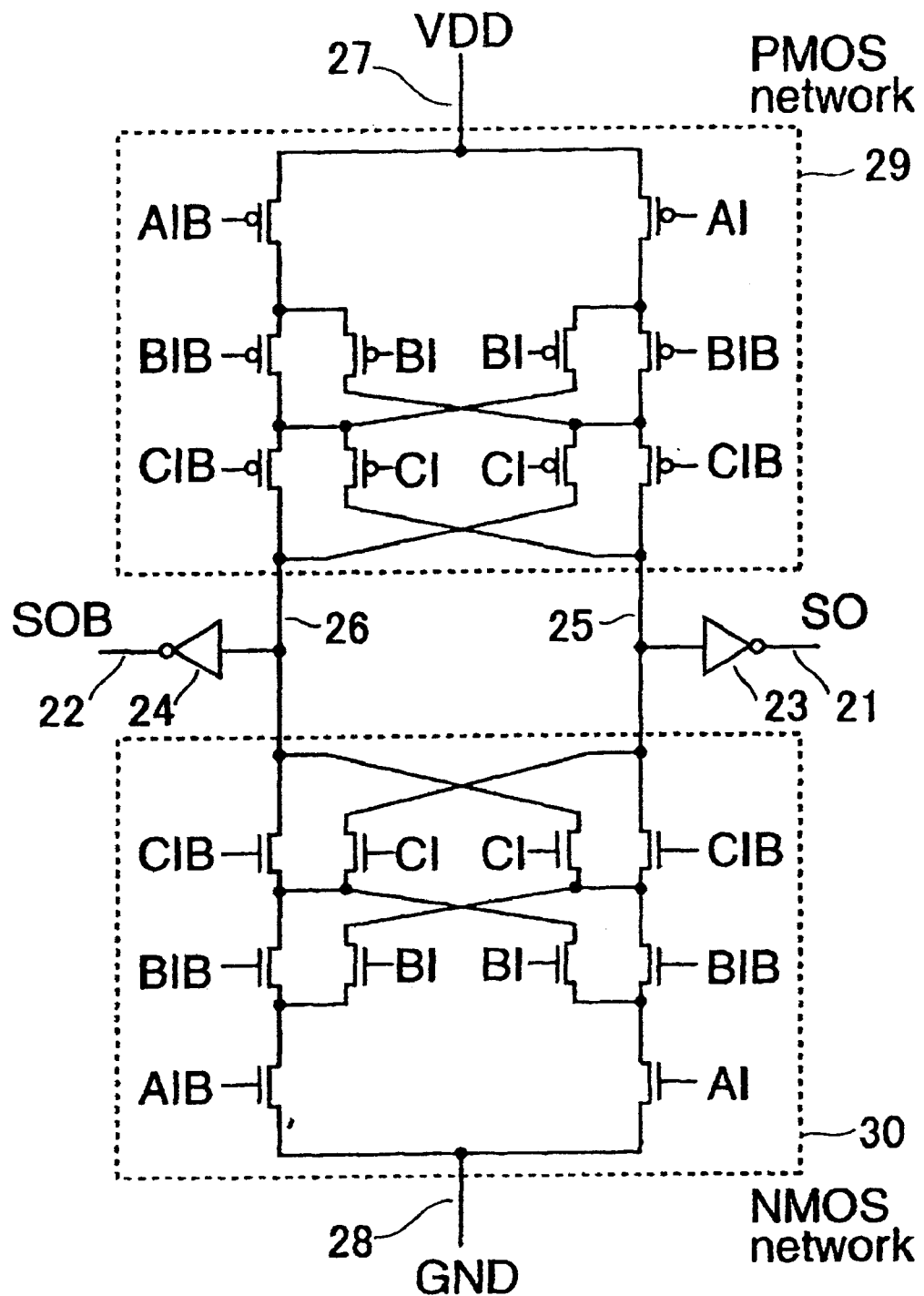
FIG. 36 is a circuit diagram of a basic logical gate showing a mode for carrying out the invention.

FIGS. 13 and 36 show embodiments corresponding to claims 1 to 5 and show the basic logical gates each constituted as the static circuit or the ASD-CMOS circuit. FIG. 13 shows the basic logical gate generating a carry output CO in a full adder shown in FIG. 37. FIG. 36 shows the basic logical gate generating a sum output SO in the full adder shown in FIG. 37. Both of FIGS. 13 and 36 embody the interiors of the PMOS network 29 and the NMOS network 30 in the basic logical gates shown in FIGS. 12 and 14 to 17. Common plural pairs of signal lines 20 are used as inputs in FIGS. 13 and 36 and denoted by AI and AIB, BI and BIB, CI and CIB, respectively. If all of these signal pairs have the halt values, i.e., the GND potentials, the input lines 25 and 26 of the respective output inverters 23 and 24 have the VDD potentials, respectively and one pair of signal lines 21 and 22 as the outputs has the halt value, i.e., GND potential. Next, if the signal values of all the inputs change to the effective values, the potential of one of the input lines 25 and 26 of the respective output inverters 23 and 24 changes from the VDD potential to the GND potential and the effective value is outputted to the one pair of signal lines 21 and 22 as the output. At this moment, the gate width w of each PMOS transistor included in the PMOS network 29 is 0.7 micrometers, which width is smaller than a standard value. The current driving capability of the PMOS transistor is, therefore, low. The gate width w of each NMOS transistor included in the NMOS network 30 is 1.4 micrometers, which width is almost equal to the standard value. It is, therefore, possible to ensure that the NMOS network 30 has a sufficient current driving capability. Accordingly, the change of the voltage values on the input lines 25 and 26 of the respective output inverters 23 and 24 is faster if the voltage falls from the VDD potential to the GND potential and slower if the voltage rises from GND potential to the VDD potential. On the other hand, the gate width w of each PMOS transistor included in the output inverters 23 and 24 is 2.8 micrometers, which width is sufficiently larger than the standard value, thereby ensuring that the PMOS transistor has a high current driving capability. The gate width w of each NMOS transistor included in the output inverters 23 and 24 is 0.7 micrometers, which width is smaller than the standard value. The current driving capability of the NMOS transistor is, therefore, low. Accordingly, the change of the voltage value on the pair of signal lines 21 and 22 as the output is faster if the voltage rises from the GND to the VDD and slower if the voltage falls from the VDD to the GND. The change of voltage value when all the inputs have the effective values and the pair of signal lines 21 and 22 as the output has the effective value, exactly corresponds to the faster change of the voltage value stated above. The basic logical gate in this embodiment, therefore, has short delay time generated when the output changes from the halt value to the effective value and long delay time generated when the output changes from the effective value to the halt value. Due to these characteristics, the propagation of the effective value in the logical circuit constituted by the multistage-connection of a plurality of basic logical gates is faster in speed than the conventional CMOS logical circuit, thereby realizing the high-speed operation of the circuit.

Figure 37:
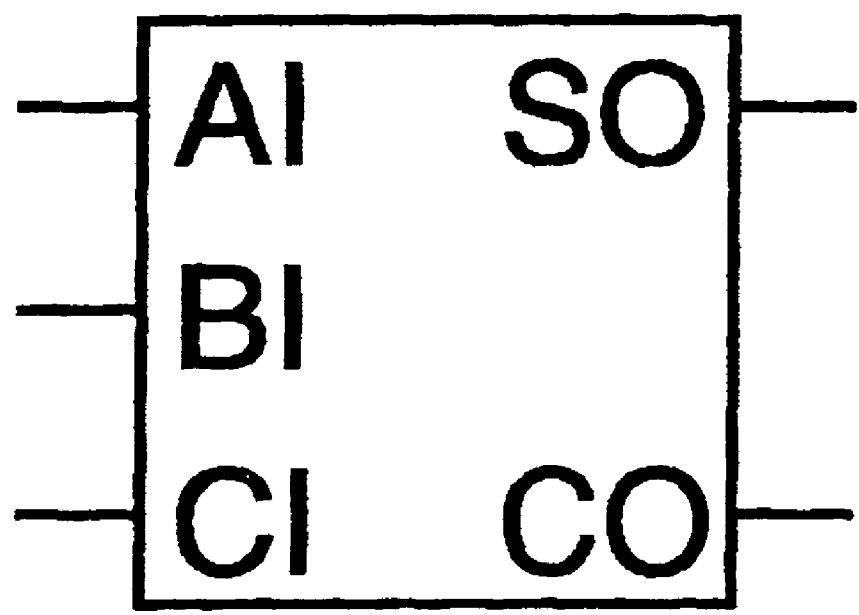
FIG. 37 is a symbol diagram of a logical gate showing the prior art.
Figure 38:
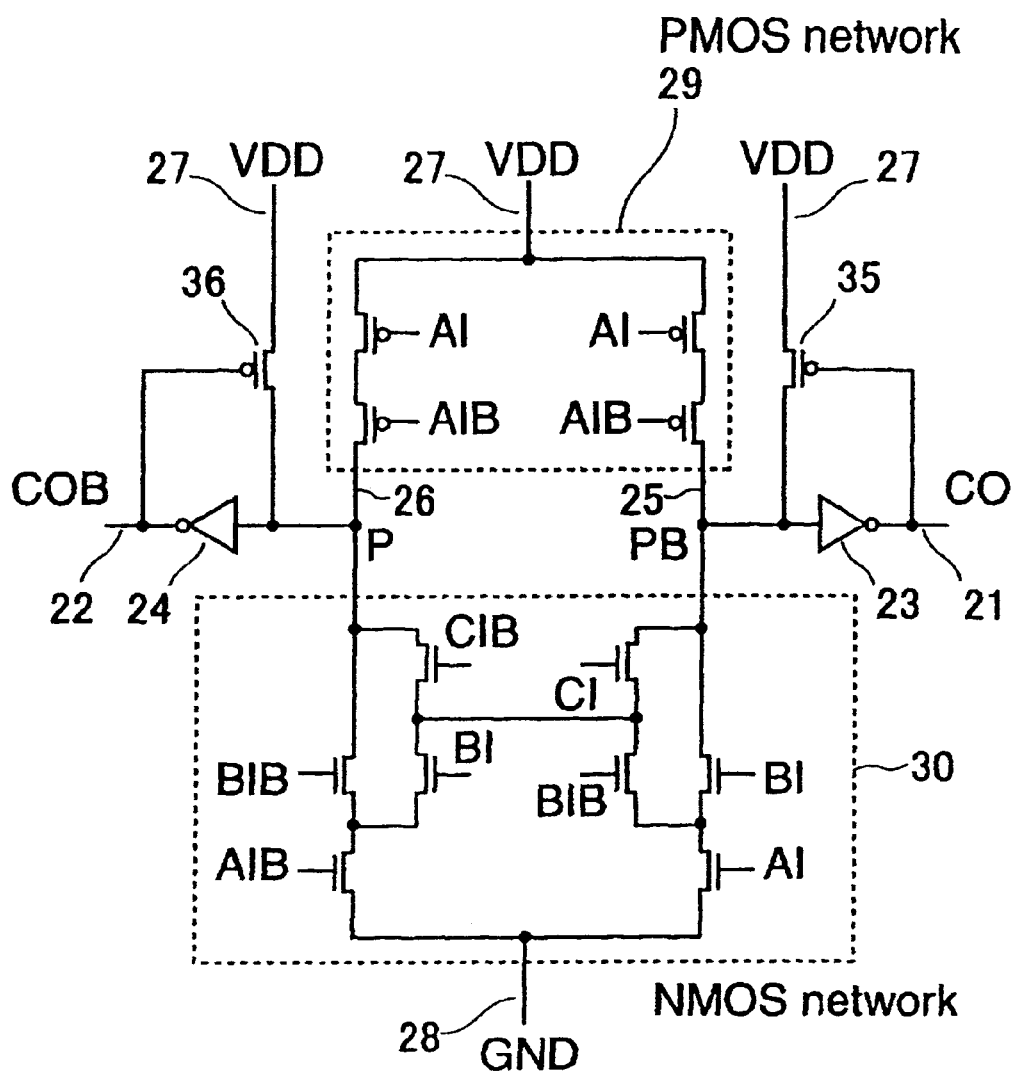
FIG. 38 is a circuit diagram of a basic logical gate showing a mode for carrying out the invention.
Figure 39:
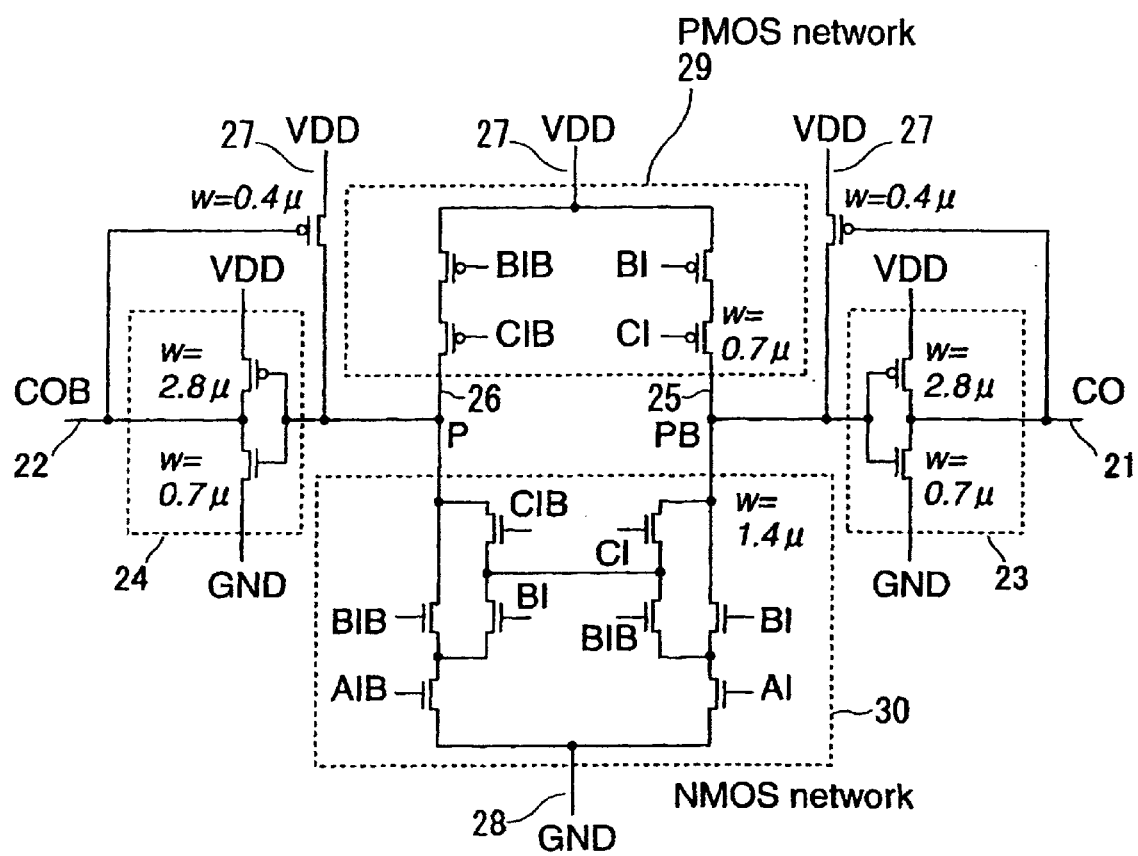
FIG. 39 is a circuit diagram of a basic logical gate showing a mode for carrying out the invention.
Figure 40:
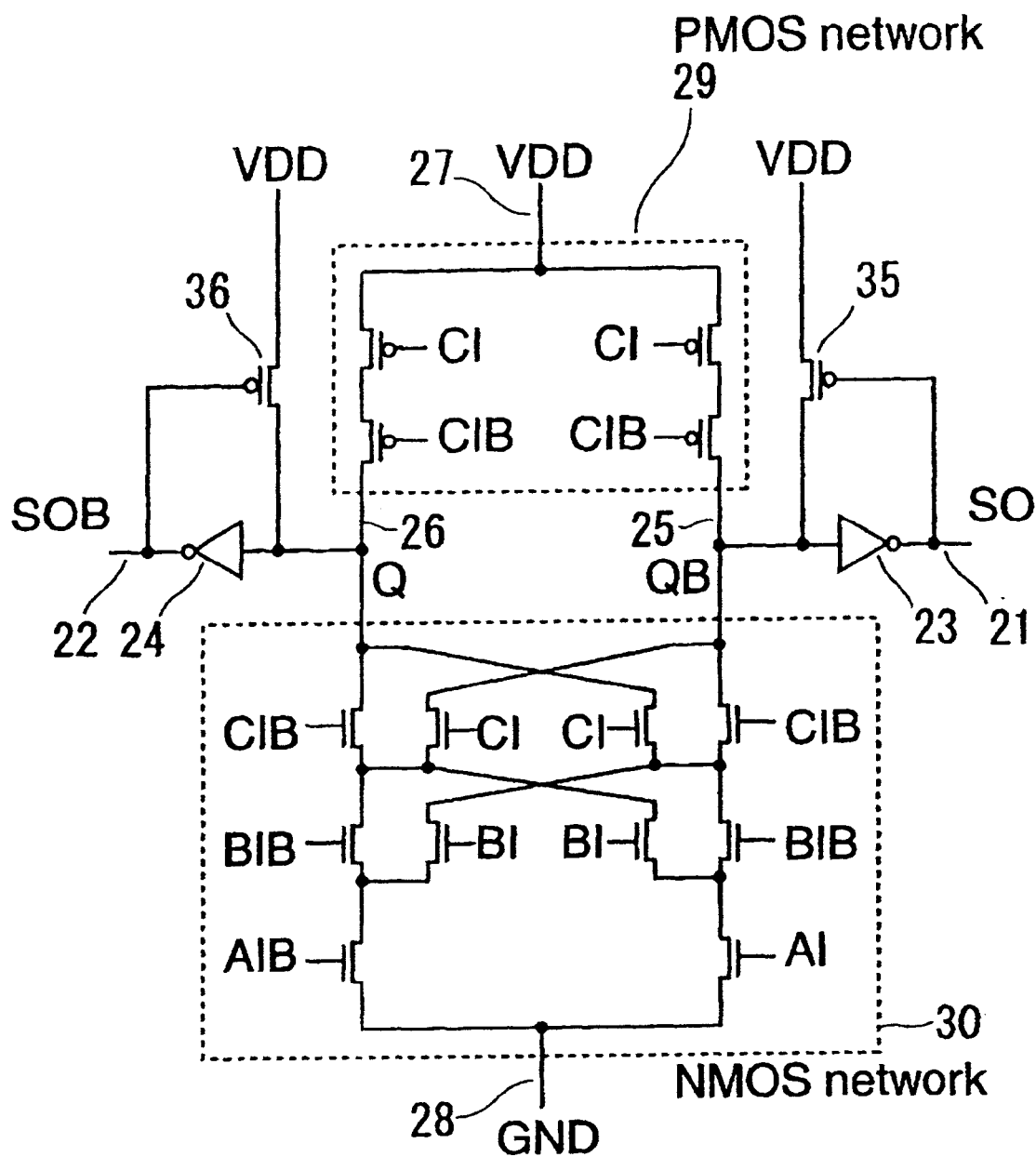
FIG. 40 is a circuit diagram of a basic logical gate showing a mode for carrying out the invention.

FIGS. 38 to 40 show embodiments corresponding to claims 1 to 4 and claims 6 and 7 and show basic logical gates each constituted as the dynamic circuit or the ADDL circuit. FIGS. 38 and 39 show the basic logical gate generating a carry output CO in the full adder shown in FIG. 37, and FIG. 40 shows the basic logical gate generating a sum output SO in the full adder shown in FIG. 37. Both of FIGS. 38 to 40 embody the interiors of the PMOS network 29 and the NMOS network 30 in each of the basic logical gates shown in FIGS. 25, 14 and 18 to 20. In addition, since this logical circuit is a dynamic circuit, a charge holding PMOS transistor 37 is provided. Common plural pairs of signal lines 20 as the inputs are used in FIGS. 13, 36 and 38 to 40 and denoted by AI and AIB, BI and BIB, CI and CIB, respectively. The operation of the logical circuit if all of the signal pairs have the halt values, i.e., GND potentials, and that if all the signal values thereof change to the effective value are the same as the basic operation of the ASD-CMOS circuit shown in FIGS. 13 and 36 and will not be, therefore, described herein. The basic logical gate constituted as the ASDDL circuit has short delay time generated when the output changes from the halt value to the effective value and long delay time generated when the output changes from the effective value to the halt value as in the case of the ASD-CMOS circuit. Due to these characteristics, the propagation of the effective value in the logical circuit constituted by the multistage-connection of a plurality of basic logical gates is faster in speed than the conventional CMOS logical circuit, thereby realizing the high-speed operation of the circuit. The circuits shown in FIGS. 38 and 39 are equal except for a method for designing the PMOS network 29.

Figure 41:
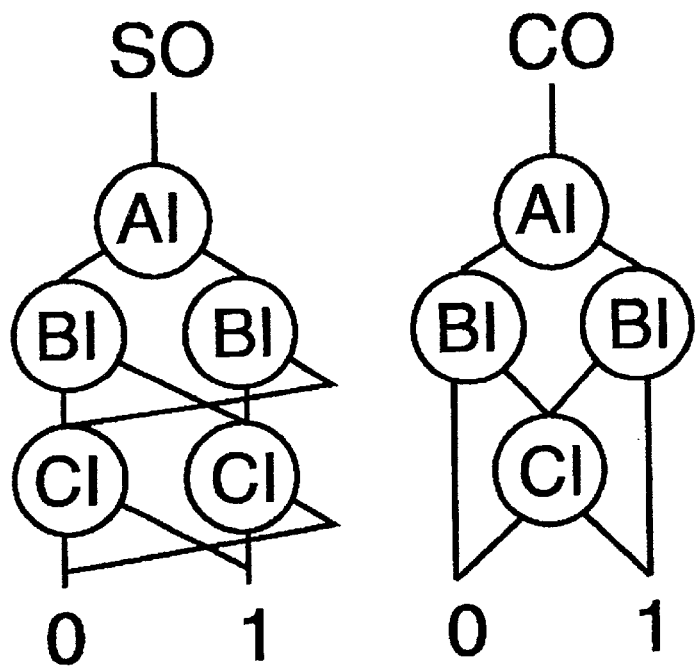
FIG. 41 is a graphic expression of a logical gate showing the prior art.
Figure 42:
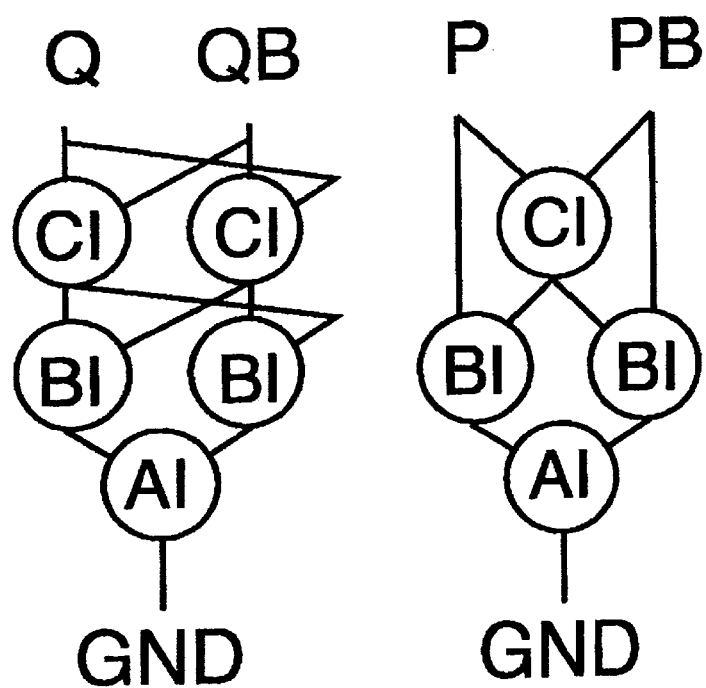
FIG. 42 is a graphic expression of a logical gate showing the objective function of the invention.
Figure 43:
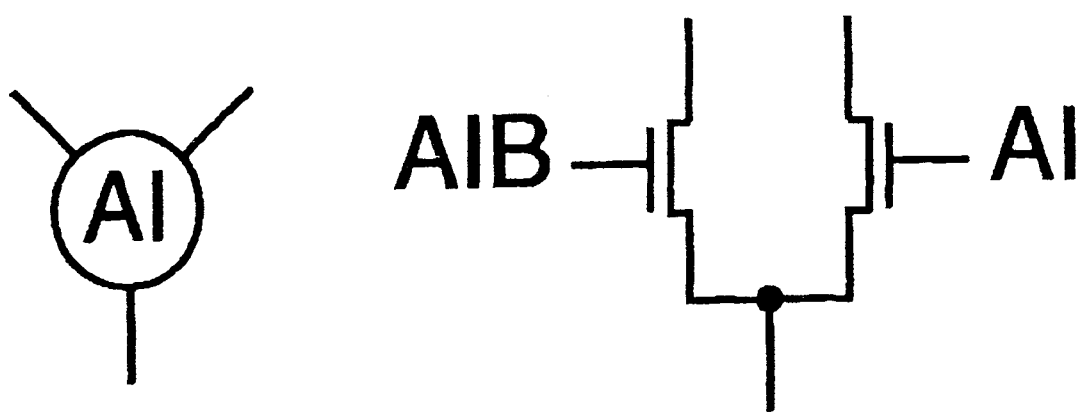
FIG. 43 is a graphic expression of a logical gate showing the prior art.

Among methods for designing the basic logical gates shown in FIGS. 13, 36 and 38 to 40, one method based on a BDD (binary decision diagram) will be described. A method for designing the NMOS network 30 is common to FIGS. 13, 36 and 38 to 40. First, a logical function, which the basic logical gate is to realize, is expressed by a BDD. FIG. 41 shows that logical circuits corresponding to the SO output and the CO output of the full adder are expressed by the BDD's. Next, as shown in FIG. 42, the BDD's are turned upside down. The respective nodes of each BDD are truly replaced by those in a circuit consisting of two MOS transistors as shown in FIG. 43. It is assumed that positive signals and negative signals in the name of logical variables added to the nodes of the BDD correspond to the gate inputs of the two MOS transistors. The circuit thus obtained may be used as the NMOS network. Namely, the circuit obtained from the left-side BDD show in FIG. 42 is equivalent to the NMOS network 30 shown in FIG. 40 and points Q, QB and GND shown in FIG. 42 correspond to the points having the same names in FIG. 40. In addition, the circuit obtained from the right-side BDD shown in FIG. 42 is equivalent to the NMOS network 30 shown in FIGS. 38 and 39.

The ASD-CMOS circuit shown in FIGS. 13 and 36 and the ASDDL circuit shown in FIGS. 38 to 40 differ in a method for designing the PMOS network 29. In case of the ASD-CMOS circuit, the method based on the BDD as in the case of the method for designing the NMOS network 30 is available. In the full adder, the BDD used for the PMOS network 29 has the same shape as that of the BDD used for the NMOS network 30 and the arrangement of PMOS transistors is symmetric with that of NMOS transistors. On the other hand, in case of the ASDDL circuit shown in FIGS. 38 to 40, the number of PMOS transistors required for the PMOS network 29 is smaller than that in the ASD-CMOS circuit. This is because the ASDDL circuit performs a dynamic operation. Normally, it suffices to provide four PMOS transistors for the PMOS network 29 irrespectively of a realized logical function. Logical variables to be inputted into those four PMOS transistors may be determined so as to satisfy the following conditions. If all the inputs have the halt values, the four PMOS transistors are made conductive so as to connect the input lines 25 and 26 of the respective output inverters 23 and 24 to the VDD. If effective values arrive at all the inputs, the PMOS transistors operate to always cut off the paths between the input lines 25 and 26 of the respective output inverters and the VDD, respectively. If the effective values and the halt values are mixed in the inputs, the four PMOS transistors may be conductive or cut off. In the example of designing the PMOS network 29 shown in FIG. 38, a logical variable inputted into the lowermost NMOS transistor is used in the PMOS network 29. Conversely, in the example shown in FIG. 39, a logical variable inputted into the uppermost NMOS transistor in the NMOS network 30 is used in the PMOS network 29. FIGS. 38 and 39 are the same functionally.

The ASD-CMOS circuit as the static circuit shown in FIGS. 13 and 36 and the ASDDL circuit as the dynamic circuit shown in FIGS. 38 to 40 have individual, different advantages. The ASDDL circuit is advantageous in that the number of PMOS transistors constituting the. PMOS network 29 is small, a chip area for mounting the LSI is small and cost can be reduced. On the other hand, however, the ASDDL circuit is disadvantageous in that the voltage levels of the input lines 25 and 26 of the respective output converters tend to become unstable while the circuit is performing a dynamic operation. This state is expressed by terminology "charge sharing". If the setting of the number of transistors to be connected and the setting of the gate width w are erroneously made, the circuit might malfunction. That is to say, the ASD-CMOS circuit as the static circuit is advantageous over the ASDDL circuit in that the circuit is excellent in stability and easy to design. The ASD-CMOS and ASDDL circuits may be used according to purposes.

Figure 1:
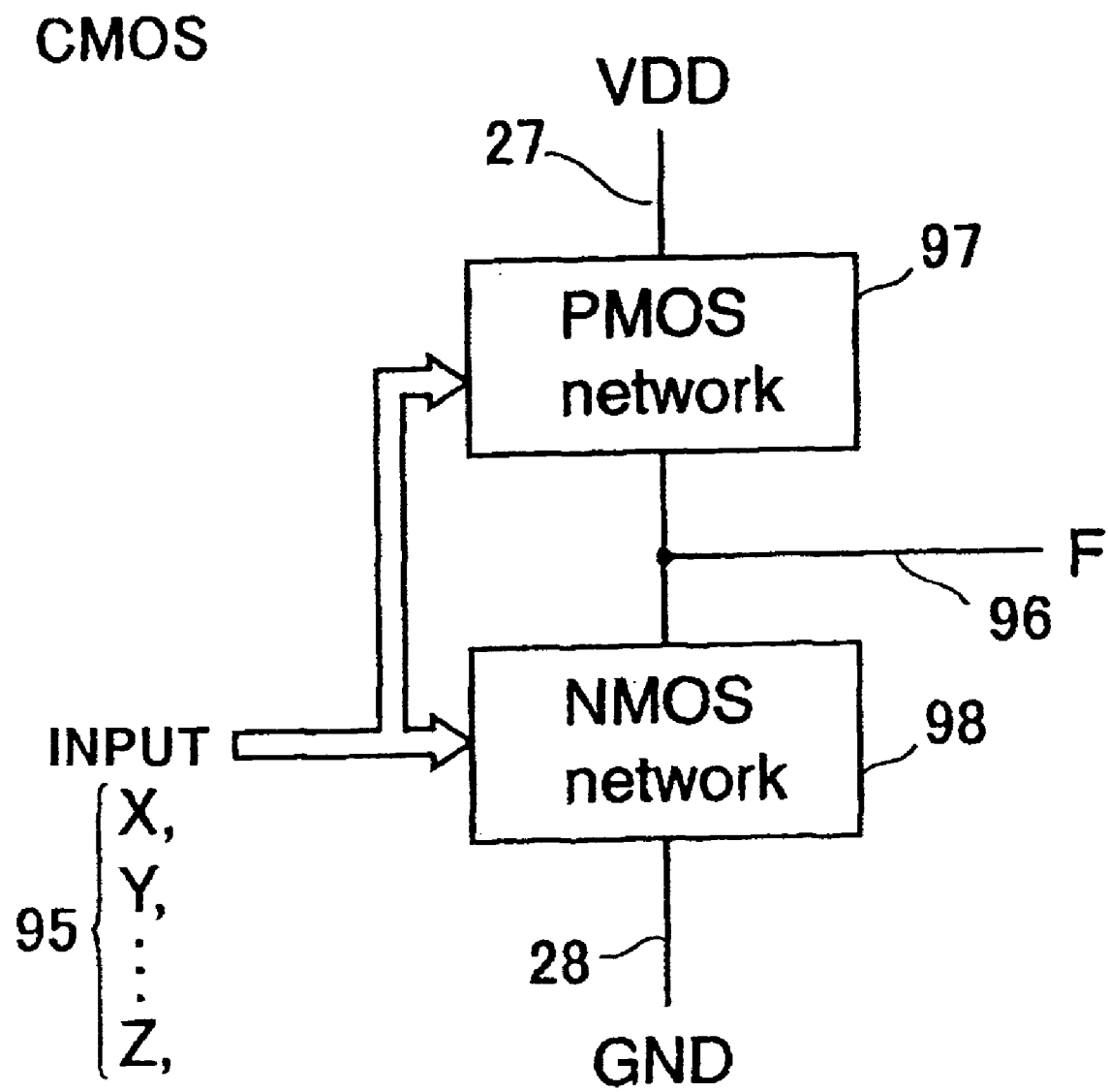
FIG. 1 is a circuit diagram of a logical gate showing the prior art.
Figure 2:
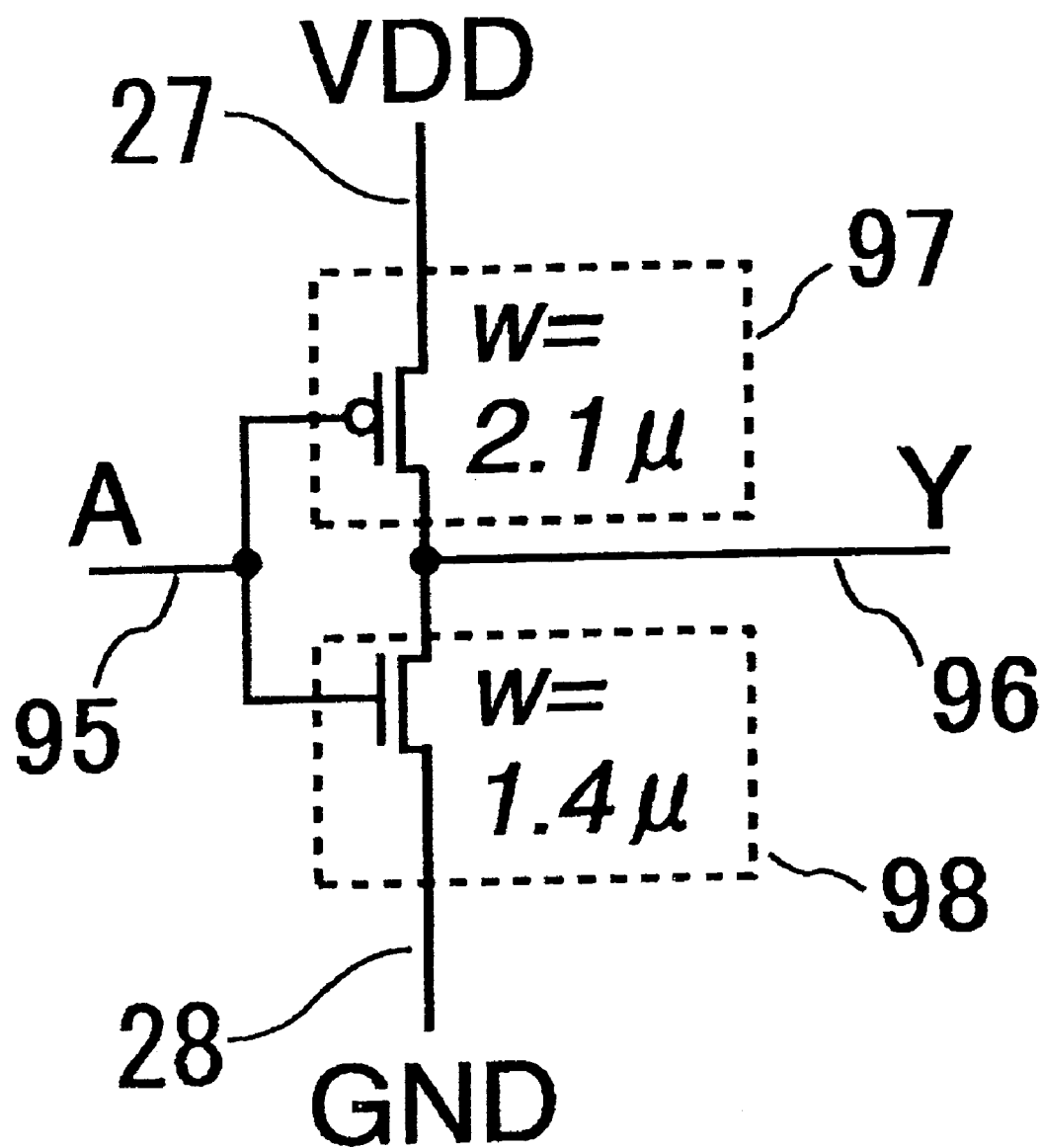
FIG. 2 is a circuit diagram of a logical gate showing the prior art.
Figure 3:
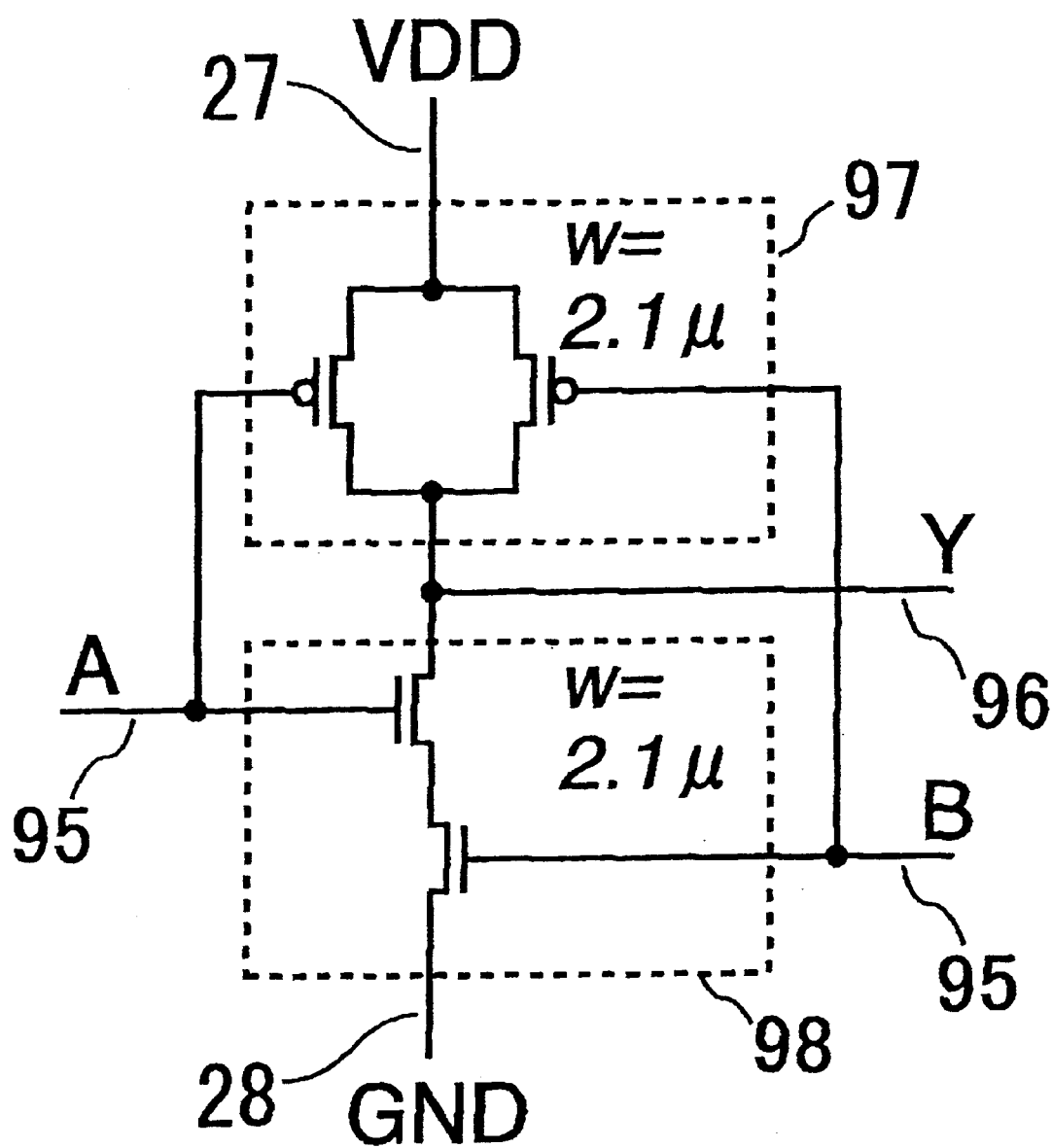
FIG. 3 is a circuit diagram of a logical gate showing the prior art.
Figure 4:
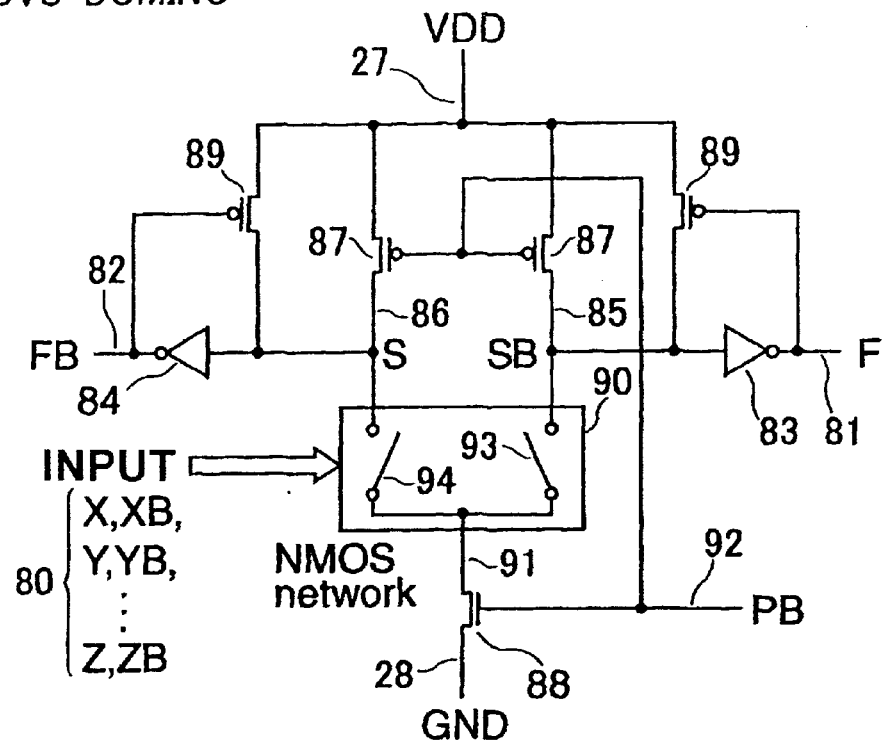
FIG. 4 is a circuit diagram of a logical gate showing the prior art.
Figure 5:
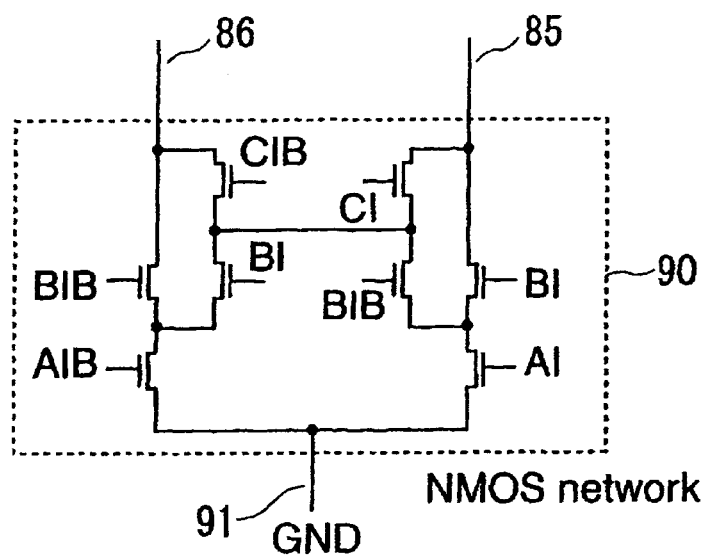
FIG. 5 is a circuit diagram of a logical gate showing the prior art.

Finally, the DCVS-DOMINO circuit classified as one of the circuits capable of operating at the highest speed among logical circuits which can be manufactured by the ordinary CMOS process is compared with the basic logical circuit according to the present invention so as to highlight the advantage of the present invention over the DCVS-DOMINO circuit. Since a clock signal, referred to as precharge input 92, is always necessary in the DCVS-DOMINO circuit shown in FIG. 6, the DCVS-DOMINO circuit has disadvantageously, considerably high power consumption so as to charge and discharge wirings for distributing this clock signal and to operate a clock buffer circuit. Since a clock signal is unnecessary in the basic logical circuit according to the present invention as typically shown in FIGS. 12 and 25, the basic logical circuit has advantageously low power consumption than that of the DCVS-DOMINO circuit. Further, as shown in FIG. 3, the NMOS network 88 is always inserted between the NMOS network 90 and the GND power source line, which disadvantageously lowers the current driving capability of the NMOS network 90. As is obvious from FIGS. 1 and 2, the NMOS network 30 is directly connected to the GND power source line in the basic logical gate according to the present invention, so that there is no factor for lowering the current driving capability of the NMOS network 30. As can be seen, the basic logical gate according to the present invention can operate at a higher speed than that of the DCVS-DOMINO circuit classified as one of the circuits which can operate at the highest speed among those manufactured by conventional techniques. Additionally, the method for designing the NMOS network 90 in the DCVS-DOMINO circuit is the same as the method for designing the NMOS network in the basic logical gate according to the present invention. This can be easily recognized if comparing, for example, the NMOS network 30 shown in FIG. 39 with the NMOS network 90 in the DCVS-DOMINO circuit shown in FIG. 8. Besides, the influence of the current driving capability of the NMOS network on the delay time generated when the effective value is outputted is obviously recognized from the description given so far.

Figure 44:
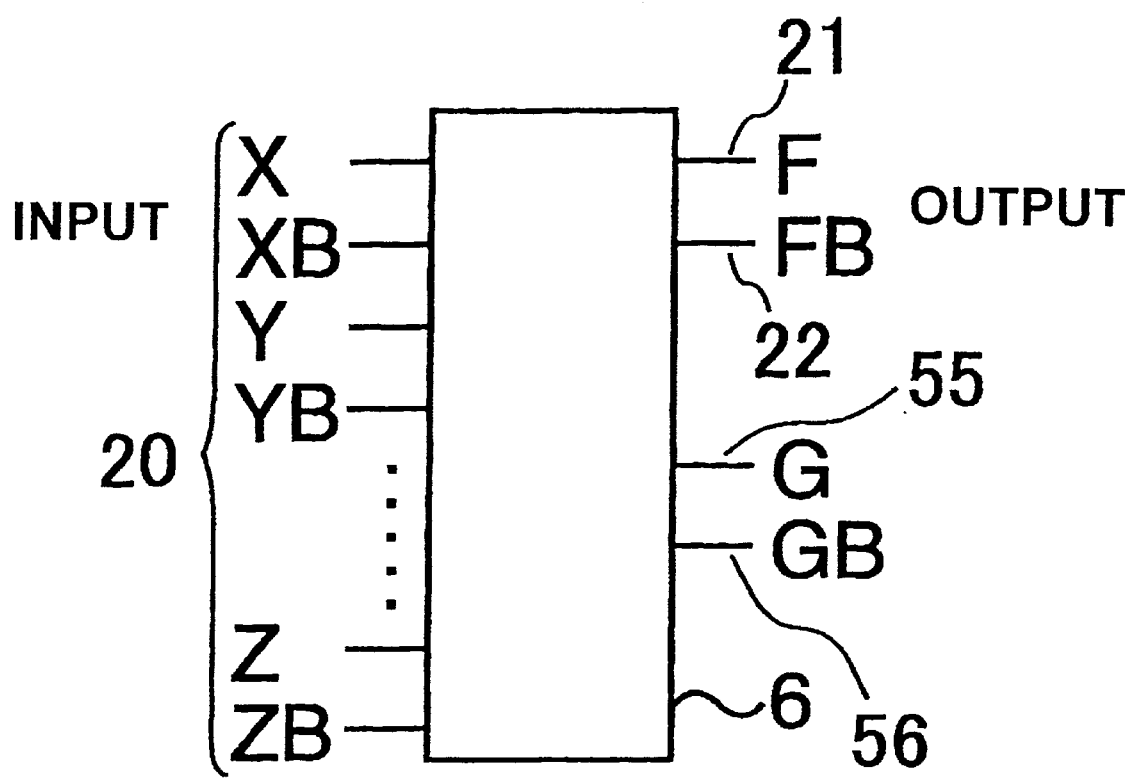
FIG. 44 is a constructional diagram of a complex logical gate showing an embodiment of the invention.
Figure 45:
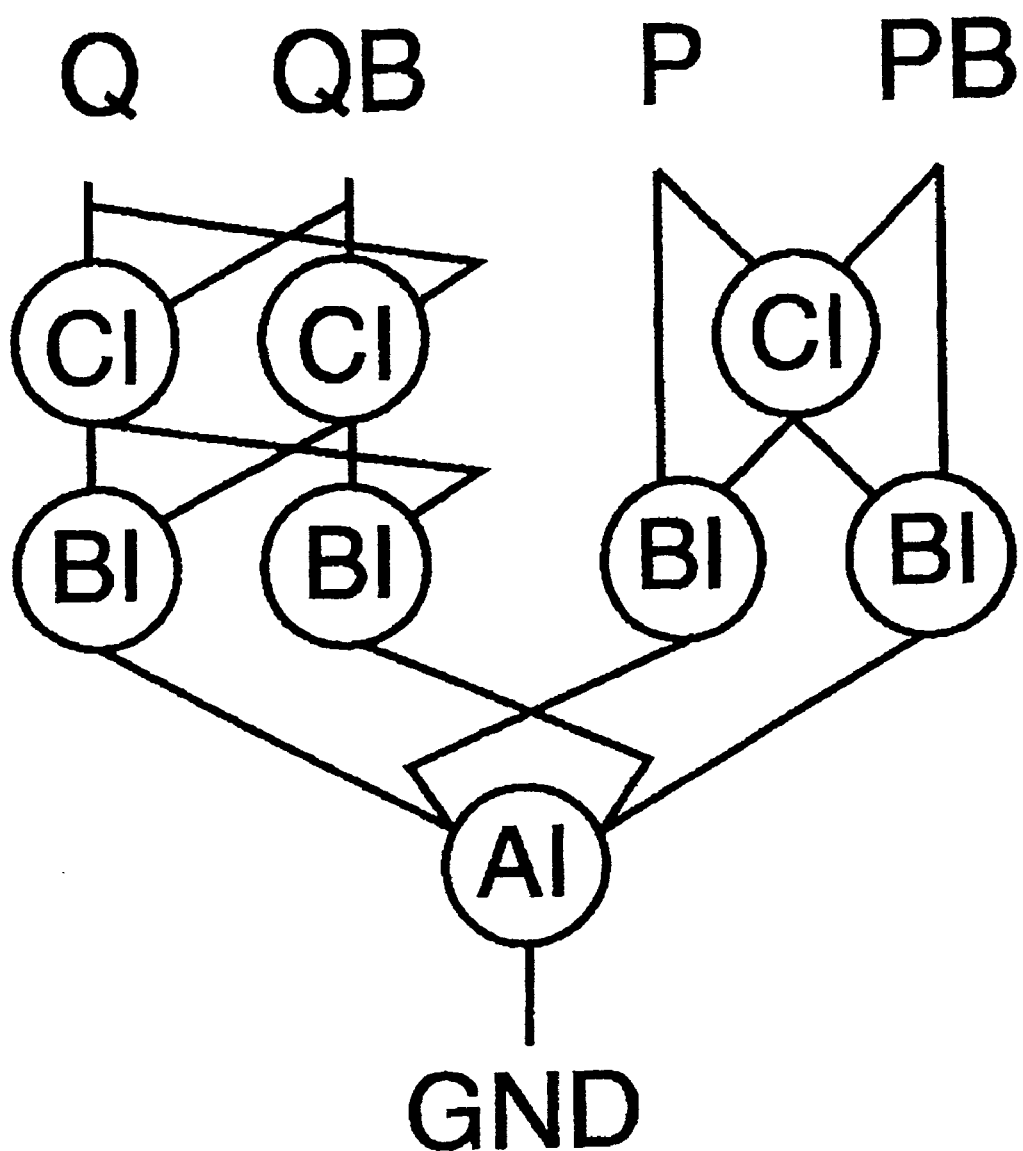
FIG. 45 is a graphic expression of a logical gate showing the objective function of the invention.
Figure 46:
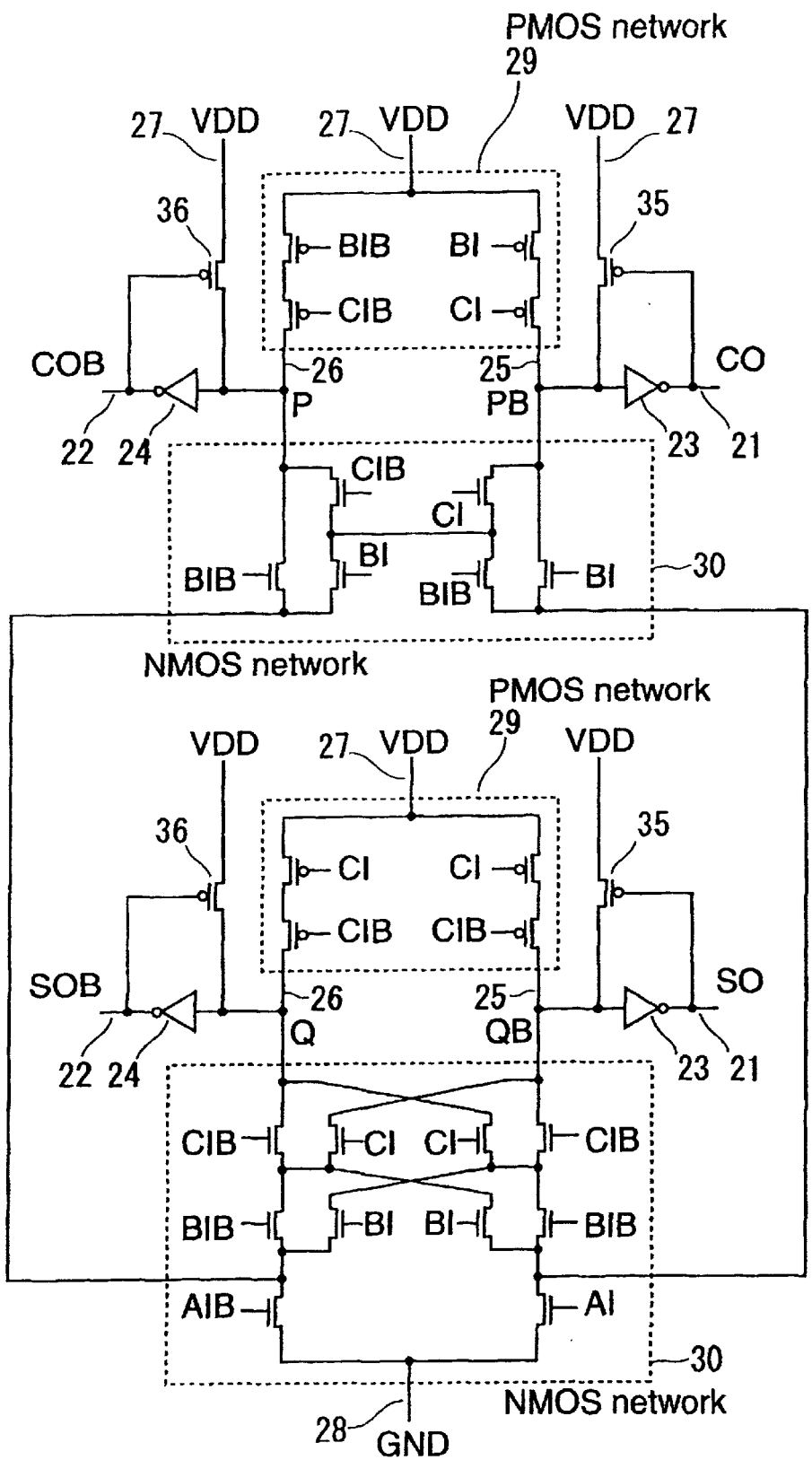
FIG. 46 is a constructional circuit diagram of a complex logical gate showing an embodiment of the invention.
Figure 47:
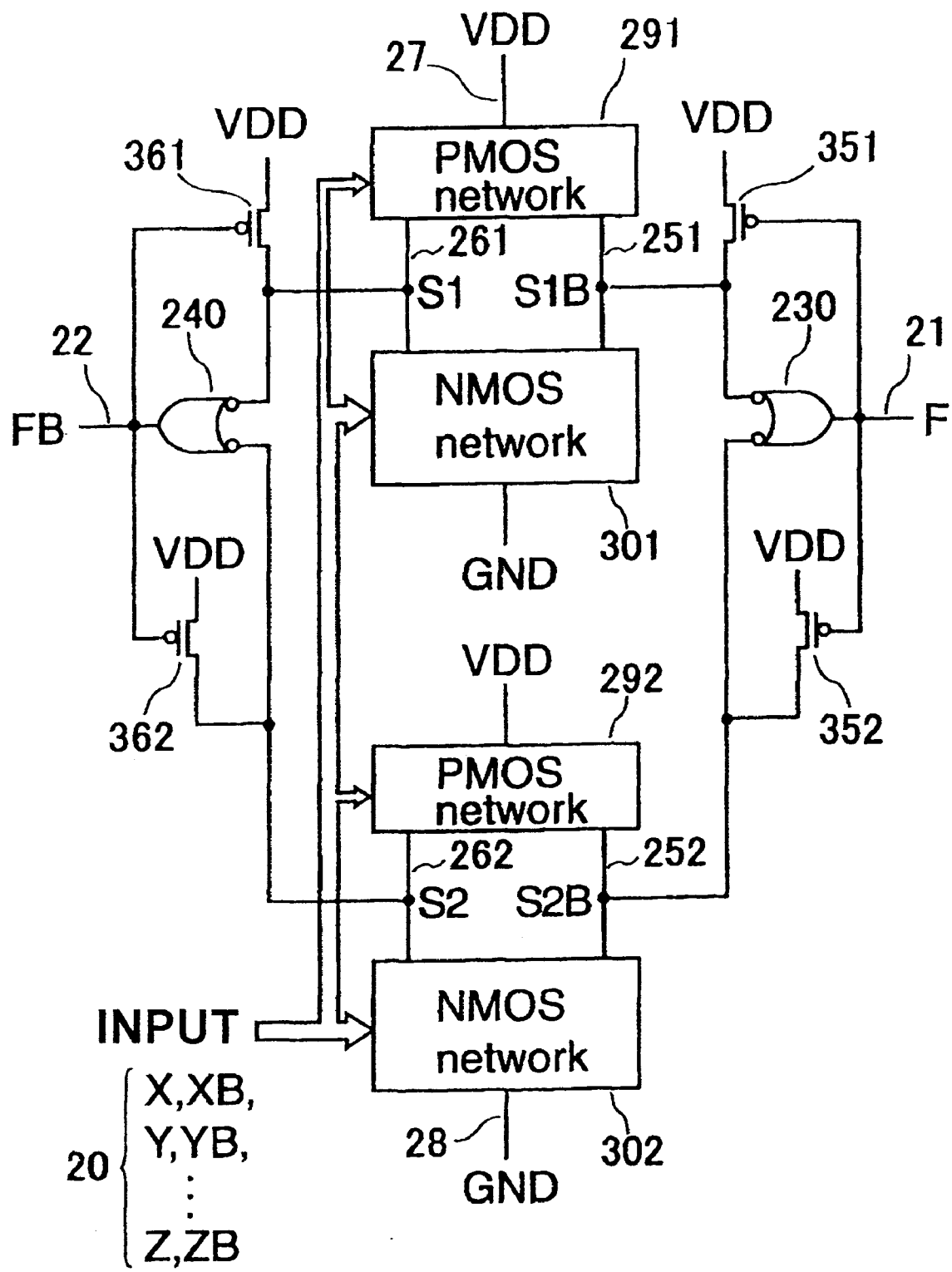
FIG. 47 is a constructional circuit diagram of a complex logical gate showing an embodiment of the invention.

Finally, as one expanded embodiment, a complex logical gate shown in FIGS. 44 to 46 will be described. A complex logical gate 6 has the first pair of signal lines 21 and 22 as outputs and the second pair of signal lines 55 and 56 as inputs and has a structure in which a part of the circuit sections is shared between two basic logical gates 1. FIG. 46 shows a structure in which a part of the transistors in the NMOS network are shared between the basic logical gate generating an SO output in the full adder shown in FIG. 40 and the basic logical gate generating the CO output in the full adder shown in FIG. 39. The complex logical gate shown in FIG. 46 can be generated based on a BDD shown in FIG. 45. Since the two transistors have a small share between them in the example of FIG. 46, the advantage of the complex basic logical gate in that the circuit scale can be made small is less noticeable. There is a probability that a larger circuit section can be shared between the transistors depending on a target circuit. FIG. 47 shows an example of the complex logical gate of a different type having a structure in which two basic logical gates are combined in output sections. A NAND gate and a NOR gate are used as gates 230 and 240 in the output sections, respectively. By adopting the above-stated division in a case where a circuit, if constituted as a single basic logical gate, becomes too large in scale, the circuit becomes small in scale and the performance of the circuit enhances depending on a logical function.

The present invention can advantageously accelerate the operating speed of a logical circuit and reduce power consumption thereof. Further, the present invention can advantageously realize a logical circuit faster in speed and lower in power consumption than the DCVS-DOMINO circuit classified as one of the circuits capable of performing the highest-speed operation among logical circuits which can be manufactured by the CMOS process. Moreover, the present invention can advantageously reduce the power consumption of LSI requiring a high-speed operation, thereby advantageously decreasing the heat generation of the LSI, making an inexpensive package available for the circuit and reducing LSI production cost.

What is claimed is:
1. A logical circuit using a pair of signal lines different from power source lines for propagating a logical value, the pair of signal lines using an effective value and a halt value as signal values, the signal lines in the pair having mutually exclusive signal values if the signal value of the pair is the effective value and having an equal signal value if the signal value of the pair is the halt value, the signal value of said pair of signal lines changing from the halt value to the effective value and returning again from the effective value to the halt value if the one logical value is propagated, wherein a basic logical gate realizing a feature of a logical function has not less than one pair of signal lines (20) as inputs and one pair of signal lines (21, 22) as outputs the basic logical gate outputs the halt value if the halt value is included in the inputs and outputs the effective value according to the feature of the logical function if all the inputs of the basic logical gate have the effective values and delay time generated until the signal values of the outputs change according to changes of the signal values of the inputs in the logical gate is constituted asymmetrically so that the delay time generated when the output of the basic logical gate changes from the halt value to the effective value is short and the delay time generated when the output of the basic logical gate changes from the effective value to the halt value is long.

2. A logical circuit according to claim 1, wherein
the logical circuit comprises two output inverters (23, 24) having, as respective outputs, the one pair of signal lines (21, 22) as the outputs a PMOS network (29) connected to the not less than one pair of signal lines (20) as the inputs, to input lines (25, 26) of said two output inverters (23, 24), respectively, and to a VDD power source line (27) and an NMOS network (30) connected to the not less than one pair of signal lines (20) as the inputs and to a GND power source line (28), the PMOS network (29) constituted by mutually connecting a plurality of PMOS transistors, the NMOS network (30) constituted by mutually connecting a plurality of NMOS transistors.

3. A logical circuit according to claim 2, wherein
it is assumed that if both of the two signal lines included in a pair of signal lines have a voltage level L, the voltage level L being a GND potential, the signal line pair has the halt value,
a current driving capability of the NMOS network (30) for driving the input lines (25, 26) of the respective output inverters is set to be higher than a current driving capability of the PMOS network (29) for driving the input lines (25, 26) of the respective output inverters, and a current driving capability of a PMOS transistor included in the output inverters (23, 24) is set to be higher than a current driving capability of an NMOS transistor included in the output inverters (23, 24), thereby allowing the delay time generated until the signal values of the outputs change according to the changes of the signal values of the inputs to be constituted so that the delay time generated when the output of the basic logical gate changes from the halt value to the effective value is short and the delay time generated when the output of the basic logical gate changes from the effective value to the halt value is long.

4. A logical circuit according to claim 3, wherein
a difference in a magnitude of the current driving capability is realized by changing a gate width w of each of the PMOS transistors and the NMOS transistors.

5. A logical circuit according to claim 3, comprising means, having a reset input (41 or 42), for forcing the value of the one pair of signal lines (21, 22) as the output to become the halt value irrespectively of the values of the not less than one pair of signal lines (20) as the inputs if the reset input receives an effective input, wherein
the means for forcing the value of the one pair of signal lines (21, 22) as the output to become the halt value is constituted by providing a PMOS transistor (37) for making the input lines (25, 26) of the respective output inverters and the VDD power source line (27) conductive, an NMOS transistor (38) for cutting off the signal paths between the input lines (25, 26) of the respective output inverters and the GND power source line (28), respectively, and by connecting the reset input (42) to gate inputs of the PMOS transistor (37) and the NMOS transistor (38), respectively.

6. A logical circuit according to claim 3 comprising means, having a reset input (41 or 42), for forcing the values of the one pair of signal lines (21, 22) as the outputs to become the halt values if the reset input receives an effective input, irrespectively of the values of the not less than one pair of signal lines (20) as the input, wherein
the means for forcing the value of the one pair of signal lines (21, 22) as the output to become the halt value is constituted by replacing the two output inverters (23, 24) by two 2-input NOR gates (43, 44), respectively, by setting a current driving capability of a PMOS transistor included in each of the 2-input NOR gates (23, 24) to be higher than a current driving capability of an NMOS transistor included in each of the 2-input NOR gates (23, 24), by connecting a first input of the 2-input NOR gate (43) replacing the one output inverter (23) to the input line (25) of the one output inverter before being replaced and a second input of the 2-input NOR gate (43) to the reset input (41), and by connecting a first input of the other 2-input NOR gate (44) to the input line (26) of the other output inverter before being replaced and a second input of the other 2-input NOR gate (44) to the reset input (41).

7. A logical circuit according to claim 2, wherein
the PMOS network (29) operates to make a signal path (31) between the VDD power source line (27) and the input line (25) of one of the output inverters and a signal path (32) between the VDD power source line (27) and the input line (26) of the other output inverter conductive if at least not less than one of the not less than one pair of signal lines (20) as the inputs has the halt value, and operates to make one of said two signal paths (31, 32) conductive and cut off the other one of said signal paths (31, 32) in accordance with the realized logical feature if all of the not less than one pair of signal lines (20) as the inputs have the effective values and
the NMOS network (30) operates to cut off both a signal path (33) between the GND power source line (28) and the input line (25) of one of the output inverters and a signal path (34) between the GND power source line (28) and the input line (26) of the other output inverter if at least not less than one of the not less than one pair of signal lines (20) as the inputs has the halt value, and operates to make one of said signal paths (33, 34) and cut off the other one of said signal paths (33, 34) and make one of the input lines (25, 26) of the respective output inverters conductive only to the VDD power source line (27) and the other input line conductive only to the GND power source line (28) in accordance with the realized logical feature if all of the not less than pair of signal lines (20) as the inputs have the effective values.

8. A logical circuit according to claim 2 wherein
the PMOS network (29) operates to make both a signal path (31) between the VDD power source line (27) and the input line (25) of one of the output inverters and a signal path (32) between the VDD power source line (27) and the input line (26) of the other output inverter conductive if all of the not less than one pair of signal lines (20) as the inputs have the halt values, and operates to make both of said two signal paths (31, 32) in a cutoff state if a specific part of the not less than one pair of signal lines (20) as the inputs have the effective values and the remaining signal lines have the halt values or if all of the not less than one pair of signal lines (20) as the inputs have the effective values and the NMOS network (30) operates to cut off both a signal path (33) between the GND power source line (28) and the input line (25) of one of the output inverters and a signal path (34) between the GND power source line (28) and the input line (26) of the other output inverter if at least not less than one of the not less than one pair of signal lines (20) as the inputs has the halt value, and operates to make one of said signal paths (33, 34) in the conductive state and the other one of said signal paths (33, 34) in the cutoff state in accordance with the realized logical feature if all of the not less than pair of signal lines (20) as the input have the effective values.

9. A logical circuit according to claim 8, wherein charge holding PMOS transistors (35, 36) are added for the input lines (25, 26) of the respective output inverters, respectively.

10. A logical circuit according to claim 1, comprising means, having a reset input (41 or 42), for forcing the value of the one pair of signal lines (21, 22) as the output to become the halt value irrespectively of the values of the not less than one pair of signal lines (20) as the inputs if the reset input receives an effective input.

11. A logical circuit according to claim 10, comprising:
means for forcing the value of the one pair of signal lines (21, 22) as the output to become the halt value irrespectively of the values of the not less than one pair of signal lines (20) as the inputs if the reset input (41) or the reset input (42) has an effective input, for allowing the one pair of signal lines (21, 22) as the input to have the halt values if the reset input (41) or the reset input (42) has no effective input and, first, the not less than one pair of signal lines (20) as the inputs include the halt values, and then the effective value to be outputted to the one pair of signal lines (21, 22) as the output if all of the not less than one pair of signal lines (20) as the inputs have the effective values, wherein
the means allows the same effective values to be held as before without outputting the halt value to the one pair of signal lines (21, 22) as the output even after the value of not less than one pair of the not less than one pair of the signal lines (20) as the inputs changes to the halt value if the reset input (41 or 42) has no effective input, all of the not less than one pair of signal lines (20) as the inputs have the effective values and the effective value are outputted to the one pair of signal lines (21, 22) as the output.

12. A logical circuit according to claim 10, comprising:
means for forcing the value of the one pair of signal lines (21, 22) as the output to become the halt value irrespectively of the values of the not less than one pair of signal lines (20) as the inputs if the reset input (41) or the reset input (42) has an effective input, for allowing the one pair of signal lines (21, 22) as the input to have the halt values if the reset input (41) or the reset input (42) has no effective input and, first, the not less than one pair of signal lines (20) as the inputs include the halt values, and then the effective value to be outputted to the one pair of signal lines (21, 22) as the output if all of the not less than one pair of signal lines (20) as the inputs have the effective values, wherein
the means allows the same effective values to be held as before without outputting the halt value to the one pair of signal lines (21, 22) as the output even after the value of not less than one pair of the not less than one pair of the signal lines (20) as the inputs changes to the halt value if the reset input (41 or 42) has no effective input, all of the not less than one pair of signal lines (20) as the inputs have the effective values and the effective value are outputted to the one pair of signal lines (21, 22) as the output, and wherein
a PMOS transistor (51) for cutting off the one signal path (31) of the PMOS network (29), a PMOS transistor (52) for cutting off the other signal path (32) of the PMOS network (29), an NMOS transistor (53) for short-circuiting the one signal path (33) of the NMOS network (30) and an NMOS transistor (54) for short-circuiting the other signal path (34) of the NMOS network (30) are provided, connection for feeding back a signal from one input (21) to gate inputs of the PMOS transistor (51) and the NMOS transistor (53), respectively, is established, and connection for feeding back a signal from the other output (22) to gate inputs of the PMOS transistor (52) and the NMOS transistor (54), respectively, is established, thereby constituting:
the means for allowing the same effective value as before to be held without outputting the halt value to the one pair of signal lines (21, 22) as the output even after the value of not less than one pair of the signal lines (20) of the not less than one pair as the inputs changes to the halt value if the effective value is outputted to the one pair of signal lines (21, 22) as the output.

13. A logical circuit comprising a basic logical gate circuit block (61), as a constituent element, constituted by a plurality of basic logical gates (1) according to claim 1 so as to realize a specific logical feature and a reset basic logical gate circuit block (62), as a constituent element, constituted by a plurality of reset basic logical gates (3) each having the reset input RB(42) or a plurality of the reset basic logical gates (2) each having the reset input R(41) according to claims 8 to 10 so as to realize a specific logical feature, and having a common reset input mutually connecting the reset inputs RB(42) or R(41) of all of said plurality of reset basic logical gates, wherein
the reset basic logical gate circuit block (62) is arranged in a portion applied with an external input, the basic logical gate circuit block (61) using an output of the reset basic logical gate circuit block (62) as an input is arranged in a stage in rear of the reset basic logical gate circuit block (62), not less than one pair of a reset logical gate circuit block (62) and a basic logical gate circuit block (61) using an output of the reset logical gate circuit block (62) as an input, which are connected to each other, are arranged in rear of the basic logical gate circuit block (61), an output of the basic logical gate circuit block 61 in a final stage is set as an external output, and said common reset inputs of all of the reset basic logical gate circuit blocks (62) are mutually connected to supply a common reset signal GR.

14. A logical circuit wherein the reset basic logical circuit block (62) connected to the external input in the logical circuit according to claim 11 is replaced by a reset basic logical gate circuit block (63) having a holding feature and constituted by a plurality of reset basic logical gates each having the holding feature according to claim 12 or 13 and having the reset input R(41) or the reset input RB(42) so as to realize a specific logical feature, the reset basic logical gate circuit block (63) comprising a common reset input mutually connecting the reset input R(41) or the reset input RB(42) of each of said plurality of reset basic logical gates each having the holding feature.

15. A logical circuit comprising a first logical circuit block (64) according to claim 14 and a second logical circuit block (64) according to claim 14, constituted to set an output of said first logical circuit block as an input of said second logical circuit, to apply an external input to said first logical circuit block, and to set an output of said second logical circuit block as an external output, clock signals opposite in, phase are applied to a common reset signal GR to said first logical circuit block and to a common reset signal GRB to said second logical circuit block, respectively.

* * * * *